US008280688B2

(12) United States Patent
Huang et al.

(10) Patent No.: US 8,280,688 B2
(45) Date of Patent: ***Oct. 2, 2012

(54) COMPACTOR INDEPENDENT DIRECT DIAGNOSIS OF TEST HARDWARE

(75) Inventors: Yu Huang, Marlborough, MA (US); Wu-Tung Cheng, Lake Oswego, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/790,049

(22) Filed: May 28, 2010

(65) Prior Publication Data

US 2010/0306606 A1   Dec. 2, 2010

Related U.S. Application Data

(63) Continuation of application No. 11/267,221, filed on Nov. 4, 2005, now Pat. No. 7,729,884, which is a continuation-in-part of application No. 10/925,230, filed on Aug. 23, 2004, now Pat. No. 7,239,978.

(60) Provisional application No. 60/558,405, filed on Mar. 31, 2004, provisional application No. 60/655,800, filed on Feb. 22, 2005, provisional application No. 60/638,801, filed on Dec. 22, 2004.

(51) Int. Cl.
*G06F 11/30* (2006.01)
*G06F 11/00* (2006.01)

(52) U.S. Cl. .................. 702/185; 714/738

(58) Field of Classification Search .......... 702/185, 702/57, 81–82, 85, 107–109, 119, 182–183; 703/13–15; 714/25, 30, 700, 726–727, 729, 714/732–735, 737–739, 741–742, 799
See application file for complete search history.

(56) References Cited

U.S. PATENT DOCUMENTS 5,260,946 A    11/1993   Nunally
(Continued)

FOREIGN PATENT DOCUMENTS

WO    WO 2005/101222 A2    10/2005

OTHER PUBLICATIONS

Guo et al., A Technique for Fault Diagnosis of Defects in Scan Chains, 2001 IEEE, ITC International Test Conference, pp. 268-277.*

(Continued)

*Primary Examiner* — Toan M Le
(74) *Attorney, Agent, or Firm* — Klarquist Sparkman, LLP

(57) ABSTRACT

Methods, apparatus, and systems for performing fault diagnosis are disclosed herein. In one exemplary embodiment, a failure log is received comprising entries indicative of compressed test responses to chain patterns and compressed test responses to scan patterns. A faulty scan chain in the circuit-under-test is identified based at least in part on one or more of the entries indicative of the compressed test responses to chain patterns. One or more faulty scan cell candidates in the faulty scan chain are identified based at least in part on one or more of the entries indicative of the compressed test responses to scan patterns. The one or more identified scan cell candidates can be reported. Computer-readable media comprising computer-executable instructions for causing a computer to perform any of the disclosed methods are also provided. Likewise, computer-readable media storing lists of fault candidates identified by any of the disclosed methods are also provided.

20 Claims, 25 Drawing Sheets

U.S. PATENT DOCUMENTS

| | | | |
|---|---|---|---|
| 5,309,447 | A | 5/1994 | Moskowitz et al. |
| 5,345,450 | A | 9/1994 | Saw |
| 5,475,694 | A | 12/1995 | Ivanov et al. |
| 5,515,384 | A | 5/1996 | Horton et al. |
| 5,831,992 | A | 11/1998 | Wu |
| 5,930,270 | A | 7/1999 | Forlenza et al. |
| 5,991,898 | A | 11/1999 | Rajski et al. |
| 6,158,033 | A | 12/2000 | Wagner et al. |
| 6,199,184 | B1 | 3/2001 | Sim |
| 6,205,559 | B1 | 3/2001 | Sakaguchi |
| 6,256,759 | B1 | 7/2001 | Bhawmik et al. |
| 6,327,687 | B1 | 12/2001 | Rajski et al. |
| 6,363,506 | B1 | 3/2002 | Karrie et al. |
| 6,442,723 | B1 | 8/2002 | Koprowski et al. |
| 6,463,561 | B1 | 10/2002 | Bhawmik et al. |
| 6,516,432 | B1 | 2/2003 | Motika et al. |
| 6,543,020 | B2 | 4/2003 | Rajski |
| 6,557,129 | B1 | 4/2003 | Rajski et al. |
| 6,557,132 | B2 | 4/2003 | Gangl et al. |
| 6,662,327 | B1 | 12/2003 | Rajski |
| 6,671,839 | B1 | 12/2003 | Cote et al. |
| 6,684,358 | B1 | 1/2004 | Rajski et al. |
| 6,694,466 | B1 | 2/2004 | Tsai et al. |
| 6,728,901 | B1 | 4/2004 | Rajski et al. |
| 6,763,488 | B2 | 7/2004 | Whetsel |
| 6,829,740 | B2 | 12/2004 | Rajski et al. |
| 6,874,109 | B1 | 3/2005 | Rajski et al. |
| 6,954,888 | B2 | 10/2005 | Rajski et al. |
| 6,993,694 | B1 | 1/2006 | Kapur et al. |
| 6,996,791 | B2 | 2/2006 | Brunkhorst et al. |
| 7,007,213 | B2 | 2/2006 | Wang et al. |
| 7,032,148 | B2 | 4/2006 | Wang et al. |
| 7,058,869 | B2 | 6/2006 | Abdel-Hafez et al. |
| 7,093,175 | B2 | 8/2006 | Rajski et al. |
| 7,111,209 | B2 | 9/2006 | Rajski et al. |
| 7,185,253 | B2 | 2/2007 | Mitra et al. |
| 7,239,978 | B2 | 7/2007 | Cheng et al. |
| 7,296,249 | B2 | 11/2007 | Rinderknecht et al. |
| 7,302,624 | B2 | 11/2007 | Rajski et al. |
| 7,370,254 | B2 | 5/2008 | Rajski et al. |
| 7,437,640 | B2 | 10/2008 | Rajski et al. |
| 7,729,884 | B2 * | 6/2010 | Huang et al. .......... 702/185 |
| 2003/0188269 | A1 | 10/2003 | Mitra et al. |
| 2004/0190331 | A1 | 9/2004 | Ross et al. |
| 2004/0230884 | A1 | 11/2004 | Rajski et al. |
| 2005/0055613 | A1 | 3/2005 | Mitra et al. |
| 2005/0081130 | A1 | 4/2005 | Rinderknecht et al. |
| 2005/0222816 | A1 | 10/2005 | Cheng et al. |
| 2006/0036985 | A1 | 2/2006 | Mitra et al. |
| 2006/0041813 | A1 | 2/2006 | Rajski et al. |
| 2006/0111873 | A1 | 5/2006 | Huang et al. |
| 2007/0038911 | A1 | 2/2007 | Koenemann et al. |
| 2007/0100586 | A1 | 5/2007 | Cheng et al. |
| 2007/0162803 | A1 | 7/2007 | Dervisoglu et al. |
| 2007/0283202 | A1 | 12/2007 | Cheng et al. |

OTHER PUBLICATIONS

Akers et al., "Why is Less Information From Logic Simulation More Useful in Fault Simulation?" *International Test Conf.*, pp. 786-800, 1990.

Aldrich et al., "Improving Test Quality and Reducing Escapes," *Fabless Forum*, pp. 34-35, 2003.

Balachandran et al., "Correlation of Logic Failures to a Suspect Process Step," *International Test Conf.*, pp. 458-466, 1999.

Bardell et al., *Built-In Test for VLSI: Pseudorandom Techniques*, John Wiley & Sons, Inc., pp. 109-144, 1987.

Barnhart et al., "Extending OPMISR beyond 10x Scan Test Efficiency," *IEEE Design & Test of Computers*, pp. 65-73, 2002.

Bartenstein et al., "Diagnosing Combinational Logic Designs Using the Single Location At-A-Time (SLAT) Paradigm," *International Test Conf.*, pp. 287-296, 2001.

Bayraktaroglu and Orailoglu, "Test Volume and Application Time Reduction," *Proc. Design Automation Conf.*, pp. 151-155, 2001.

Benware et al., "Impact of Multiple-Detect Test Patterns on Product Quality," *International Test Conf.*, pp. 1031-1040, Sep. 30-Oct. 2, 2003.

Bhattacharya et al., "Synthesis of Single-Output Space Compactors for Scan-Based Sequential Circuits," *IEEE Transactions on Computer Aided Design of Integrated Circuits and Systems*, vol. 21, No. 10, pp. 1171-1179, Oct. 2002.

Boppana et al., "Multiple Error Diagnosis Based on Xlists," *Design Automation Conf Proc. 36th*, pp. 660-665, 1999.

Chakrabarty et al., "Space Compaction of Test Responses Using Orthogonal Transmission Functions," *IEEE Transactions on Instrumentation and Measurement*, vol. 52, No. 5, pp. 1353-1362, Oct. 2003.

Chan et al., "A Study of Faulty Signatures Using a Matrix Formulation," *International Test Conf.*, pp. 553-561, 1990.

Cheng et al., "Compactor Independent Direct Diagnosis," *IEEE Proc. of the $13^{th}$ Asian Test Symposium*, 6 pp., Nov. 15-17, 2004.

Cheng et al., "Diagnosis for Wiring Interconnects," *IEEE*, pp. 565-571, 1990.

Cox et al., "Method of Fault Analysis for Test Generation and Fault Diagnosis," *IEEE Transactions on Computer-Aided Design of Integrated Circuits and Systems*, vol. 7, No. 7, pp. 813-833, 1988.

Devgan et al., "Block-Based Static Timing Analysis with Uncertainty," *ICCAD*, pp. 607-614, Nov. 9-13, 2003.

Eddleman et al., "Advanced Scan Diagnosis Based Fault Isolation and Defect Identification for Yield Learning," *International Symposium for Testing and Failure Analysis*, vol. 31, pp. 501-509, Nov. 8-10, 2005.

Edirisooriya et al., "Diagnosis of Scan Path Failures," *Proc. of VLSI Test Symposium*, pp. 250-255, 1995.

Ghosh-Dastidar et al., "A Rapid and Scalable Diagnosis Scheme for BIST Environments with a Large Number of Scan Chains," *Proc. of the VLSI Test Symposium*, 7 pp., 2000.

Ghosh-Dastidar et al., "Fault Diagnosis in Scan Based BIST Using Both Time and Space Information," *International Test Conf.*, 8 pp., 1999.

Guo et al., "A Technique for Fault Diagnosis of Defects in Scan Chains," *International Test Conf.*, pp. 268-277, 2001.

Hamzaoglu and Patel, "Reducing Test Application Time for Full-Scan Embedded Cores," *Proc. of Fault-Tolerant Computing*, pp. 15-18, 1999.

Huang et al., "Compressed Pattern Diagnosis for Scan Chain Failures," *IEEE International Test Conf.*, pp. 744-751, Nov. 8-10, 2005.

Huang et al., "Diagnosing DACS (Defects That Affect Scan Chain and System Logic)," *International Symposium on Testing and Failure Analysis*, pp. 191-196, Nov. 2-6, 2004.

Huang et al., "Efficient Diagnosis for Multiple Intermittent Scan Chain Hold-Time Faults," *Proc. Asian Test Symposium*, pp. 44-49, Nov. 16-19, 2003.

Huang et al., "ErrorTracer: A Fault Simulation-Based Approach to Design Error Diagnosis," *International Test Conf.*, pp. 974-981, 1997.

Huang et al., "Intermittent Scan Chain Fault Diagnosis Based on Signal Probability Analysis," *Proc. of the Design, Automation and Test in Europe Conf and Exhibition*, pp. 1072-1077, Feb. 16-20, 2004.

Huang et al., "Statistical Diagnosis for Intermittent Scan Chain Hold-Time Fault," International Test Conf , pp. 319-328, Sep. 30-Oct. 2, 2003.

Huang et al., "Using Fault Model Relaxation to Diagnose Real Scan Chain Defects," *IEEE*, pp. 1176-1179, 2005.

International Search Report for PCT/US2005/09579 (corresponding to International Publication No. WO 2005/101222 A2), dated Apr. 21, 2006, 4 pp.

Ivanov et al., "Programmable BIST Space Compactors," *IEEE Transactions on Computers*, vol. 45, No. 12, pp. 1393-1404, 1996.

Jas, et al., "Scan Vector Compression/Decompression Using Statistical Coding," *Proc. VLSI Test Symp.*, pp. 114-120, 1999.

Kapur et al., "Directed-Binary Search in Logic BIST Diagnostics," *Proc. of the Design, Automation and Test in Europe Conf and Exhibition*, 1 pp., 2002.

Keller et al., "Use of MISRs for Compression and Diagnostics," *International Test Conference*, paper 30.2, 9 pp., Nov. 8-10, 2005.

Konemann et al., "Built in Logic Block Observation Techniques," *International Test Conf.*, 6 pp., 1979.

Krishna et al., "Test Vector Encoding Using Partial LFSR Reseeding," *International Test Conf.*, pp. 885-893, 2001.

Kundu, "Diagnosing Scan Chain Faults," *IEEE Transactions on VLSI Systems*, vol. 2:4, pp. 512-516, 1994.

Leininger et al., "Compression-Mode Diagnosis Enables High-Volume Monitoring Diagnosis Flow," International Test Conference, paper 7.3, 10 pp., Nov. 8-10, 2005.

Li and McCluskey, "Diagnosis of Sequence Dependent Chips," *Proc. 20th VLSI Test Symposium*, pp. 187-192, 2002.

Lin et al., "High-Frequency, At-Speed Scan Testing," *IEEE Design and Test of Computers*, vol. 20, Issue 5, pp. 17-25, Sep./Oct. 2003.

McAnney et al., "There is Information in Faulty Signatures," *International Test Conf.*, 7 pp., 1987.

Mitra et al., "X-Compact an Efficient Response Compaction Technique for Test Cost Reduction," *International Test Conf.*, pp. 311-320, 2002.

Mrugalski et al., "Fault Diagnosis in Designs with Convolutional Compactors," *International Test Conf.*, pp. 498-507, Oct. 26-28, 2004.

Narayanan et al., "An Efficient Scheme to Diagnose Scan Chains," *International Test Conf.*, pp. 704-713, 1997.

Notice of Allowance from the United States Patent and Trademark Office in U.S. Appl. No. 10/925,230, dated Feb. 26, 2007, 9 pp.

Notice of Allowance from the United States Patent and Trademark Office in U.S. Appl. No. 11/267,221, dated Jan. 12, 2010, 9 pp.

Office Action from the United States Patent and Trademark Office in U.S. Appl. No. 11/584,038, dated Jun. 12, 2009, 21 pp.

Office Action from the United States Patent and Trademark Office in U.S. Appl. No. 11/772,648, dated Jul. 27, 2009, 19 pp.

Office Action from the United States Patent and Trademark Office in U.S. Appl. No. 10/925,230, dated Nov. 15, 2005, 5 pp.

Office Action from the United States Patent and Trademark Office in U.S. Appl. No. 10/925,230, dated Aug. 11, 2006, 5 pp.

Office Action from the United States Patent and Trademark Office in U.S. Appl. No. 10/925,230, dated Feb. 17, 2006, 17 pp.

Office Action from the United States Patent and Trademark Office in U.S. Appl. No. 11/584,038, dated Nov. 28, 2008, 34 pp.

Office Action from the United States Patent and Trademark Office in U.S. Appl. No. 11/584,038, dated Feb. 4, 2008, 11 pp.

Office Action from the United States Patent and Trademark Office in U.S. Appl. No. 11/584,038, dated Jan. 13, 2010, 19 pp.

Office Action from the United States Patent and Trademark Office in U.S. Appl. No. 11/772,648, dated Jan. 13, 2010, 10 pp.

Office Action from the United States Patent and Trademark Office in U.S. Appl. No. 11/267,221, dated Jul. 21, 2009, 19 pp.

Office Action from the United States Patent and Trademark Office in U.S. Appl. No. 11/267,221, dated Jan. 13, 2009, 15 pp.

Office Action from the United States Patent and Trademark Office in U.S. Appl. No. 11/267,221, dated May 14, 2007, 16 pp.

Office Action from the United States Patent and Trademark Office in U.S. Appl. No. 11/267,221, dated Jan. 8, 2008, 18 pp.

Office Action from the United States Patent and Trademark Office in U.S. Appl. No. 11/267,221, dated Aug. 14, 2008, 11 pp.

Poehl et al., "Industrial Experience with Adoption of EDT for Low-Cost Test without Concessions," *International Test Conf.*, pp. 1211-1220, Sep. 30-Oct. 2, 2003.

Pomeranz et al., "On Correction of Multiple Design Errors," *IEEE Transactions on CAD of Integrated Circuits and Systems*, vol. 14, No. 2, pp. 255-264, 1995.

Pouya et al., "Synthesis of Zero-Aliasing Elementary-Tree Space Compactors," *Proc. of IEEE VLSI Test Symposium*, pp. 70-77, 1998.

Rajski et al., "Convolutional Compaction of Test Responses," *International Test Conf.*, pp. 745-754, 8 pp., Sep. 30-Oct. 2, 2003.

Rajski et al., "Diagnosis of Scan Cells in BIST Environment," *IEEE Transactions on Computers*, vol. 48, No. 7, pp. 724-731, Jul. 1999.

Rajski et al., "Embedded Deterministic Test," *IEEE Transactions on Computer Aided Design*, vol. 23, No. 5, 17 pp., May 2004.

Rajski et al., "Embedded Deterministic Test for Low-Cost Manufacturing," *IEEE Design & Test of Computers*, pp. 58-66, 2003.

Rajski et al., "Embedded Deterministic Test for Low Cost Manufacturing Test," *International Test Conf.*, pp. 301-310, 2002.

Rajski et al., "On the Diagnostic Properties of Linear Feedback Shift Registers," *IEEE Transactions on Computer Aided Design*, vol. 10, No. 10, pp. 1316-1322, Oct. 1991.

Rajski et al., "Test Data Compression and Compaction for Embedded Test of Nanometer Technology Designs," *Proceedings of the 21st International Conference on Computer Design*, 6 pp., Oct. 13-15, 2003.

Rajski et al., "Test Data Decompression for Multiple Scan Designs with Boundary Scan," *IEEE Transactions on Computers*, vol. 47, pp. 1188-1200, Nov. 1998.

Rajsuman, "Testing a System-on-a-Chip with Embedded Microprocessor," *IEEE International Test Conf.*, pp. 499-508, 1999.

Richman et al., "The Modern Fault Dictionary," *International Test Conf.*, pp. 696-702, 1985.

Savir et al., "Identification of Failing Tests with Cycling Registers," *International Test Conf.*, pp. 322-328, 1988.

Savir, "Salvaging Test Windows in BIST Diagnostics," *IEEE Transactions on Computers*, vol. 47:4, 6 pp., Apr. 1998.

Schafer et al., "Partner SRLs for Improved Shift Register Diagnostics," *Proc. VLSI Test Symposium*, pp. 198-201, 1992.

Stanley, "High-Accuracy Flush-and-Scan Software Diagnostic," *IEEE Design and Test of Computers*, pp. 56-62, Nov./Dec. 2001.

Stroud, "Automated BIST for Sequential Logic Synthesis," *IEEE Design and Test of Computers*, 11 pp., 1988.

Takahashi et al., "Enhancing Multiple Fault Diagnosis in Combinational Circuits Based on Sensitized Paths and EB Testing," *The Fourth Asian Test Symposium*, pp. 58-64, 1995.

Tsuji et al., "Selecting Programmable Space Compactors for BIST Using Genetic Algorithm," *IEEE*, pp. 233-241, 1994.

Veneris et al., "A Fast Algorithm for Locating and Correcting Simple Design Errors in VLSI Digital Circuits," *Proc. of Great Lake Symposium on VLSI Design*, pp. 45-50, 1997.

Venkataraman et al., "A Deductive Technique for Diagnosis of Bridging Faults," *Proc. IEEE ICCAD*, pp. 562-567, 1997.

Venketaraman and Drummonds, "Poirot: Applications of a Logic Fault Diagnosis Tool," *IEEE Design and Test of Computers*, vol. 18, No. 1, 12 pp., Jan./Feb. 2001.

Waicukauski and Lindbloom, "Failure Diagnosis of Structured VLSI," *IEEE Design and Test of Computers*, pp. 49-60, Aug. 1989.

Wang et al., "An Efficient and Effective Methodology on the Multiple Fault Diagnosis," *International Test Conf.*, pp. 329-338, Sep. 30-Oct. 2, 2003.

Wang, "On Methods to Improve Test Generation Efficiency and Test Response Compaction," Ph.D. Thesis, University of Iowa, 138 pages, May 16, 2003.

Wohl et al., "Effective Diagnostics Through Interval Unloads in a BIST Environment," *Proc. of the Design Automation Conf.*, 6 pp., 2002.

Wohl et al., "Xtolerant Compression and Application of Scan-ATPG Patterns in a BIST Architecture," *International Test Conf.*, pp. 727-736, Sep. 30-Oct. 2, 2003.

Written Opinion for PCT/US2005/09579 (corresponding to International Publication No. WO 2005/101222 A2), dated Apr. 21, 2006, 8 pp.

Wu et al., "Scan Based BIST Fault Diagnosis," *IEEE Transactions on Computer-Aided Design of Integrated Circuits and Systems*, vol. 18, No. 2, 9 pp., Feb. 1999.

Wu, "Diagnosis of Scan Chain Failures," *Proc. International Symposium on Defect and Fault Tolerance in VLSI Systems*, pp. 217-222, 1998.

Zou, "On Methods to Improve Location Based Logic Diagnosis," *Proc. VLSI Design*, pp. 181-187, 2000.

Final Office action from the United States Patent and Trademark Office in U.S. Appl. No. 11/772,648, dated Mar. 1, 2011, 11 pp.

Lin et al., "SIFAR: Static Test Compaction for Synchronous Sequential Circuits Based on Single Fault Restoration," *IEEE Proc. Vlsi Test Symp.*, pp. 205-212 (Apr. 2000).

Mitra et al., "X-Compact: An Efficient Response Compaction Technique," *IEEE Trans. on Computer-Aided Design of Integrated Circuits and Systems*, vol. 23, No. 3, pp. 421-432 (Mar. 2004).

Office Action from the United States Patent and Trademark Office in U.S. Appl. No. 11/584,038, dated Jun. 22, 2010, 18 pp.

Office Action from the United States Patent and Trademark Office in U.S. Appl. No. 11/772,648, dated Jun. 23, 2010, 10 pp.

Office action from the United States Patent and Trademark Office in U.S. Appl. No. 11/584,038, dated Feb. 25, 2011, 18 pp.

\* cited by examiner

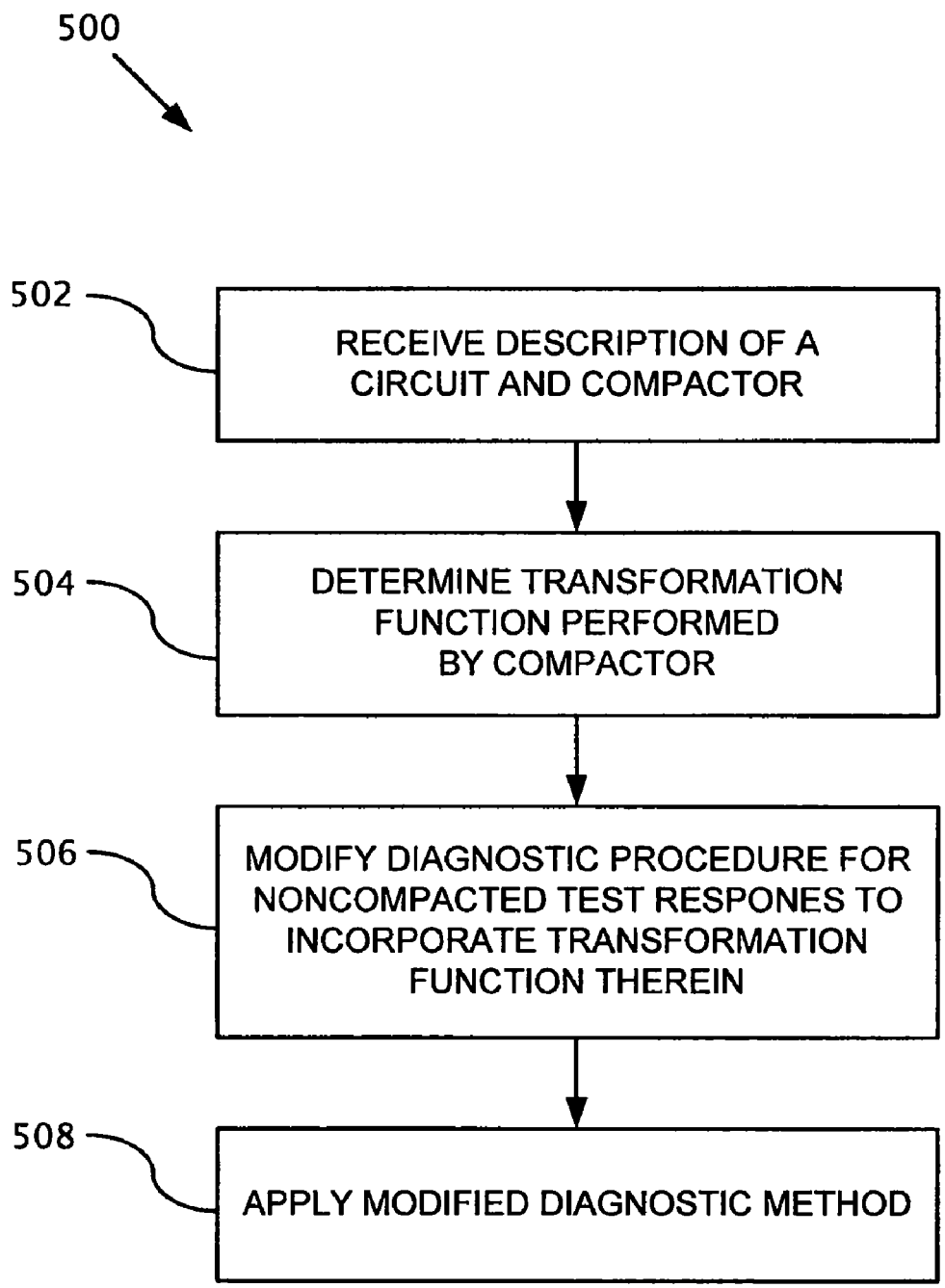

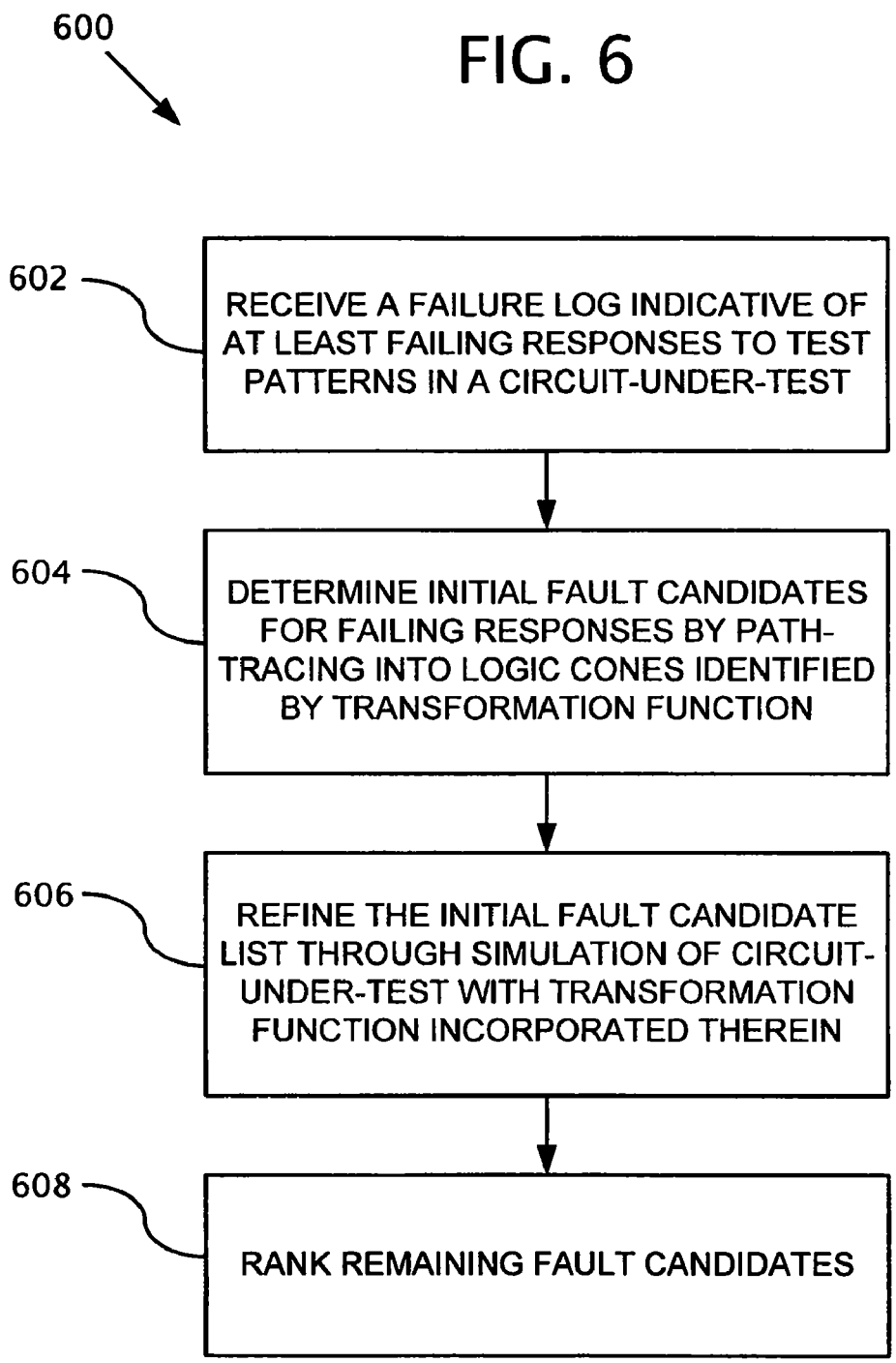

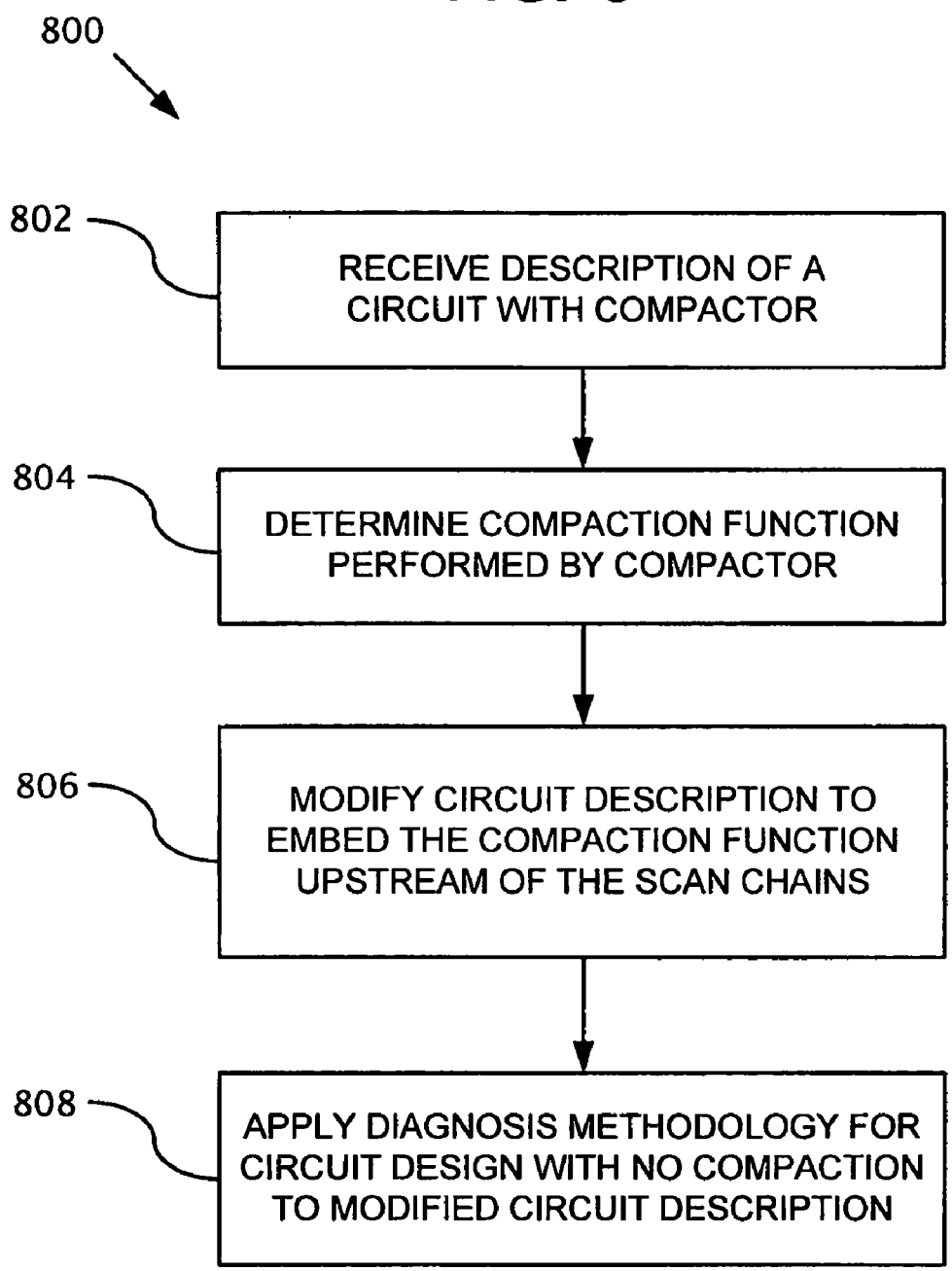

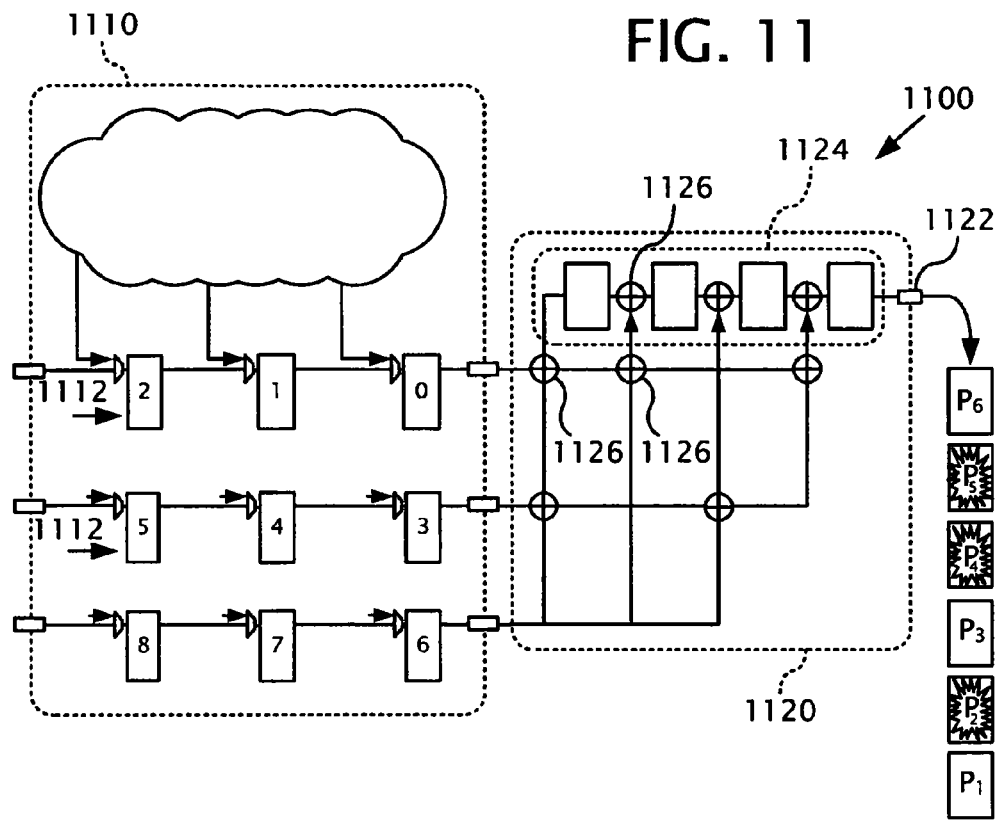

Diagnostic Results for Circuit 1 Using Bypass Mode

Diagnostic Results for Circuit 1 Using An Embodiment of
Disclosed Diagnosis Methodology

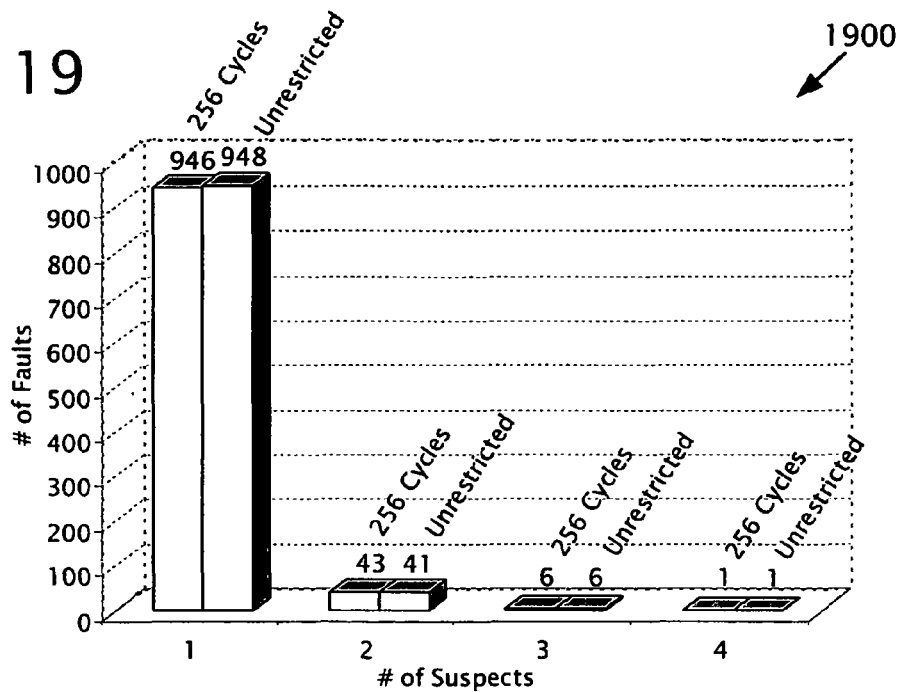
Diagnostic Results for Circuit 2 Using Bypass Mode
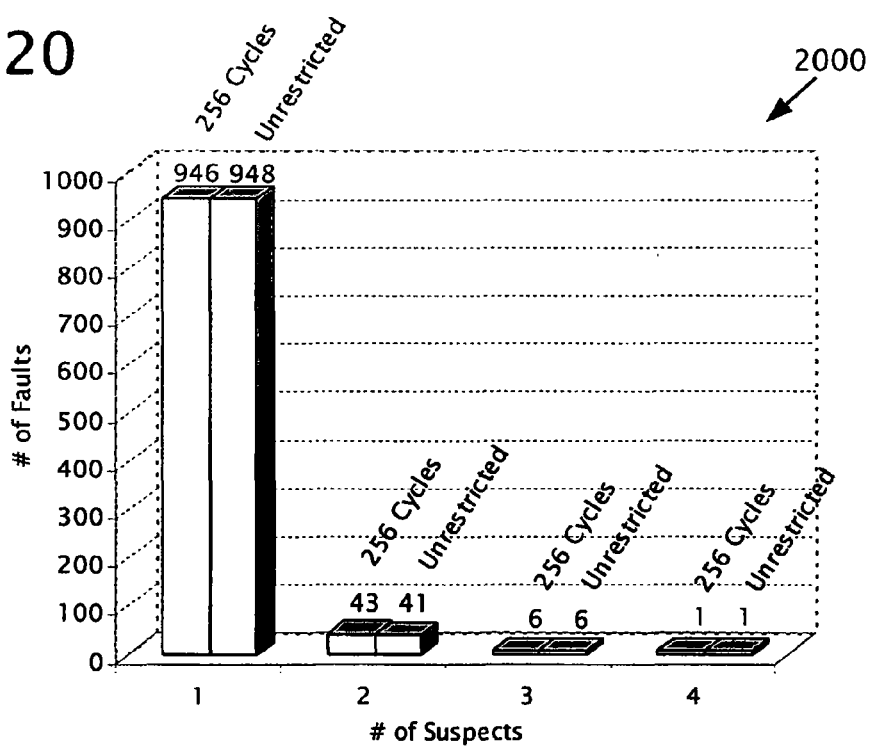
Diagnostic Results for Circuit 2 Using An Embodiment of Disclosed Diagnosis Methodology

COMPACTOR INDEPENDENT DIRECT DIAGNOSIS OF TEST HARDWARE

CROSS REFERENCE TO RELATED APPLICATIONS

This application is a continuation of U.S. patent application Ser. No. 11/267,221 filed Nov. 4, 2005 now U.S. Pat. No. 7,729,884, which is a continuation-in-part of U.S. patent application Ser. No. 10/925,230 (now U.S. Pat. No. 7,239,978), filed Aug. 23, 2004, which claims the benefit of U.S. Provisional Patent Application Ser. No. 60/558,405 filed Mar. 31, 2004, all of which are incorporated herein by reference. U.S. patent application Ser. No. 11/267,221 also claims the benefit of U.S. Provisional Patent Application Ser. No. 60/655,800 filed Feb. 22, 2005, and U.S. Provisional Patent Application Ser. No. 60/638,801 filed Dec. 22, 2004, both of which are hereby incorporated herein by reference.

FIELD

This application relates to diagnosing defects in an integrated circuit.

BACKGROUND

The accurate diagnosis of faults is an increasingly important aspect of testing integrated circuits, especially in view of ever-increasing gate counts and shrinking feature sizes. For circuits that do not utilize compression techniques during testing, fault diagnosis is relatively straightforward. For circuits that have embedded compression hardware, however, accurate fault diagnosis presents a formidable challenge.

The use of compression during the testing of integrated circuits has become widespread. In general, compression helps reduce the volume of test data required for even traditional stuck-at test sets. Such sets, for example, often exceed the capacity of automatic test equipment ("ATE") used to test today's multimillion-gate integrated circuits. Moreover, due to the limited bandwidth between the circuit-under-test ("CUT") and the ATE, the use of compressed test data and compressed test responses can decrease test time, and thus the test cost.

Automated fault diagnosis (e.g., diagnosis based on chain patterns and scan patterns obtained from automated test pattern generation ("ATPG")) is a desirable component of an overall failure-analysis process. Automated fault diagnosis is generally used to predict the location of a failure in a CUT and has applications in such fields as silicon debugging, yield learning, and yield improvement. Given the failing test responses to a test set, an automated fault diagnosis tool desirably identifies the suspect fault sites that best explain the failures. The suspect sites identified can help locate the physical cause of the fault and be used to guide failure analysis at the physical level.

SUMMARY

In scan-based designs, 10%-30% of defects are on scan chains. Scan chain fault diagnosis is therefore a desirable component of an overall diagnosis scheme. Described below are exemplary methods for diagnosing scan chains or other testing hardware on devices having embedded compression hardware. Embodiments of the disclosed technology can be used to adapt scan chain diagnosis procedures for noncompression environment for use in compression environments. For example, certain embodiments of the disclosed methods enable reuse of the existing chain diagnosis infrastructure with compressed test data. The use of the disclosed chain diagnosis methodologies can save cost and time for chain diagnosis and provide more accurate and meaningful information for failure analysis and yield learning.

One exemplary disclosed embodiment is a method for diagnosing faulty scan cells in a circuit-under-test. In the exemplary embodiment, information indicative of at least compressed test responses to chain patterns and compressed test responses to scan patterns is received. For example, the information received can comprise a failure log having entries indicative of compressed failing test responses to chain patterns and scan patterns. In certain implementations, the compressed test responses that do not appear in the failure log are presumed to be compressed passing test responses. A faulty scan chain in the circuit-under-test is identified based at least in part on the information indicative of the compressed test responses to chain patterns. For example, a faulty scan chain can be identified based on the compressed failing test responses to chain patterns (e.g., using a fault dictionary). The fault type of the faulty scan chain can also be identified from the information indicative of the compressed test responses to chain patterns. For example, the fault type can be identified from compressed failing test responses and compressed passing test responses to the chain patterns. One or more faulty scan cell candidates in the faulty scan chain are identified based at least in part on the information indicative of the compressed test responses to scan patterns and reported. For example, the scan cell candidates can be identified from compressed failing test responses and compressed passing test responses to scan patterns. In certain implementations, the act of identifying the one or more faulty scan cell candidates comprises simulating failures in possible faulty scan cell candidates and comparing simulation results to the compressed test responses to the scan patterns. In certain embodiments, the simulation includes simulating both failing test patterns and passing test patterns. The simulation can incorporate the transformation function by representing the compactor as a mathematical function and applying the mathematical function to simulated uncompressed test responses. Alternatively, the simulation can incorporate the transformation function by simulating the failures in a circuit representation of the circuit-under-test that has been modified to embed the transformation function. In some embodiments, the chain patterns include masking chain patterns. Thus, the information received can include information indicative of test responses to masking chain patterns. In these embodiments, the method can further include determining whether the source of a fault is a scan chain defect or a compression hardware defect based at least in part on the information indicative of the test responses to the masking chain patterns.

In another exemplary embodiment disclosed, scan chains of a circuit-under-test are tested using multiple chain patterns. In this embodiment, the testing comprises applying at least one of the chain patterns to the scan chains through a decompressor and a compactor coupled to the scan chains, and applying at least one of the chain patterns to the scan chains while bypassing the decompressor and the compactor. A determination is made as to whether a fault exists in the scan chains of the circuit-under-test or in the decompressor or the compactor based at least in part on test responses to the chain patterns applied during the testing. For example, if a respective chain pattern applied through the decompressor and the compactor and a respective chain pattern bypassing the decompressor and the compactor both produce faulty test responses, a fault can be determined to exist in the scan chains of the circuit-under-test. Further, if a respective chain pattern applied through the decompressor and the compactor produces a faulty test response but a respective chain pattern bypassing the decompressor and the compactor does not produce a faulty test response, a fault can be determined to exist in the decompressor or the compactor. In certain implementations, if the fault is determined to exist in the scan chains of the circuit-under-test, a faulty scan chain in the circuit-under-test and a fault type are identified based at least in part on the test responses to the chain patterns. For example, the faulty scan chain can be identified by applying a mathematical function representative of the compactor to one or more compressed test responses. The circuit-under-test can also be tested using multiple scan patterns. Faulty scan cell candidates in the faulty scan chain can be identified based at least in part on compressed test responses to the scan patterns. For example, in some implementations, the faulty scan cell candidates can be identified by simulating failures in possible faulty scan cell candidates, and comparing simulation results to one or more of the compressed test responses to the scan patterns. In these implementations, the transformation function performed by the compactor is accounted for in the simulation.

In another exemplary embodiment disclosed herein, one or more test patterns are simulated as being applied to an integrated circuit design having scan chains and a compactor, thereby generating one or more expected compressed test responses. In this embodiment, the act of simulating comprises modifying test values of the test patterns so that scan cells of a selected scan chain (e.g., all scan cells of the selected scan chain) are loaded with either unknown values or a fixed value (e.g., depending on the fault type). The act of simulating further comprises using a transformation function representative of the compactor to generate the expected compressed test responses. For example, the transformation function can be a mathematical representation of the compactor that is applied to simulated uncompressed test responses, or the transformation function can be embedded into a representation of the integrated circuit design used during the simulation. The expected compressed test responses are compared to observed compressed test responses obtained from testing a physical embodiment of the integrated circuit design with the one or more test patterns, and a range of suspect scan cells in the selected scan chain is determined based at least in part on this comparison. In certain embodiments, the one or more test patterns comprise a first set of test patterns and the one or more expected compressed test responses comprise a first set of expected compressed test responses. In these embodiments, the method can also include simulating a second set of one or more test patterns being applied to the integrated circuit design, thereby generating a second set of expected compressed test responses. The act of simulating the second set can include modifying test values of the second set so that at least some of the scan cells of the selected scan chain located before the last scan cell in the range are loaded with either unknown values or the fixed value (e.g., depending on the fault type), and also so that at least some of the scan cells of the selected scan chain located after the last scan cell in the range are loaded with regular unmodified test values (the original pattern loading values). In one desirable implementation, for instance, all of the scan cells of the selected scan chain located before the last scan cell in the range are loaded with the unknown values or the fixed value and all of the scan cells after the last scan cell in the range are loaded with the regular unmodified test values. In certain implementations, the first set of test patterns and the second set of test patterns are the same before being modified. The second set of expected compressed test responses can be compared to the observed compressed test responses, and a second range of suspect scan cells in the selected scan chain can be determined based at least in part on the comparison. The second range typically has fewer suspect scan cells than the first range (e.g., because the simulation of the second set of test patterns uses more known values). This process can be iteratively repeated, thereby generating smaller and smaller ranges of suspect scan cells. In some implementations, the range of suspect scan cells is reported if the number of scan cells in the range is less than a predetermined number.

In another exemplary embodiment disclosed herein, a circuit description is received of an at least partially scan-based circuit-under-test and a compactor for compacting test responses captured in the circuit-under-test. A transformation function performed by the compactor to the test responses is determined. Scan chain faults in one or more scan chains of the circuit-under-test are diagnosed using a diagnostic procedure that incorporates the transformation function. For example, the diagnostic procedure can comprise simulating one or more possible scan chain faults in the circuit-under-test to produce expected uncompressed test responses, and applying the transformation function to the expected uncompressed test responses to determine expected compressed test responses. Alternatively, the diagnostic procedure can comprise modifying the circuit description to embed the transformation function upstream of scan cells in the circuit-under-test, and simulating one or more possible scan chain faults using the modified circuit description. The method of this or any disclosed embodiment can be performed during production testing of the circuit-under-test.

Any of the disclosed methods can be implemented as computer-readable media comprising computer-executable instructions for causing a computer to perform the method. Further, computer-readable media comprising lists of fault candidates identified by any of the disclosed methods or circuit descriptions created or modified by the disclosed methods are also disclosed. Circuits having faults that were repaired by any of the disclosed methods are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 5 is a flow chart of a first embodiment of a general fault diagnostic procedure for diagnosing faults from compacted test responses. In the embodiment illustrated in FIG. 5, a modified diagnostic procedure is used.

FIG. 6 is a flow chart of an exemplary embodiment of a modified diagnostic procedure as may be utilized by the exemplary procedure shown in FIG. 5. Specifically, FIG. 6 shows a modified version of the effect-cause diagnostic procedure from FIG. 1.

FIG. 8 is a flow chart of a second embodiment of a general fault diagnostic procedure for diagnosing faults from compacted test responses. In the embodiment illustrated in FIG. 5, a modified circuit description is used.

FIG. 11 is a schematic block diagram of an exemplary scan-based circuit-under-test coupled to an exemplary convolutional compactor.

FIG. 12 is a schematic block diagram illustrating how an exemplary embodiment of the method shown in FIGS. 5 and 6 can be applied to the circuit-under-test and convolutional compactor from FIG. 11.

FIG. 19 is a graph showing experimental results from diagnosing failing test responses in a second circuit design having an EDT compactor, wherein a traditional fault diagnostic procedure was used and wherein the EDT compactor was operated in a bypass mode.

FIG. 20 is a graph showing experimental results from diagnosing failing test responses in the second circuit design having an EDT compactor, wherein an exemplary embodiment of the disclosed diagnostic procedure was used and wherein the EDT compactor was operated in a compression mode.

DETAILED DESCRIPTION

Figure 1:
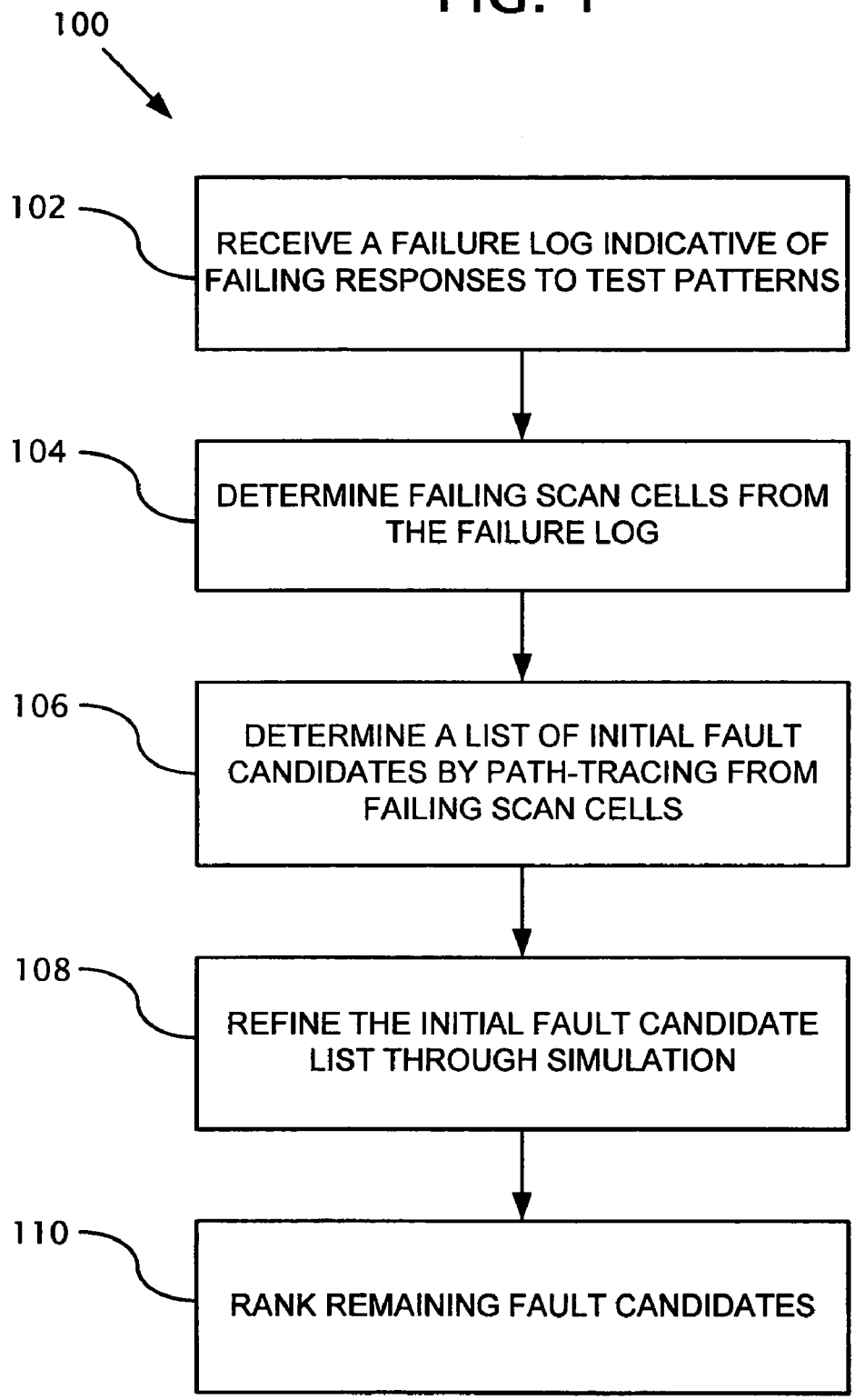
FIG. 1 is a flow chart of an exemplary embodiment of an effect-cause diagnostic procedure.

Disclosed below are representative embodiments of methods, apparatus, and systems for performing fault diagnosis that should not be construed as limiting in any way. Instead, the present disclosure is directed toward all novel and non-obvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved.

Moreover, any of the methods, apparatus, and systems described herein can be used in conjunction with a wide variety of scan-based or partially-scan-based circuits and can incorporate a wide variety of diagnostic procedures (e.g., effect-cause-based procedures utilizing structural pruning techniques and/or backward path-tracing techniques, which may be modified by various measures). Further, the fault candidates identified need not be of a particular type, but can vary from implementation to implementation (e.g., stuck-at faults, transition faults, bridging faults, and other faults). For illustrative purposes only, however, many of the examples described herein are explained in the context of utilizing an embodiment of an effect-cause algorithm used to diagnose stuck-at faults.

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software may comprise, for example, electronic design automation ("EDA") software (e.g., an automatic test pattern generation ("ATPG") tool) used to diagnose test results captured during production testing of one or more integrated circuits (e.g., an application specific integrated circuit ("ASIC"), a programmable logic device ("PLD") such as a field-programmable gate array ("FPGA"), or a system-on-a-chip ("SoC") having digital, analog, or mixed-signal components thereon). This particular software implementation should not be construed as limiting in any way, however, as the principles disclosed herein are generally applicable to other software tools. Circuit faults that are detected using the disclosed techniques may in some circumstances be repaired.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. Any of the disclosed methods can alternatively be implemented (partially or completely) in hardware (e.g., an ASIC, PLD, or SoC).

Further, diagnostic results produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. For example, a list comprising suspect scan cells (also referred to as "faulty scan cell candidates") produced by the application of any of the disclosed embodiments may be stored on computer readable-media. Such diagnostic results can be created or updated at a local computer or over a network (e.g., by a server computer). As used herein, the term "list" refers to a collection or arrangement of data that is usable by a computer system. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database).

General Considerations

Compression techniques are often used in connection with the testing of integrated circuits. Such techniques are typically implemented by inserting some hardware block (which is termed generally a "compactor" for purposes of this disclosure) along the scan path on the output side of a scan-based or partially-scan-based circuit-under-test. The compactor block compresses the data captured in the internal scan chains of the circuit-under-test, thereby producing a data stream of compacted test responses that is output on a few scan-output channels for comparison with expected values (e.g., by automated test equipment ("ATE")).

In general, compactors can be divided into three categories: (1) space compactors; (2) infinite input response compactors; (3) and finite input response compactors. Space compactors comprise combinational circuits that generate c test outputs from C outputs of the circuit-under-test ("CUT"), where c<C. Space compactors can ordinarily handle unknown states in test responses without any functional logic modification. Examples of space compactors include the so-called "EDT compactor" described in Rajski J., et al., "Embedded Deterministic Test for Low-Cost Manufacturing," *Proc. ITC* 2002, pp. 301-310 (2002), and the so-called "X-compactor" described in Mitra S., et al., "X-Compact: An Efficient Response Compaction Technique for Test Cost Reduction," *Proc. ITC* 2002, pp. 311-320 (2002). A second class of compactors—the infinite input response compactors—utilize polynomial division, counting-based techniques, and check-sum-based methods. Such compactors are typically used in built-in self-test ("BIST") applications. Examples of such compactors are described in Bardell P. et al., "Built-in Self-Test for VLSI: Pseudorandom Techniques," John Wiley & Sons (1987). A third class of compactors can be generally classified as finite input response compactors, which are characterized as having memory but no feedback. Consequently, any error or unknown state that is injected into the compactor is shifted out after some number of cycles. An example of a finite input response compactor is the so-called "convolutional compactor" described in Rajski, J., et al., "Convolutional Compaction of Test Reponses," *Proc. ITC* 2003, pp. 745-754 (2003).

Diagnostic procedures used to analyze circuit responses to test patterns can also be classified into different categories. Two major categories of diagnostic procedures are: (1) cause-effect methods (that is, methods based on cause-effect principles); and (2) effect-cause methods (that is, methods based on effect-cause dependencies). Cause-effect methods typically build a simulation-response database for modeled faults and compare observed failing responses to the database in order to determine the probable cause of the failure. This type of method is often referred to as the "fault dictionary" method, as it requires a large fault-behavior database to be created, stored, and maintained. This method can provide good resolution for assumed fault models whose defect behavior is similar to the modeled fault behavior. For large designs, however, this approach is impractical due to memory constraints in the tester.

Effect-cause methods generally involve analyzing the actual circuit response to a test pattern in order to determine which fault(s) might have caused the observed failure. The analysis can be performed, for example, by backward path tracing from the scan cells and/or primary outputs of the circuit-under-test where faulty behaviors are observed. The error-propagation paths for possible fault suspects can then be identified. Compared to methods based on cause-effect principles, methods based on effect-cause dependencies are generally more memory-efficient and are better able to handle larger designs.

FIG. 1 is a flow chart illustrating an exemplary effect-cause procedure 100 as may be used to analyze test responses to a circuit-under-test having no compaction hardware. The exemplary effect-cause method 100 may be utilized as the underlying diagnostic procedure for the methods described below, which are capable of diagnosing faults in compactor-based designs without being limited to any particular compactor.

At process block 102 of FIG. 1, information indicative of a circuit-under-test's response to one or more test patterns is received. Typically, this information comprises test responses that are captured in scan cells of the circuit-under-test ("CUT") and that are clocked out through scan-out pins. The information received may be a complete record of a test session (e.g., a record of all responses to one or more test patterns) or some portion thereof (e.g., a record of just the failing responses to one or more test patterns). Such information is typically stored in a failure log (or fail log) on the tester, which may then be transferred to another system for diagnosis or may be diagnosed directly by the tester. From the information received, the scan cells within the CUT that captured the failing responses can be determined. For purposes of this discussion, these scan cells are termed "failing scan cells."

At process block 104, one or more failing scan cells are identified from the failing responses listed in the failure log. For a circuit design having no compactor, the failing responses in the failure log can be directly correlated with failing scan cells.

At process block 106, an initial list of fault candidates is identified. The fault candidates comprise the physical locations in the CUT that might contain a physical defect that caused the failing response to appear downstream. To identify the fault candidates, a path-tracing technique can be used. For example, the path-tracing algorithm described in Venkataraman S., et al., "A Deductive Technique for Diagnosis of Bridging Faults," *Proc. IEEE ICCAD*, pp. 562-67 (1974) can be used. This particular path-tracing algorithm, however, is not limiting, as there exist many path-tracing algorithms that are suitable for use in the method 100. The path-tracing technique analyzes a representation of the CUT (e.g., a netlist or HDL file) and identifies the instances of logic (and possibly other circuit components) that at least partially contribute to the test response captured in each failing scan cell. For purposes of this disclosure, the components of the CUT that contribute to the value captured at a respective scan cell are referred to as that scan cell's "logic cone," which has a so-called "fan-in region" that leads to the scan cell.

Figure 2:
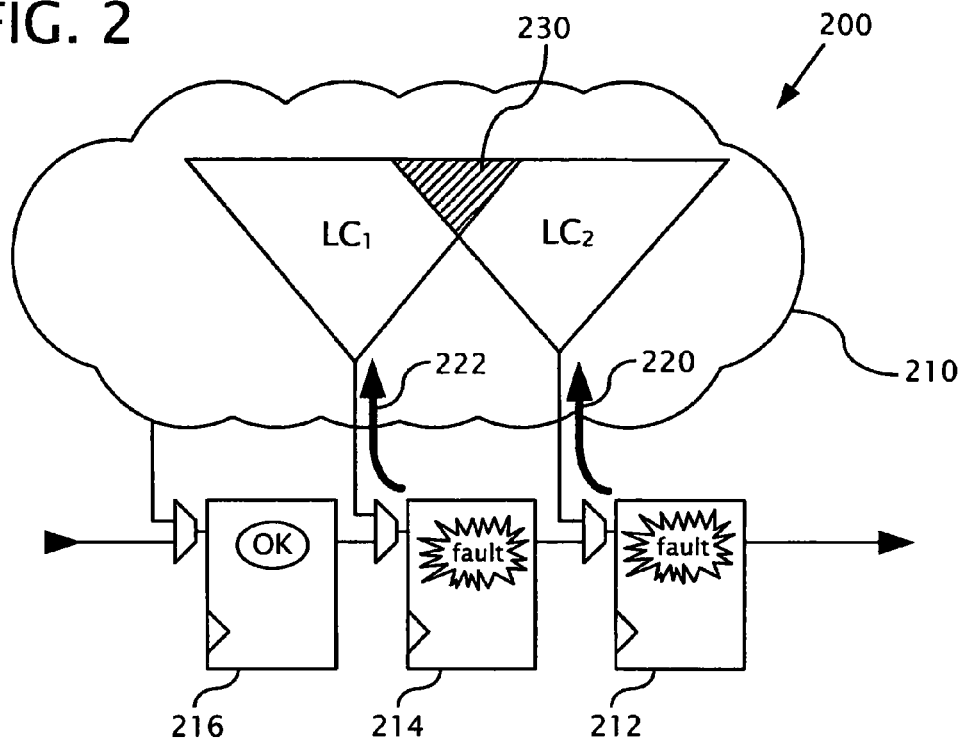
FIG. 2 is a block diagram illustrating an embodiment of the act of path-tracing into logic cones associated with failing scan cells such as in process block 106 of FIG. 1.

FIG. 2 is a schematic block diagram 200 illustrating an exemplary process block 106 of FIG. 1. In FIG. 2, circuit logic 210 of a CUT receives test-pattern values during a launch phase of testing, thereby producing test responses at three respective scan cells 212, 214, 216. For illustrative purposes only, assume that scan cells 214 and 212 capture failing test response (sometimes referred to herein as "failure responses" or "observed failure responses") after application of an exemplary test pattern.

At process block 106, logic cones $LC_1$ and $LC_2$ are identified from the failing scan cells 214, 216 using the path-tracing technique (represented by arrows 220, 222). In certain embodiments of the method 100, only fault candidates in the intersection 230 are included in the list of initial fault candidates, as it is assumed in such embodiments that both of the failing test responses were caused by a single fault in the CUT. Therefore, having identified the logic cones $LC_1$ and $LC_2$; an intersection 230 between the logic cones can be determined. In some implementations of the diagnostic procedure, an additional determination is made (e.g., during path tracing) as to whether sensitization paths exist from the fault candidates to all of the faulty scan cells for the failing pattern.

If not, then the fault candidates are removed from the list. The remaining fault candidates form the initial fault candidate list.

At process block 108, the initial fault candidate list is refined through simulation. For example, according to one exemplary implementation, simulations of the circuit-under-test are performed wherein each fault from the initial list of candidate faults is injected into the simulator's representation of the circuit and application of one, some, or all of the failing test patterns is simulated. From these simulations, a determination can be made as to which fault candidates match the actual response recorded in the failure log. The matching fault candidates are those that propagate the observed faulty effect to the failing scan cells (and/or the observed failing primary outputs), but not to any other observation point (e.g., other scan cells or primary outputs) upon application of the corresponding test pattern. In certain embodiments, the speed of the simulation may be increased using, for example, parallel-pattern single-fault propagation techniques ("PPSFP"), which allow for multiple failing patterns (e.g., 32 patterns) to be processed in parallel.

In some embodiments, certain weighted criteria may be used during process block 108. For example, according to one particular implementation, a first weighted value $w_f$ can be used to indicate the number of failing patterns a fault candidate can explain. The value of $w_f$ (which initially can be zero) can be increased by one for each failing test pattern the corresponding fault explains. In certain embodiments, fault candidates having a value of $w_f$ that is still equal to zero after simulation are removed from the list of fault candidates.

Figure 3:
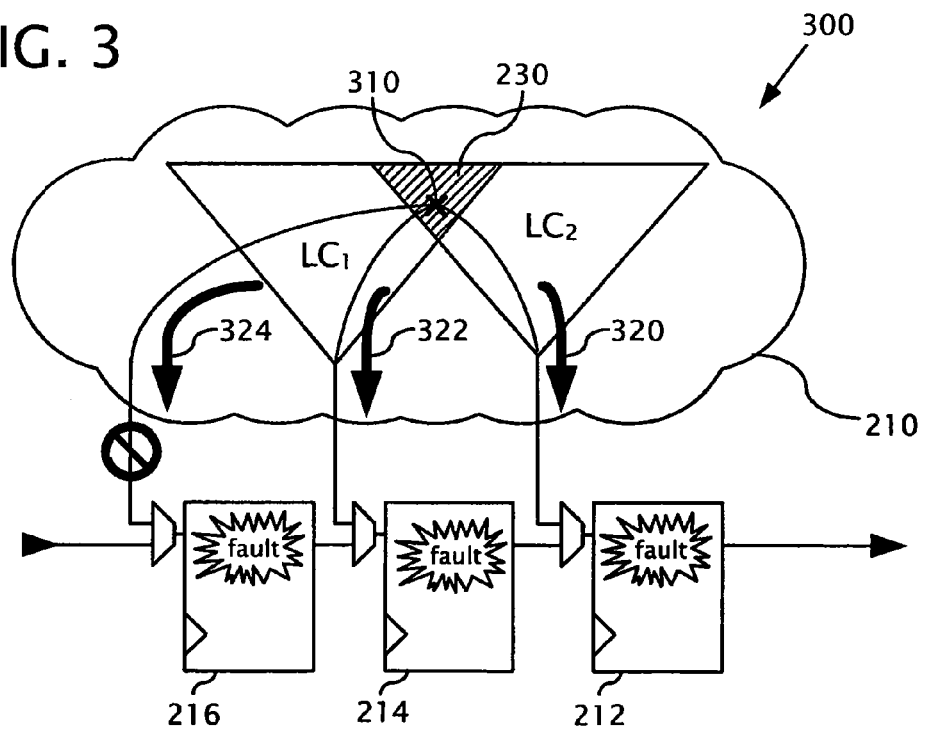
FIG. 3 is a block diagram illustrating an embodiment of the act of simulating faults in a representation of the circuit in order to refine the list of initial fault candidates, such as in process block 108 of FIG. 1.

FIG. 3 is a schematic block diagram 300 illustrating the forward simulation of fault candidates that occurs at process block 108. In particular, FIG. 3 illustrates the forward simulation (denoted by arrows 320, 322, 324) of the circuit logic 210 when a failing test pattern is applied in the presence of a selected fault 310 from the initial list of fault candidates. In the illustrated example, the selected fault 310 produces an unexpected response at scan cell 216, as well as the expected responses at scan cells 212, 214. Accordingly, in this example, the selected fault 310 does not explain the observed test response, and, in certain embodiments, the first weighted value $w_f$ will not be increased. In some embodiments, if the simulated test pattern is the test pattern that produced the test response used to identify the fault candidate, then the fault candidate is removed from the list of candidates unless it produces a simulated test response identical to the actual test response.

At process block 110, the remaining fault candidates are ranked. In some embodiments of the method 100, for example, additional simulations are performed to help further refine the list of candidate faults. For instance, one or more passing test patterns can be simulated in the presence of each of the fault candidates in order to calculate a second weighted value $w_g$. In one particular implementation, the value of $w_g$ is increased by one for each successful test pattern that the fault candidate explains. The first weighted value $w_f$ and the second weighted value $w_g$ may then be used to rank the remaining candidates. For example, a combined weight utilizing both $w_f$ and $w_g$ may be calculated using the following equation:

$$(\alpha w_f + (1-\alpha) w_g) \tag{1}$$

where $\alpha$ is a real number between "0" and "1." Using the list of ranked candidates, physical inspections of the circuit-under-test can be performed, and, in many instances, the fault repaired.

Compactor Modeling Generally

One of the techniques that may be utilized in embodiments of the disclosed technology is compactor modeling. A typical scan-based or partially-scan-based design-for-test ("DFT") circuit uses a plurality of scan chains that feed into the compactor. For each test pattern launched in the circuit-under-test, test responses of "1," "0," or "X" (unknown bits) are captured into scan cells of the scan chain and shifted into the compactor. Each bit of the test response after compaction (denoted generally as $P_i$, where i is an index value that increases incrementally for each value output from the compactor) can be expressed as a function of a set of values that are captured into the scan cells before compaction. For any given compactor, there exists a unique set of equations that represents the relationships between the values observed after compaction and the values captured into the scan cells before compaction. As used herein, this relationship is defined by the "transformation function" and is denoted as $\Phi_i$ such that $P_i=\Phi_i(C_i)$ where $C_i$ is the corresponding set of logic cones that determine the test responses captured in scan cells before compaction. The cumulative set of transformation functions $\Phi_i$ representative of all values output from the compactor can be denoted by the general transformation operator $\Phi$. This particular form of notation should not be construed as limiting, however, as the transformation function can be described or denoted in a variety of different ways. For example, the transformation function of a particular compactor can be described as a set of matrices denoting the test responses before and after compaction. The exact values of $\Phi_i$ may be determined by the compactor architecture present in the circuit design and will vary from design to design. Further, in some compactor architectures (e.g., infinite input response compactors), the transformation function will vary over time (e.g., each time the compactor is clocked).

Figure 4A:
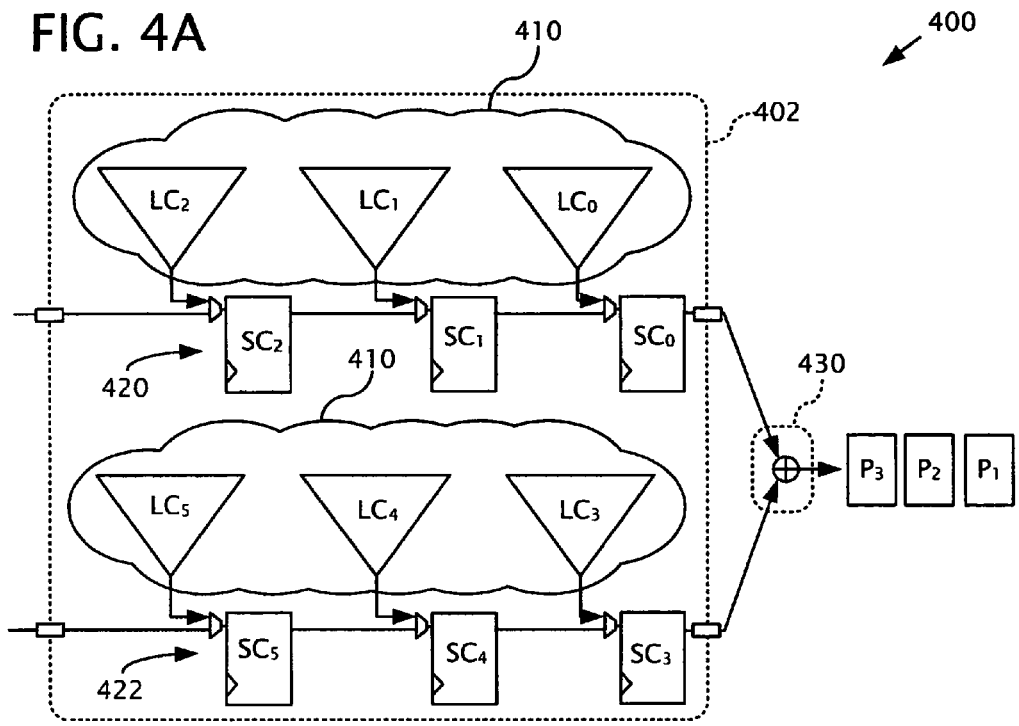
FIG. 4A is a block diagram of an exemplary scan-based circuit-under-test configured to capture test responses in scan cells and output the test responses to a compactor.
Figure 4B:
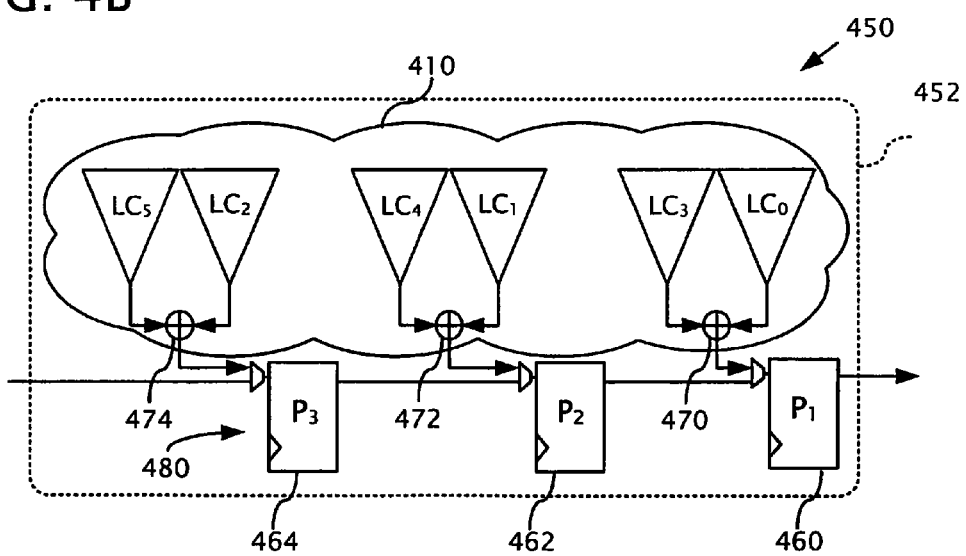
FIG. 4B is a block diagram illustrating an example of how the circuit-under test from FIG. 4A can be transformed such that the transformation function performed by the compactor is performed upstream of the original scan cells.

FIGS. 4A and 4B are block diagrams 400 and 450, respectively, that illustrate conceptually how the transformation function $\Phi$ can be applied to a circuit-under-test 402. The circuit-under-test 402 comprises logic 410 wherein six logic cones ($LC_0$ through $LC_5$) feed six exemplary scan cells ($SC_0$ through $SC_5$). Scan cells $SC_0$ through $SC_2$ form a first scan chain 420, whereas scan cells $SC_3$ through $SC_5$ form a second scan chain 422. In this example, the first and second scan chains 420, 422 output into a compactor 430, which, for illustrative purposes only, is assumed to be an XOR gate (as may be used, for example, in a space compactor, such as the EDT compactor). The compacted test responses ($P_1$ through $P_3$) are output from the compactor 430 (e.g., through a scan-out pin). Thus, in FIG. 4, the transformation function $\Phi$ corresponds to the XOR function, which is universally applied in this specific example during every clock cycle of the illustrated compactor 430. Thus, for compacted test responses $P_1$ through $P_3$, the compactor can be modeled as follows:

$$P_0=(0\oplus3),$$

$$P_1=(1\oplus4), \text{ and}$$

$$P_2=(2\oplus5), \quad (2)$$

where $\oplus$ corresponds to the XOR function, and the numerals represent the test responses produced by the corresponding logic cones (e.g., "0" represents the response produced by logic cone $LC_0$).

The transformation function can also represent a more general relationship between compacted test responses and the respective logic cones that at least partially contribute to them (that is, the representation does not need to specifically model the Boolean function performed by the compactor). In this example, for instance, the transformation function can be described as follows:

$$P_0=\Phi_0(\{0,3\}),$$

$$P_1=\Phi_1(\{1,4\}), \text{ and}$$

$$P_2=\Phi_2(\{2,5\}), \quad (3)$$

where the numerals represent the logic cones that produce the test responses compacted via the function $\Phi_i$ (e.g., "0" represents logic cone 0 and the test response it produces).

A representation of the circuit-under-test 402 can be modified so that the transformation function $\Phi$ is embedded in the transformed circuit. The resulting modified circuit can be viewed as one having no compactor, and having "pseudo-scan-chains" and "pseudo-scan-cells" instead of scan chains and scan cells. An exemplary modified circuit representation 452 is shown in FIG. 4B. The modified circuit representation 452 is logically identical to the circuit-under-test 402 with the compactor 430, but the original internal scan chains 420 and 422 are replaced by one pseudo-scan-chain 480 and the original internal scan cells $SC_0$ through $SC_5$ are replaced by three pseudo-scan-cells 460, 462, 464. In addition, the transformation function $\Phi$ performed by the compactor 430 is moved upstream of the pseudo-scan-cells 460, 462, 464. In the illustrated example, for instance, three XOR gates 470, 472, 474 are inserted into the circuit-under-test 410 and output into three pseudo-scan-chains 460, 462, 464, which capture the values $P_1$ through $P_3$.

Exemplary Embodiments for Diagnosing Faults from Compacted Test Responses

There are multiple ways in which the transformation function $\Phi$ or a transformed circuit can be utilized as part of an overall diagnostic procedure for scan-based or partially-scan-based designs having compacted test results. Two exemplary methods are shown generally in FIGS. 5 and 6, respectively.

Modifying the Diagnostic Procedure

FIG. 5 is a flow chart illustrating a first general embodiment for performing fault diagnosis on compacted test results in which the diagnostic procedure itself is modified. The method 500 shown in FIG. 5 can be applied to a wide variety of different compaction schemes and can utilize a variety of existing diagnostic algorithms. Further, embodiments of the method 500 can perform on-line diagnosis and/or account for multiple errors captured in a test response and output during a single scan-out cycle.

At process block 502, a description of a scan-based or partially-scan-based circuit and a compactor is received. The description may be a circuit design file as is commonly used in the EDA industry (e.g., the description may be a netlist or a hardware description language ("HDL") file, such as a VHSIC Hardware Description Language ("VHDL") file or Verilog file).

At process block 504, at least a portion of the transformation function $\Phi$ performed by the compactor in the circuit description is determined. This determination can be made mathematically or empirically using, for example, a logic simulation of the circuit and compactor.

At process block 506, a diagnostic procedure for diagnosing uncompacted test responses is modified such that the transformation function is incorporated into the procedure. As a result of determining the transformation function at process block 504 (e.g., the transformation function $\Phi_i$ for at least a portion of the compacted test responses), a relationship between a compacted test response $P_i$ and the logic cones that may have contributed to the test responses (the "candidate logic cones") is known. The diagnostic procedure can be modified to account for this relationship, such that the additional acts performed in the procedure assume that all of the candidate logic cones related to a failing test response $P_i$ via the transformation function are to be analyzed. An example of this process is described in greater detail below with reference to FIG. 6.

At process block 508, the modified diagnostic procedure is applied to compacted test responses. For instance, the modified diagnostic procedure can be applied to the failures recorded in a failure log from a tester after applying test patterns to a circuit-under-test and having the test responses compacted by a compactor.

Exemplary Embodiments of a Modified Diagnostic Procedure

Figure 7A:
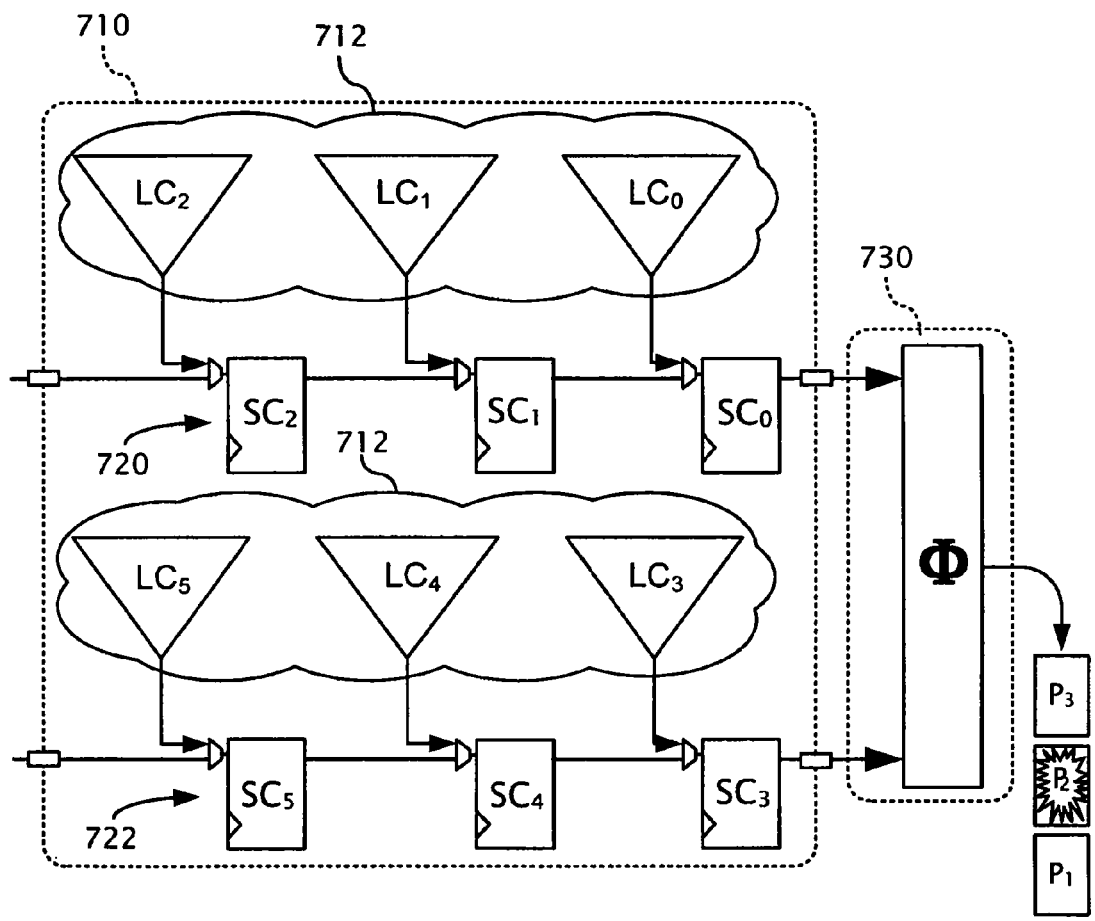
FIGS. 7A-7C are block diagrams illustrating how an embodiment of the method shown in FIGS. 5 and 6 can be applied to an exemplary scan-based circuit-under-test.

An exemplary application of the general method 500 is shown with reference to FIGS. 6, 7A, 7B, and 7C. In FIG. 7A, an original circuit 710 comprises logic 712 having six logic cones $LC_0$ though $LC_5$ that feed six respective internal scan cells $SC_0$ through $SC_5$. The outputs of the two scan chains 720, 722 are coupled to the inputs of a compactor 730, which performs compaction according to some compaction function $\Phi$ and produces exemplary compacted test responses $P_1$ through $P_3$. Although not illustrated in FIG. 7A, different logic cones may have some common logic among them (that is, two or more of the logic cones may at least partially intersect). In such a scenario, faults from the intersecting logic can propagate to multiple scan cells, even to scan cells that are output during the same scan-out cycle.

With reference to the general method 500, at process block 502, a description of the original circuit 710 and compactor 730 (e.g., a netlist or HDL file) is received. At process block 504, the compaction function performed by the compactor 730 is determined. For example, the compactor 730 can be modeled as a function $\Phi_i$, such that $P_i=\Phi_i(C_i)$. Conceptually, the observed fault responses $P_i$ can be viewed as being captured in the $i^{th}$ pseudo-scan-cell (i=1, 2, 3, as in the pseudo-scan-cells 460, 462, 464 illustrated in FIG. 4B), and $C_i$ is a set of logic cones that at least partially determine the value at the corresponding pseudo-scan-cell. A logic cone $LC_j$ appears in set $C_i$ if it is at least partially determinative of the corresponding compacted test response $P_i$. At process block 506, the diagnostic procedure is modified to at least partially incorporate the transformation function $\Phi$, thereby allowing the procedure to be applied to the failing responses observed by the compactor. At process block 508, the modified diagnostic procedure is applied to the compacted test responses (e.g., to the responses recorded in a failure log from a tester).

FIG. 6 illustrates how a typical effect-cause diagnostic procedure can be modified at process block 506 and applied at process block 508 of the general method 500. Unless otherwise stated, the method illustrated in FIG. 6 is substantially similar to the effect-cause procedure 100 outlined above with respect to FIG. 1, except that the method of FIG. 6 operates on compacted results. For purposes of this example, assume that the design of the original circuit-under-test is as shown in FIG. 7A and described above, and that the transformation function of the compactor has the following general relationship:

$$P_1=\Phi_1(\{0,1,2,3\}),$$

$$P_2=\Phi_2(\{0,4\}), \text{ and}$$

$$P_3=\Phi_3(\{2,4,5\}), \quad (4)$$

where the numerals represent the logic cones that produce the test responses compacted via the function $\Phi_i$ (e.g., "0" represents logic cone 0 and the test response it produces).

At process block 602, a failure log indicative of the failing responses to one or more test patterns in a circuit-under-test is received (e.g., from a tester). For purposes of the example illustrated in FIGS. 7A-7C, assume that a failure is observed in compacted test response $P_2$.

At process block 604, initial fault candidates for the failing responses are determined by path-tracing into logic cones of the circuit-under-test identified using the transformation function. In this example, for instance, the relationship between the compacted test response $P_2$ and the candidate logic cones contributing to the test response is given by $P_2=\Phi_2(\{0,4\})$, which can be used to identify the logic cones $LC_0$ and $LC_4$ as the logic cones that should be path traced for fault candidates. Note that the relationship need not specifically identify the actual function of the compactor (e.g., an XOR function), only the potential logic cone sources that at least partially determine the compacted test response. Thus, it is not necessary to calculate or use a reverse function $\Phi^{-1}$ in order to identify failing scan-cell candidates; instead, the relationship $\Phi$ can be applied to the compressed test responses and used to directly identify the logic cone candidates wherein a potential fault might exist. Further, no assumption concerning the number of failing scan cells that are output during a single scan-out cycle needs to be made, thereby maximizing the solution space of possible fault candidates. According to one exemplary implementation, for instance, the initial fault candidate list comprises all faults identified in the union of logic cones $C_i$ as given by the relationship $P_i=\Phi_i(C_i)$ for a given failing response $P_i$.

Figure 7B:
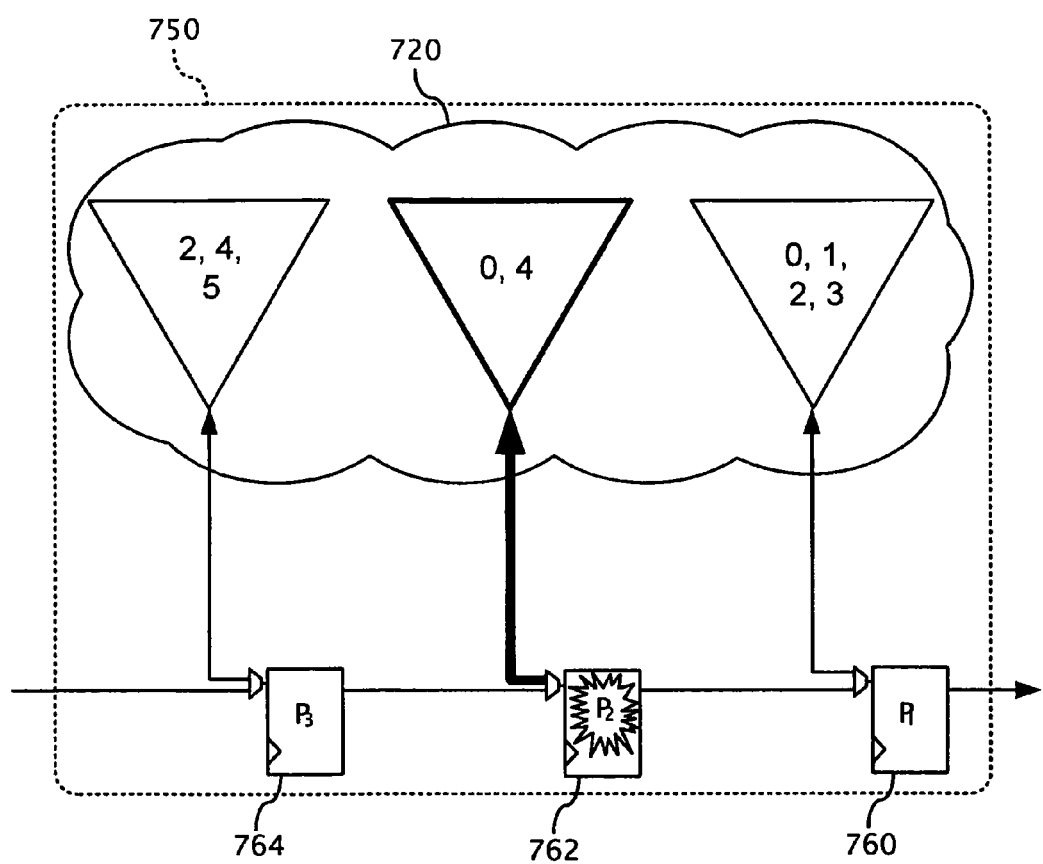

A conceptual representation of a transformed circuit-under-test 750 during this method act is shown in FIG. 7B. Specifically, FIG. 7B shows pseudo-scan-cells 760, 762, 764, which correspond to the compacted test responses $P_1$ through $P_3$ from the original compactor 730. As a result of the compactor modeling described above, it is known that the value at each of the pseudo-scan-cells 760, 762, and 762 must be at least partially determined by the following respective unions of logic cones: $(LC_0 \cup LC_1 \cup LC_2 \cup LC_3)$, $(LC_0 \cup LC_4)$, and $(LC_2 \cup LC_4 \cup LC_5)$. Therefore, in one implementation, the initial fault candidates comprise all possible faults found during path tracing into the logic cone union $LC_0 \cup LC_4$. Note that in FIG. 7B and in the other figures of this disclosure, logic cone unions are denoted merely by the logic cone numbers in the union. Thus, the union of $LC_0 \cup LC_4$ is denoted as (0, 4).

If multiple failing responses $P_i$ are captured in scan cells upon application of a single test pattern, the list of initial fault candidates can be narrowed down by considering only those fault candidates that intersect between respective candidate lists. An example of this narrowing procedure is described below with reference to FIGS. 9 and 10.

Returning to FIG. 6, at process block 606, the list of initial fault candidates is refined through simulation of the transformed circuit-under-test, wherein the simulation is adapted to incorporate the transformation function. For example, in one exemplary implementation, each fault in the suspect list is injected into the circuit and simulated. During simulation in this implementation, the transformation function is accounted for. Typically, this is done by using a mathematical function during the simulation (e.g., by calculating compacted test responses from respective captured scan cell values using the function $\Phi_i$), but may alternatively be performed by actually simulating the logic components of the compactor (e.g., using a circuit description that embeds the compactor upstream of pseudo-scan-cells). The results from the simulation at process block 606 are compared with the test responses observed and stored in the failure log. If the simulation results do not match with the actual observed results for the corresponding test pattern, then, in one implementation, the fault candidate is removed. In another implementation, all of the failing patterns are simulated for each fault candidate and a weighted criteria (such as the criteria described above with respect to FIG. 1) is utilized to evaluate how well the fault candidate explains the test responses for every failing pattern. In this implementation, if a fault candidate cannot explain the observed responses for any failing test pattern, it is removed from the list of fault candidates.

Figure 7C:
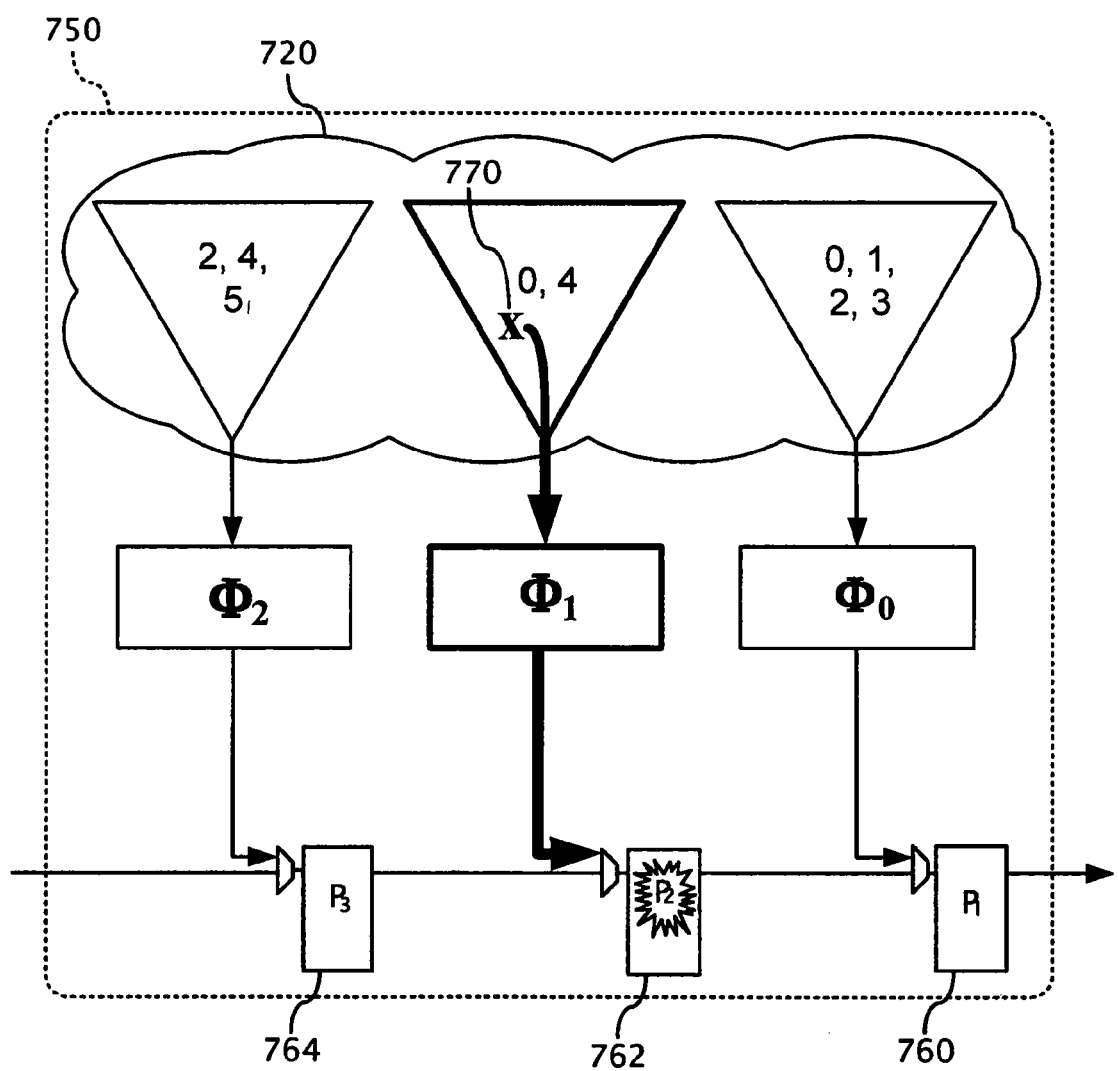

Forward simulation as may be performed at process block 606 is illustrated schematically in FIG. 7C, which shows a selected fault candidate 770 ("X") being propagated through logic cone union $LC_0 \cup LC_4$ during application of a test pattern (assumed for illustrative purposes to be the same test pattern applied when the corresponding failing test response was observed). In the illustrated simulation, the error caused by the fault candidate 770 is propagated to pseudo-scan-cell 762 (corresponding to $P_2$), but not pseudo-scan-cells 760 or 764 (corresponding to $P_1$ and $P_3$, respectively). (Note that in the forward simulation illustrated in FIG. 7C, the transformation functions $\Phi_1$, $\Phi_2$, and $\Phi_3$ are embedded into the simulation. That is, the functions $\Phi_1$, $\Phi_2$, and $\Phi_3$ are performed on the values output from the respective logic cones (0, 1, 2, 3), (0, 4), and (2, 4, 5), respectively). Accordingly, the fault candidate 770 produced the observed test response for the corresponding test pattern, and would remain on the list of fault candidates.

At process block 608, the remaining fault candidates are ranked. For example, any of the criteria used in known effect-cause diagnostic methodologies can be used.

Modifying the Circuit Description

FIG. 8 is a flow chart illustrating a second general embodiment for performing fault diagnosis according to the disclosed technology. The method 800 shown in FIG. 8 can be applied to a wide variety of different compaction schemes and can utilize a variety of existing diagnostic algorithms. Further, embodiments of the method 800 can perform on-line diagnosis and/or account for multiple errors captured in a test response and output during a single scan-out cycle.

At process block 802, a description of a scan-based or partially-scan-based circuit and a corresponding compactor is received (e.g., a netlist or HDL file). At process block 804 a transformation function performed by the compactor (e.g., $\Phi$) is determined. At process block 806, the circuit description is modified so as to embed at least a portion of the compaction function upstream of one or more scan cells in the circuit. For example, the circuit description may be modified so that the compaction functions associated with selected scan cells are performed upstream of pseudo-scan-cells, but downstream of the respective logic cones that feed the pseudo-scan-cells. Consequently, one or more scan cells from the original circuit design are replaced by "pseudo-scan-cells" that capture test response values equivalent to the test responses values output from the compactor in the original circuit description. At process block 816, a diagnosis procedure for circuit designs having no compaction (e.g., one of the traditional effect-cause diagnostic procedures) is applied using the modified circuit description. In this embodiment, because the circuit description itself has been modified to embed the compaction function, no special modification of the diagnostic scheme is necessary (though modification is not necessarily excluded).

The general method 800 can be applied to any compactor that can be represented in terms of a transformation function $\Phi$. Moreover, because the resulting circuit transformation results in a circuit description that inherently accounts for the compaction function, any appropriate diagnostic procedure for uncompacted test response can be utilized.

Exemplary Applications

In order to illustrate various features and aspects of the disclosed technology, the application of the exemplary compactor-independent diagnostic procedure described in FIGS. 5 and 6 is described as being applied to a variety of known compactors. Specifically, an embodiment of the disclosed procedure is described as it applies to: (1) an X-compactor; (2) a convolutional compactor; (3) an EDT compactor; and (4) an elementary-tree compactor.

X-Compactor

The X-compactor is described in Mitra S., et al., "X-Compact: An Efficient Response Compaction Technique for Test Cost Reduction," *Proc. ITC* 2002, pp. 311-320 (2002). The X-compactor is a linear space compactor and generally comprises internal scan chain outputs connected to more than one XOR gate in an XOR tree.

Figure 9:
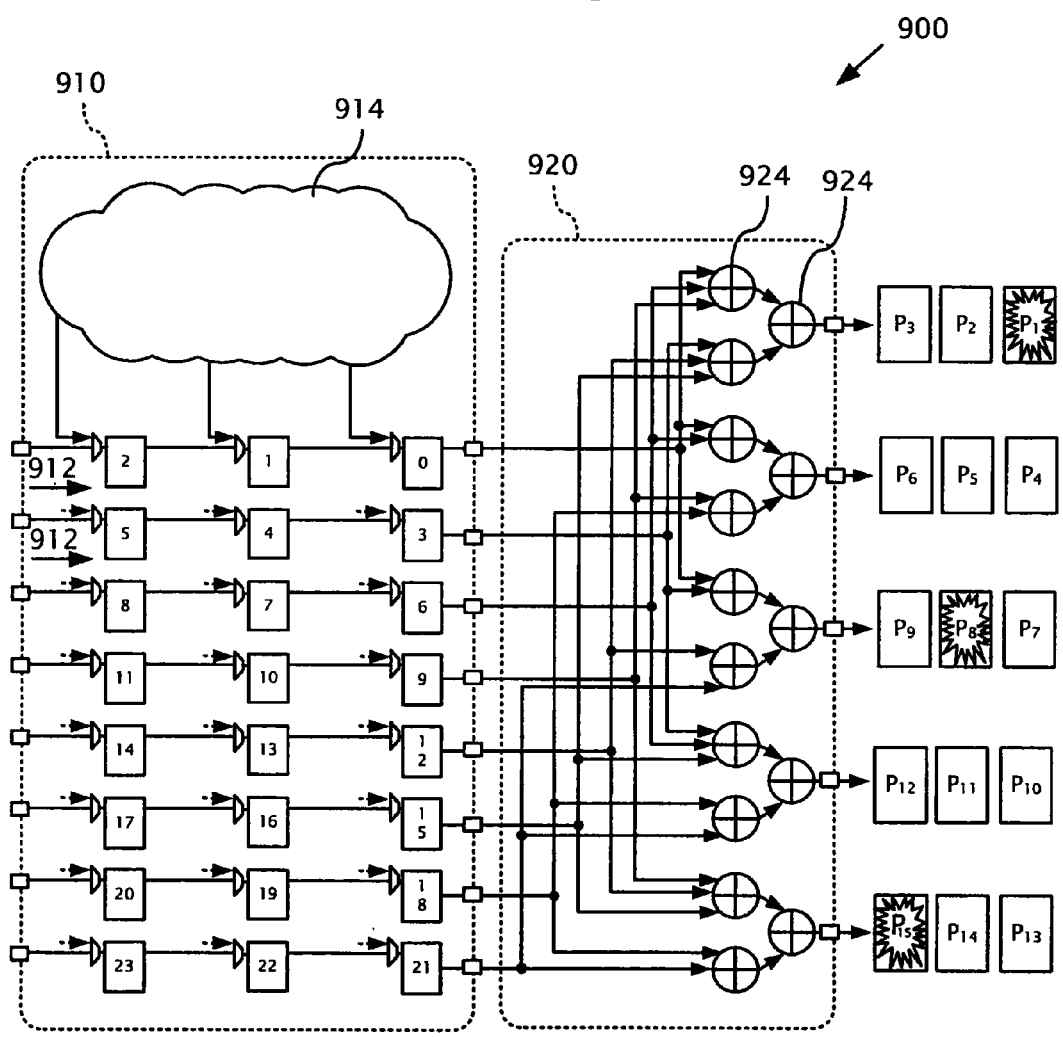
FIG. 9 is a schematic block diagram of an exemplary scan-based circuit-under-test coupled to an exemplary X-compactor.

FIG. 9 is a block diagram 900 schematically showing an exemplary circuit-under-test 910 having eight scan chains coupled to an exemplary X-compactor 920. The circuit-under-test has eight scan chains 912 fed by logic 916 that output into the X-compactor 920, which compacts the data from the scan chains into five outputs through an XOR tree comprises XOR gates such as the two indicated at 924 in FIG. 9. As shown in FIG. 9, each scan-chain output branches into three XOR gates of the tree in the compactor 920.

Using the diagnostic procedure described above with respect to FIGS. 5 and 6, a transformation function $\Phi$ can be determined that models the compactor 920 (process block 504). A failure log indicative of failing test responses is received (process block 602). For purposes of this example, assume that the failure log indicates that failures are present in three of the compacted test responses: $P_1$, $P_8$, and $P_{15}$. Using the transformation function $\Phi$, path-tracing can be performed into each logic cone associated with a corresponding failing compacted test response (or, equivalently, from each failing pseudo-scan-cell) to determine the initial fault candidates (process block 604). As can be verified from FIG. 9, the transformation functions of the compactor 920 for the three observed failing responses are as follows:

$$P_1 = \{(0 \oplus 6 \oplus 9) \oplus (3 \oplus 12 \oplus 15)\}$$

$$P_8 = \{(1 \oplus 4) \oplus (13 \oplus 22)\}$$

$$P_{15} = \{(11 \oplus 14 \oplus 17) \oplus (20 \oplus 23)\} \quad (5)$$

Or, written more generally so as to identify just the candidate logic cones:

$$P_1 = \Phi_1(\{0,3,6,9,12,15\})$$

$$P_8 = \Phi_8(\{1,4,13,22\}), \text{ and}$$

$$P_{15} = \Phi_{15}(\{11,14,17,20,23\}). \quad (6)$$

Figure 10:
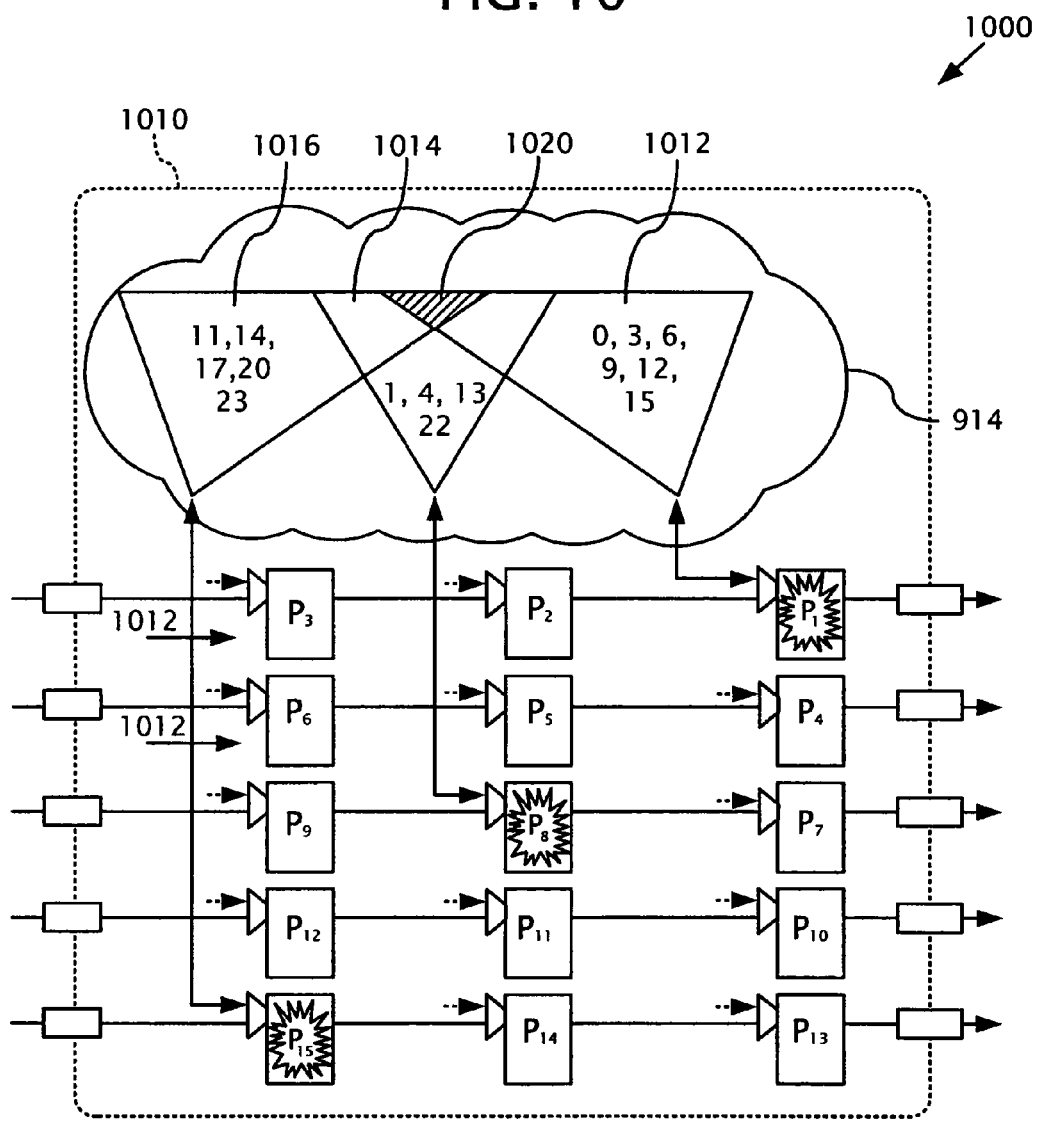
FIG. 10 is a schematic block diagram illustrating how an exemplary embodiment of the method shown in FIGS. 5 and 6 can be applied to the circuit-under-test and X-compactor from FIG. 9.

FIG. 10 is a schematic diagram 1000 conceptually illustrating a transformed circuit 1010. The transformed circuit 1010 represents the circuit-under-test 910 after it has been transformed to incorporate the transformation functions $\Phi_1$, $\Phi_8$, $\Phi_{15}$. As can be seen from FIG. 10, the transformed circuit 1010 has five pseudo-scan-chains 1012 (only two of which are number in FIG. 10) comprising pseudo-scan-cells ($P_1$ through $P_{15}$). From the transformation functions $\Phi_1$, $\Phi_8$, $\Phi_{15}$ given in Equation (6), it can be determined that the faults that led to the observed failure $P_1$ (or, equivalently, the value at pseudo-scan-cell $P_1$ in transformed circuit 1010) must have come from the logic cone union 1012 ($LC_0 \cup LC_3 \cup LC_6 \cup LC_9 \cup LC_{12} \cup LC_{15}$). Likewise, the faults that led to the observed failure at $P_8$ (or, equivalently, pseudo-scan-cell $P_8$ in FIG. 10) must have come from the logic cone union 1014 ($LC_1 \cup LC_4 \cup LC_{13} \cup LC_{22}$). Finally, the faults that led to $P_{15}$ (or, equivalently, pseudo-scan-cell $P_{15}$ in FIG. 10) must have come from the logic cone union 1016

($LC_{11} \cup LC_{14} \cup LC_{17} \cup LC_{20} \cup LC_{23}$). In one implementation, the initial fault candidates comprise all faults in the logic cone unions 1012, 1014, 1016. However, in another implementation, it may be assumed that a single fault caused all of the failures observed for a particular test pattern. Thus, the list of initial fault candidates can be determined by finding the intersection of all of the logic cone unions. For example, the fault candidates within area 1020 in FIG. 10 comprise the fault candidates in the intersection of the three logic cone unions 1012, 1014, 1016. In still other implementations, the assumption that a single fault caused all of the failures for particular test pattern may be dependent on the location and/or number of the failures observed. Simulations of the test patterns in the circuit while injecting each fault in the list of initial fault candidates can be performed (process block 606). For each pattern simulated, the transformation function Φ can be applied in order to get simulated results that can be compared to the data in the failure log.

Using the illustrated diagnostic procedure, defects that cause multiple scan cells to capture errors that are output during the same scan-out cycle can be identified. By contrast, in some diagnostic methodologies, the assumption is made that only a single scan cell produces an error at any scan-out cycle so long as the other scan cells do not produce unknown values ("X" values). This assumption, however, implies that there is no intersection among logic cones that feed into scan cells that output during the same scan-out cycle. For example, consider the X-compactor 920 illustrated in FIG. 9. Each internal scan chain 912 is connected to three compactor outputs. Thus, under the single-error assumption, three failed pseudo-scan-cells should be observed during any failed scan-out cycle. Accordingly, given the observed failures at $P_1$, $P_8$, and $P_{15}$, a procedure based on the single-error assumption would not be able to identify which internal scan cells captured the failures.

Convolutional Compactor

The convolutional compactor is described in Rajski J., et al., "Convolutional Compaction of Test Reponses," *Proc. ITC* 2003, pp. 745-754 (2003). The convolutional compactor is a finite input response compactor having memory elements that are typically reset after a signature is produced for a given test pattern.

FIG. 11 is a block diagram 1100 schematically showing an exemplary circuit-under-test 1110 having three scan chains 1112 (two of which are numbered in FIG. 11) coupled to an exemplary convolutional compactor 1120 (the reset circuitry for the convolutional compactor 1120 is not shown). The circuit-under-test 1110 has three scan chains 1112 that output into the convolutional compactor 1120, which compacts the data from scan chains outputs into a single output 1122, producing six compacted test responses $P_1$ through $P_6$ from the values captured in the scan chains. In particular, the convolutional compactor 1120 comprises a shift register 1124, whose memory elements are coupled to the scan chains by means of additional 2-input XOR (or XNOR) gates 1126 (two of which are numbered in FIG. 11) interspersed between successive memory elements.

According to the diagnostic procedure described above with respect to FIGS. 5 and 6, a transformation function Φ can be determined that models the compactor 1120 (process block 504). A failure log indicative of failing test responses is received (process block 602). For purposes of this example, assume that the failure log indicates that failure occurred in three of the compacted test responses: $P_2$, $P_4$, and $P_5$. Using the transformation function Φ, path-tracing can be performed into each logic cone associated with a corresponding failing compacted test response (or, equivalently, from each failing pseudo-scan-cell) to determine the initial fault candidates (process block 604). As can be verified in FIG. 11, the transformation functions of the compactor 1120 for the three observed failing test responses are as follows:

$$P_2 = (3 \oplus 6 \oplus R_1) \oplus (1 \oplus 4)$$

$$P_4 = (0 \oplus 3 \oplus 6) \oplus (1 \oplus 7) \oplus (5 \oplus 8)$$

$$P_5 = (1 \oplus 4 \oplus 7) \oplus (2 \oplus 8) \oplus R_2 \qquad (7)$$

where $R_1$ and $R_2$ represent known values that are loaded into the compactor when it is reset or when the test responses in the circuit-under-test 1110 are shifted out. As in the above example, the transformation function can be more generally written:

$$P_2 = \Phi_2(\{1,3,4,6\}),$$

$$P_4 = \Phi_4(\{0,1,3,5,6,7,8\}), \text{ and}$$

$$P_5 = \Phi_5(\{1,2,4,7,8\}). \qquad (8)$$

FIG. 12 is a schematic diagram 1200 conceptually illustrating a transformed circuit 1210. The transformed circuit 1210 represents the circuit-under-test 1110 after it has been transformed using the transformation functions $\Phi_2$, $\Phi_4$, and $\Phi_5$. As can be seen in FIG. 12, the transformed circuit 1210 has one pseudo-scan-chain 1212 with six pseudo-scan-cells ($P_1$ through $P_6$). In general, for a design with scan chain length L and a convolutional compactor with M memory elements in each compactor channel, the length of the pseudo-scan-chain is (L+M−1).

From the transformation functions $\Phi_2$, $\Phi_4$, $\Phi_5$, it can be observed that the faults that led to the observed failure $P_2$ (or, equivalently, the value at pseudo-scan-cell $P_2$ in the transformed circuit 1210) must have come from at least one of the scan cells 1, 3, 4, or 6. Also, the failure observed at $P_4$ must have come from (at least one of) the scan cells 0, 1, 3, 5, 6, 7, or 8, and the failure observed at $P_5$ must have come from (at least one of) the scan cells 1, 2, 4, 7, or 8. In some diagnostic methodologies, the intersection of these scan cells comprises the failing-scan-cell candidates from which path tracing can be performed. In the given example, for instance, scan cell 1 would be identified as the only scan cell candidate. According to the single-error assumption, this analysis is acceptable. However, in reality, it is possible that multiple scan cells captured failures and are clocked out during the same scan-out cycle. For example, with reference to FIG. 11, if the fault is located at the intersection of logic cones $LC_4$ and $LC_7$, and if the fault can propagate the fault effect to scan cells 4 and 7, it will produce the observed failure signature but will not be identified as a fault candidate.

By contrast, according to an implementation of the disclosed method 600, the intersection of the logic cone unions that contain the potential faults suspects is used to determine the initial fault candidates. For instance, in the illustrated example, the faults that led to the observed failure at $P_2$ must have come from the logic cone union 1212 ($LC_1 \cup LC_3 \cup LC_4 \cup LC_6$). Likewise, the faults that led to the observed failure at $P_4$ (or, equivalently, pseudo-scan-cell $P_4$ in the transformed circuit 1210) must have come from the logic cone union 1214 ($LC_0 \cup LC_1 \cup LC_3 \cup LC_4 \cup LC_5 \cup LC_6 \cup LC_7 \cup LC_8$). Finally, the faults that led to $P_5$ (or, equivalently, pseudo-scan-cell $P_5$ in the transformed circuit 1210) must have come from the logic cone union 1216 ($LC_1 \cup LC_2 \cup LC_4 \cup LC_7 \cup LC_8$). The list of initial fault candidates can be determined by finding the intersection of the logic cone unions 1212, 1214, 1216. This intersection is conceptually shown in FIG. 12 as area 1220.

Simulations of the test patterns in the circuit while injecting each fault candidate can be performed (process block 606). For each pattern simulated, the transformation function Φ is applied in order to get simulated results that can be compared to the data in the failure log. The remaining candidates can be ranked using, for example, criteria from any of the known effect-cause diagnostic methodologies (process block 608), thereby completing the exemplary diagnostic procedure 600.

EDT Compactor

The EDT compactor is described in Rajski J., et al., "Embedded Deterministic Test for Low-Cost Manufacturing," *Proc. ITC* 2002, pp. 301-310 (2002). The EDT Compactor is essentially an XOR tree with scan chain masking to handle unknown values.

Figure 13:
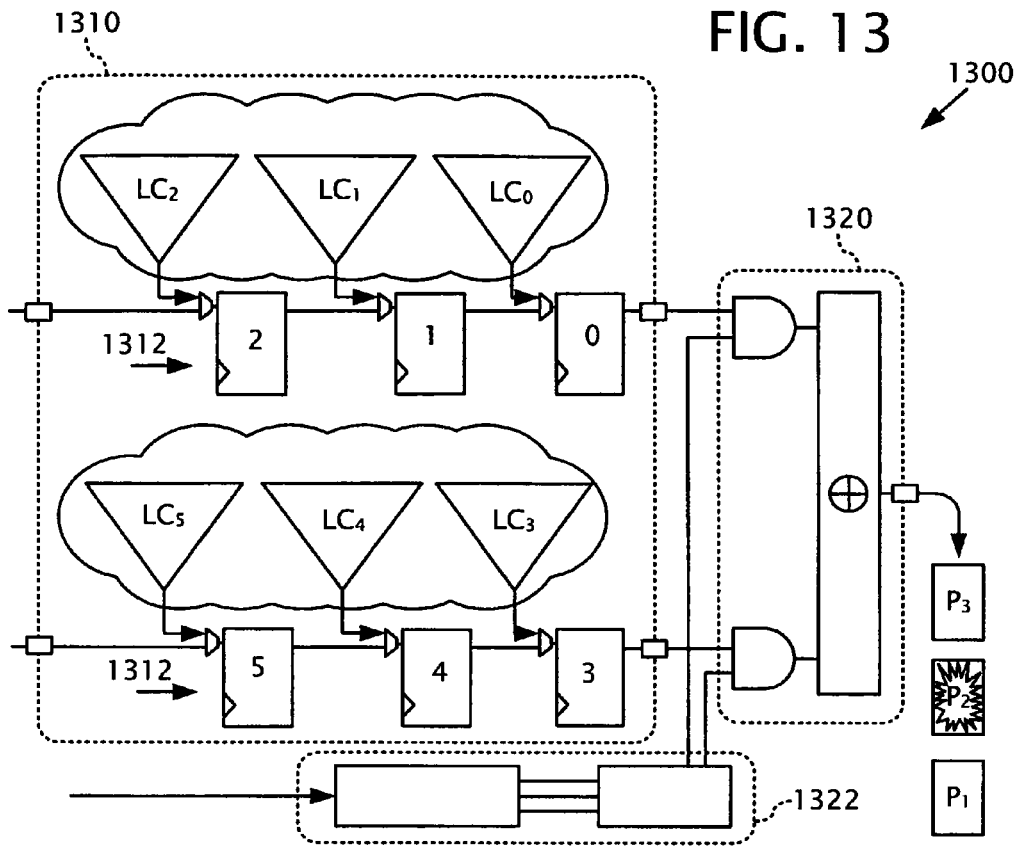
FIG. 13 is a schematic block diagram of an exemplary scan-based circuit-under-test coupled to an exemplary Embedded Deterministic Test ("EDT") compactor.

FIG. 13 is a block diagram 1300 schematically showing an exemplary circuit-under-test 1310 having two scan chains 1312 coupled to an exemplary EDT compactor 1320, which comprises an XOR gate (bypass circuitry 1322 can be used to selectively mask one of the scan chains or all-but-one of the scan chains). For the circuit-under-test 1310, the EDT compactor 1320 produces three compacted test responses $P_1$ through $P_3$.

According to the diagnostic procedure described above with respect to FIGS. 5 and 6, a transformation function Φ can be determined that models the compactor 1320 (process block 504). A failure log indicative of failing test responses is received (process block 602). For purposes of this example, assume that the failure log indicates that a failure occurred in compacted test response $P_2$. Using the transformation function Φ, path-tracing can be performed into each logic cone associated with a corresponding failing compacted test response (or, equivalently, from each failing pseudo-scan-cell) to determine the initial fault candidates for each observed failing response (process block 604). As can be verified from FIG. 13, the transformation function $\Phi_2$ of the compactor 1320 (assuming that none of the scan chains are masked) can be modeled as follows:

$$P_2=(1\oplus 4), \tag{9}$$

or more generally:

$$P_2=\Phi_2(\{1,4\}). \tag{10}$$

In the event that one or more of the scan chains is masked, equations (9) and (10) can be modified to account for the masking.

Figure 14:
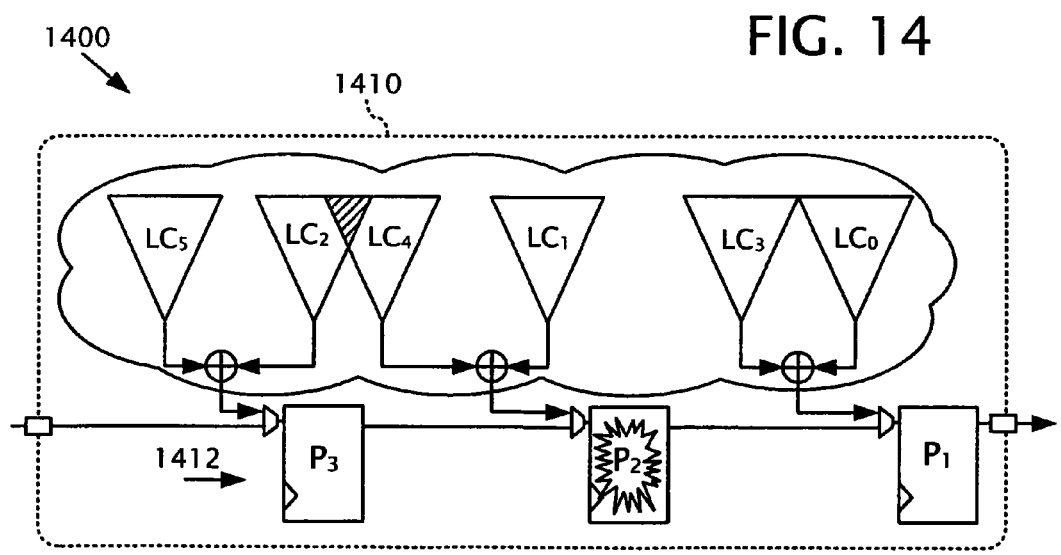
FIG. 14 is a schematic block diagram illustrating how an exemplary embodiment of the method shown in FIGS. 5 and 6 can be applied to the circuit-under-test and EDT compactor from FIG. 13.

FIG. 14 is a schematic diagram 1400 conceptually illustrating a transformed circuit 1410. The transformed circuit 1410 represents the circuit-under-test 1310 after it has been transformed using the transformation functions $\Phi_1$, $\Phi_2$, and $\Phi_3$. As can be seen in FIG. 14, the transformed circuit 1410 has one pseudo-scan-chain 1412 with three pseudo-scan-cells ($P_1$ through $P_3$). For illustrative purposes, the transformed circuit 1410 also shows that a portion of $LC_4$ intersects with $LC_2$ and could at least partially determine the value at pseudo-scan-cell $P_3$.

From the transformation function $\Phi_2$, it can be determined that the fault that led to the observed failure $P_2$ (or, equivalently, the value at pseudo-scan-cell $P_2$ in the transformed circuit 1410) must have come from the logic cone union $LC_1 \cup LC_4$. Thus, in this example, the list of initial fault candidates comprises the candidate faults in the union $LC_1 \cup LC_4$.

Simulations of the test patterns into the transformed circuit 1410 while simulating each fault candidate can be performed (process block 606). For each pattern simulated, the transformation function Φ is applied in order to get results that can be compared to the data collected in the failure log. For example, if the faults in the intersection between $LC_4$ and $LC_2$ create failing responses in both $P_2$ and $P_3$, then those fault candidates can be removed from the list. The remaining candidates can be ranked using, for example, criteria from any of the known effect-cause diagnostic methodologies (process block 608), thereby completing the exemplary diagnostic procedure 600.

Elementary-Tree Compactor

The elementary-tree compactor is described in Pouya B., et al., "Synthesis of Zero-Aliasing Elementary-Tree Space Compactors," *Proc. of IEEE VLSI Test Symposium*, pp. 70-77 (1998). The elementary-tree compactor is a nonlinear space compactor.

Figure 15:
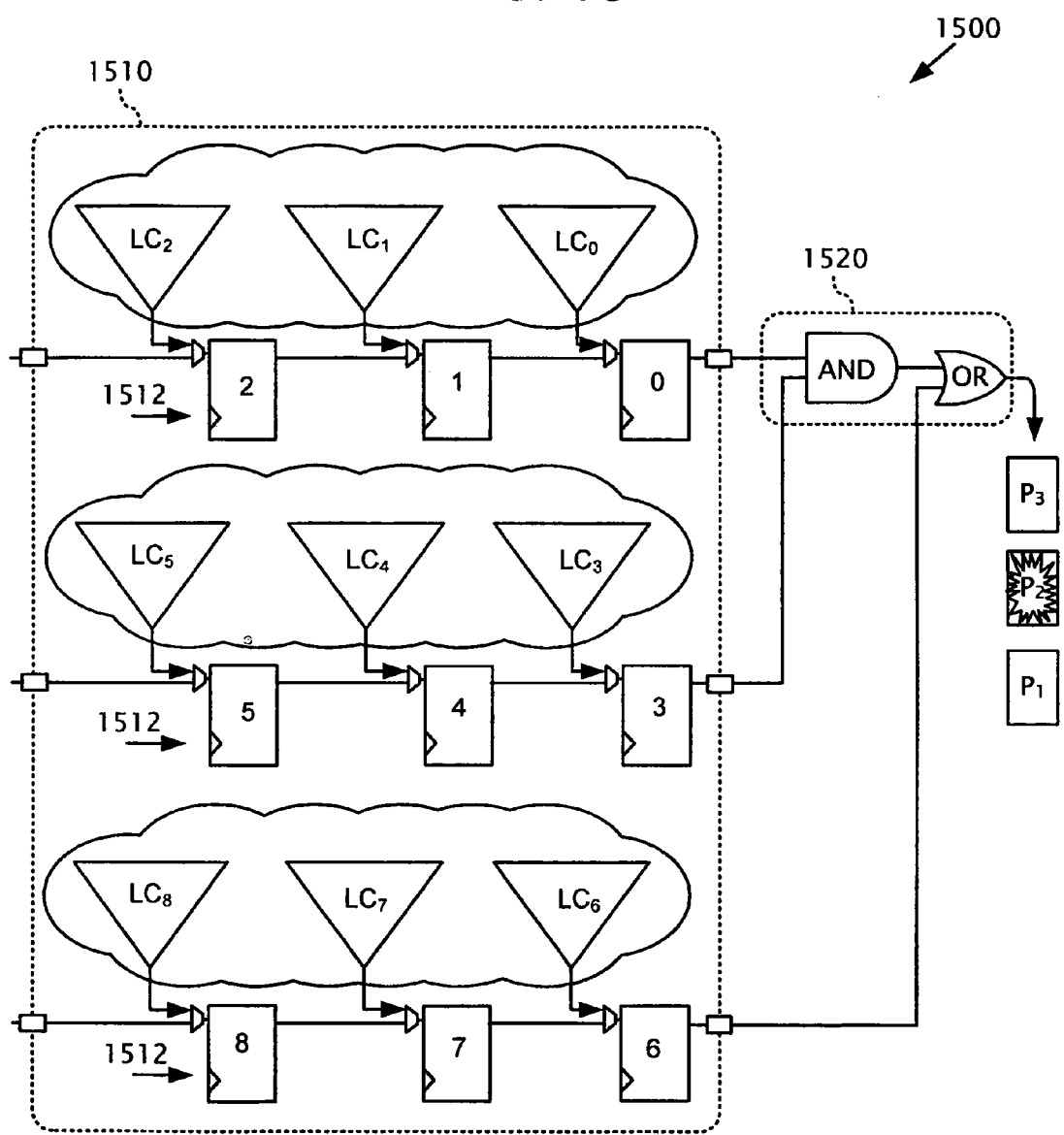
FIG. 15 is a schematic block diagram of an exemplary scan-based circuit-under-test coupled to an exemplary elementary-tree compactor.

FIG. 15 is a block diagram 1500 schematically showing an exemplary circuit-under-test 1510 having three scan chains 1512 coupled to an exemplary elementary-tree compactor 1520, which comprises an AND gate coupled to an OR gate. For the circuit-under-test 1510, the elementary-tree compactor 1520 produces three compacted test responses $P_1$ through $P_3$.

Using the diagnostic procedure described above with respect to FIGS. 5 and 6, a transformation function Φ can be determined that models the compactor 1520 (process block 504). A failure log indicative of failing test responses is received (process block 602). For purposes of this example, assume that the failure log indicates that a failure is found in compacted test response $P_2$. Using the transformation function Φ, path-tracing can be performed into each logic cone associated with a corresponding failing compacted test response (or, equivalently, from each failing pseudo-scan-cell) to determine the initial fault candidates for each observed failing response (process block 604). In the illustrated example, the transformation function $\Phi_2$ of the compactor 1520 can be modeled as follows:

$$P_2=(1\text{ AND }4)\text{ OR }7, \tag{11}$$

or, more generally:

$$P_2=\Phi_2(\{1,4,7\}). \tag{12}$$

Figure 16:
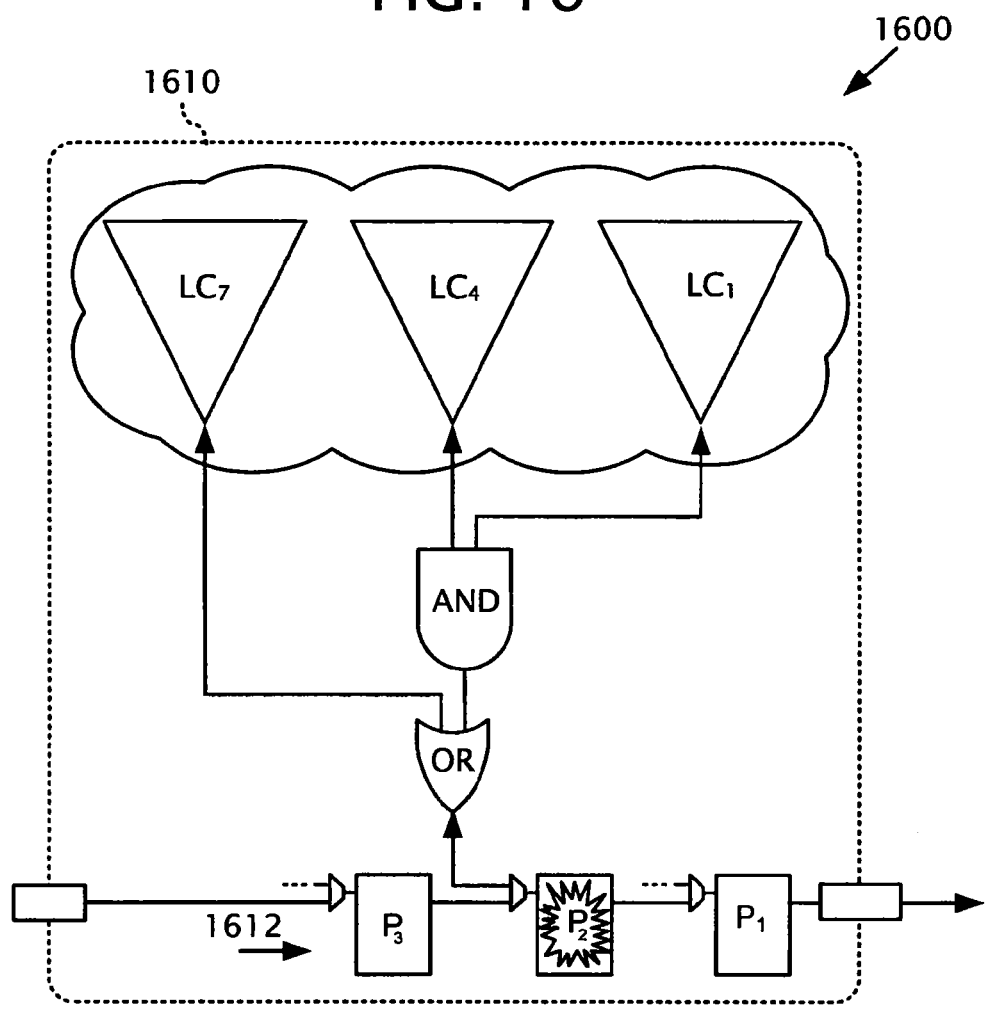
FIG. 16 is a schematic block diagram illustrating how an exemplary embodiment of the method shown in FIGS. 5 and 6 can be applied to the circuit-under-test and elementary-tree compactor from FIG. 15.

FIG. 16 is a schematic diagram 1600 showing a transformed circuit 1610. The transformed circuit 1610 represents the circuit-under-test 1510 after it has been transformed using the transformation function $\Phi_2$. As can be seen in FIG. 16, the transformed circuit 1610 has one pseudo-scan-chain 1612 with three pseudo-scan-cells ($P_1$ through $P_3$).

From the transformation function $\Phi_2$, it can be observed that the faults that led to the observed failure $P_2$ (or, equivalently, the value at pseudo-scan-cell $P_2$ in FIG. 16) must have come from the logic cone union $LC_1 \cup LC_4 \cup LC_7$. Thus, according to one exemplary implementation, the list of initial fault candidates comprises the candidate faults in the union $LC_1 \cup LC_4 \cup LC_7$.

Simulations of the test patterns into the transformed circuit 1610 while simulating each fault candidate can be performed (process block 606). For each pattern simulated, the transformation function Φ can be applied in order to get simulation results that can be compared to the data in the failure log. The remaining candidates can be ranked using, for example, criteria from any of the known effect-cause diagnostic methodologies (process block 608), thereby completing the exemplary diagnostic procedure 600.

Experimental Results

This section presents experimental results obtained by applying an exemplary embodiment of the diagnostic procedure discussed above. The experiments were performed by simulating industrial scan-based circuits having EDT compactors. Table 1 provides additional technical details for the industrial circuits tested (denoted as "Circuit 1" and "Circuit 2," respectively).

TABLE 1

Specifications of the Two Test Circuits

|  | # of Gates | # of Scan Cells | # of Channels/# of Scan Chains | Compression Ratio |
|---|---|---|---|---|
| Circuit 1 | 270 K | 18.6 K | 2/50 | 25X |
| Circuit 2 | 500 K | 41 K | 8/160 | 20X |

In Table 1, the column labeled "# of Scan Chains" indicates the number of internal scan chains, whereas the column labeled "# of Channels" indicates the number of output channels from the EDT compactor. For EDT compactors, the ratio of channels to chains generally determines the maximum possible compression ratio.

The experimental procedure utilized to generate these exemplary experimental results is outlined in Table 2:

TABLE 2

Experimental Procedure for Evaluating an Embodiment of the Disclosed Method in a Circuit-Under-Test Having an EDT Compactor 1. Create a set of sample faults consisting of 1000 randomly selected testable stuck-at faults
2. Generate a test set (using the complete fault set) in the compressed mode of the EDT compactor
3. Obtain a test set for bypass mode in the EDT compactor that is compatible with the compressed test set from Step 2
4. For each fault in the set of sample faults, perform the following in both compression and bypass modes:
   a. Inject one fault at a time, perform fault simulation with the test set from Step 2 for the compressed mode, and with the test set from Step 3 for bypass mode, and write the failures into a fail log
   b. Perform diagnosis using the fail log from Step a (while using appropriate test set for compressed and bypass mode)
   c. If the injected fault is in the suspect list reported in Step b:
      i. if diagnosis is effective, note the number of suspects listed;
      ii. if diagnosis is ineffective, note that the injected fault was not identified as a suspect.

As seen in Table 2, the first step in the experimental procedure was to randomly select 1000 sample faults (in this case, stuck-at faults). In the next step, a compressed test set was generated by targeting the full fault list. This test set was used to create a corresponding uncompressed test set for use when the EDT compactor is operated in bypass mode. (In bypass mode, direct access to the scan cells is provided by bypassing the on-chip compression hardware.) Each fault from the sample fault list was simulated by injecting the fault into a simulation of the circuit and the EDT compactor while operating the compactor in both compression mode and in bypass mode, thereby creating two failure logs: a compression-mode fail log and a bypass-mode fail log. For the particular experimental results presented below in FIGS. 17-20, two failure logs per circuit were considered: an unrestricted failure log (wherein all failing cycles that the fault simulation revealed were written to the failure log) and a 256-cycle failure log (wherein the failure log was restricted to no more than 256 failing cycles). The restricted 256-cycle failure log was analyzed because production-line ATE equipment often has memory limitations that restrict the number of fail log entries available (e.g., to 256 failing cycles). Each of the failure logs produced was then analyzed using respective diagnostic techniques. Specifically, the compression-mode failure log was analyzed using an embodiment of the direct diagnosis procedure outlined above with respect to FIG. 6, whereas the bypass-mode failure log was analyzed using the conventional bypass-mode diagnostic procedure for the EDT compactor. The results from each of the diagnostic procedures were then examined to determine whether the fault that was actually injected was listed as a suspect fault in the report and how many total fault suspects were reported for each observed error in the failure logs. According to this methodology, then, an ideal diagnostic report would identify one suspect fault for each sample fault.

Figure 17:
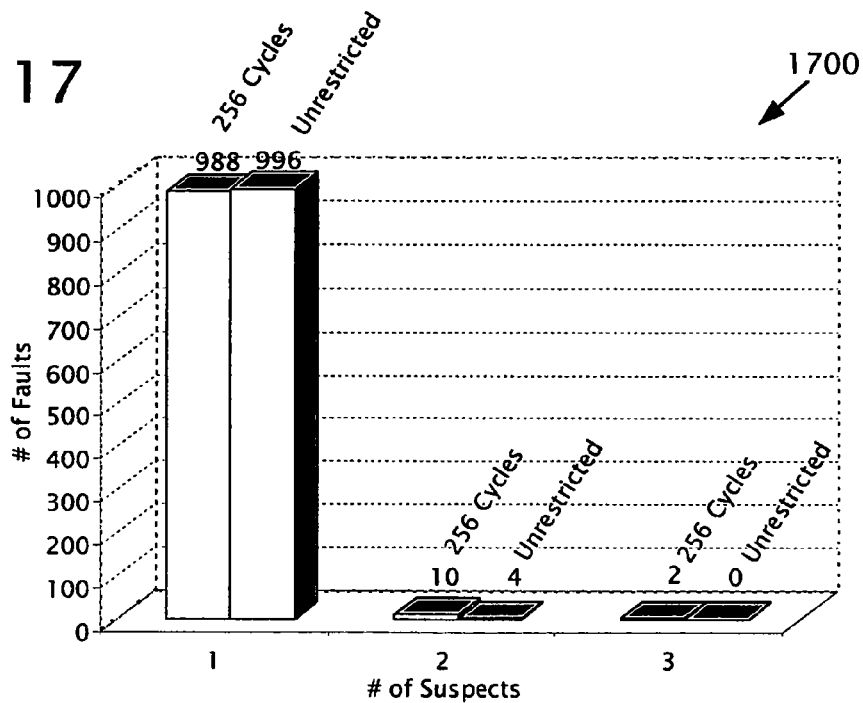
FIG. 17 is a graph showing experimental results from diagnosing failing test responses in a first circuit design having an EDT compactor, wherein a traditional fault diagnostic procedure was used and wherein the EDT compactor was operated in a bypass mode.
Figure 18:
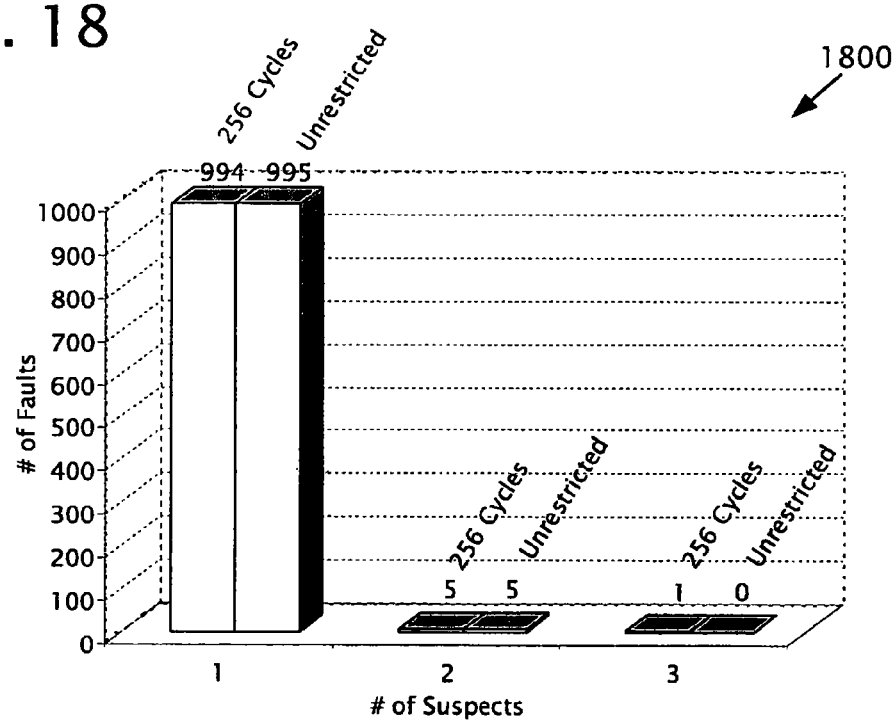
FIG. 18 is a graph showing experimental results from diagnosing failing test responses in the first circuit design having an EDT compactor, wherein an exemplary embodiment of the disclosed diagnostic procedure was used and wherein the EDT compactor was operated in a compression mode.

FIGS. 17-20 show the results of the experiments in graphical form. In particular, FIGS. 17 and 18 show graphs 1700 and 1800, respectively, which report the test results for Circuit 1. More precisely, FIG. 17 shows the results of diagnosing bypass-mode test response in Circuit 1 using the conventional bypass-diagnostic procedure, whereas FIG. 18 shows the results of diagnosing compression-mode test responses in Circuit 1 using the disclosed diagnostic embodiment. The X-axis in graph 1700 shows the number of suspects identified after diagnosis, whereas the Y-axis shows the number of sample faults for which the associated number of suspects were identified. As noted above, the tests were run using two failures logs: an unrestricted failure log and a failure log restricted to 256 cycles. With respect to FIGS. 17 and 18, it can be seen that for the unrestricted fail log, the bypass-mode diagnostic procedure reported one suspect for 996 faults, whereas the embodiment of the disclosed diagnostic procedure reported one suspect for 995 faults. When the failure log was restricted to 256 cycles, the embodiment of the disclosed diagnostic procedure reported a single suspect for 994 faults. By comparison, when the failure log was restricted to 256 cycles, the bypass-mode diagnostics reported a single suspect for 988 faults. This result is due to the failure log filling up faster in bypass mode than in the compressed mode.

Similar results are shown for Circuit 2 in FIGS. 19 and 20, which contain respective graphs 1900 and 2000. In fact, for Circuit 2, identical results were obtained for the conventional bypass-mode diagnostic methods and the embodiment of the disclosed procedure. Note that in FIGS. 19 and 20, the total number of faults reported add up to 996 instead of 1000 because four faults (which respectively produced 5, 12, 22, and 31 suspects) are not shown in these figures.

As can be seen from FIGS. 17-20, the diagnostic resolution for the embodiment of the disclosed diagnostic procedure used in these tests was virtually as good or better than the diagnostic resolution achieved using bypass-mode diagnostics. However, because the exemplary embodiment of the disclosed diagnostic procedure does not require a separate set of test patterns, it is much more efficient and requires less memory overhead in the tester than bypass-mode diagnostics.

Diagnosing Test Hardware

In this section, exemplary methods for diagnosing test hardware (such as scan chains and scan cells) using aspects of the above-disclosed technology are described. In general, integrated circuit manufacturing tests involve two distinct test phases. The first test phase is typically known as "chain test" or "chain testing." The purpose of chain testing is to determine whether the scan chains of a circuit-under-test work as expected. When compression techniques are used, chain testing desirably tests the decompressor and compactor logic in addition to the scan chains. If the chain test is passed, it is usually assumed that the scan chains (as well as the decompressor/compactor logic) will work and testing proceeds to the second test phase, which is termed "scan test" or "scan testing" for purposes of this disclosure. The purpose of scan testing is to determine whether there are any faults in the system logic. When a scan test fails, a failure analysis procedure, such as the exemplary procedure described above, can be performed (e.g., automatically performed) and the root cause of a failure determined.

As noted above, effective failure analysis can improve integrated circuit manufacturing in a variety of ways. For example, failure analysis can be used to learn about and improve the manufacturing yield whenever a new technology is introduced. For instance, failure analysis can help identify systemic manufacturing issues that impact yield. The results of diagnosis typically include a report identifying the suspect sites (sometimes referred to herein as "fault suspects" or "fault candidates"). The suspect sites of the integrated circuit can then be evaluated using devices such as scanning electron microscopes ("SEMs").

In general, there are two types of fault diagnosis. If the chain test fails, "chain diagnosis" is performed to locate which scan chain(s) and/or scan cell(s) have or likely have defects. If the chain test is passed but the scan test fails, "scan diagnosis" is performed to identify the suspect fault sites that best explain the failures. Typically, chain diagnosis involves application of both chain pattern and scan patterns, whereas scan diagnosis typically involves applying only scan patterns. A chain pattern can be characterized as a test pattern that is used to test the scan cells of a scan chain. A chain pattern is ordinarily applied by shifting the pattern into and out of the scan chains while the scan chain is continuously operated in scan mode (that is, the scan chains are not operated in a normal mode in which the circuit's response to the test pattern is captured in the scan cells of the scan chain). Thus, a chain pattern tests the scan cells and the paths and logic associated with the scan cells rather than the functional logic of the circuit-under-test. A scan pattern, by contrast, can be characterized as a test pattern that is used to test the operational logic of the circuit-under-test. In operation, a scan pattern is typically loaded into the scan chains during a shift phase. The circuit-under-test is then operated in a normal mode using the test patterns for input values. The circuit-under-test may be clocked for a designated period of time (e.g., one clock cycle) after which the circuit response to the test pattern (the "test response") is captured and stored in the scan chains. With the circuit again in scan mode, the test response is clocked out of the scan chains and into the compactor (if embedded compression hardware is used).

Conventional chain diagnosis techniques cannot typically be applied to testing environments that utilize compression techniques. This limitation is due to the fact that the data applied to integrated circuits having compression hardware and the responses captured from such integrated circuits undergo a transformation. Thus, what is observed on the ATE from the scan channel outputs is a compacted version of what is captured in the internal scan cells of the integrated circuit. Consequently, an automated fault diagnosis tool desirably uses a failure log corresponding to the compacted response stream and determines the fault suspects (or fault candidates) from the compacted responses (sometimes referred to as "compressed responses"). One possible technique that can be used to avoid using a compacted response stream is to completely bypass the on-chip compression hardware. Doing so provides direct access to the scan cells, and thus enables the application of standard ATPG based fault diagnosis. However, such an approach requires the production and application of two separate test sets: a compressed test set for volume production testing purposes and an uncompressed test set for fault diagnosis purposes. Furthermore, such an approach does not facilitate on-line diagnosis, which allows for faster diagnosis based on the volume production test results. Thus, it is desirable to have fault diagnosis techniques that are applicable directly to compressed test sets.

Chain Diagnosis in General

Chain diagnosis can be divided into two main classes. The first class is referred to as "hardware-based chain diagnosis" and the second class is referred to as "software-based chain diagnosis." Hardware-based chain diagnosis methods generally use some special scan chain design to facilitate the scan chain diagnosis process. For example, the output of each scan cell can be connected to another scan cell in another scan chain such that its value can be observed by the other scan chain during chain diagnosis, XOR gates can be inserted between scan cells to enhance chain diagnosis, special set/reset circuitry can be used to enhance chain diagnosis, and/or special circuitry can be used to flip and set/reset scan cells to identify defective cells. On the other hand, software-based chain diagnosis typically does not require any modification to the basic scan design. For this reason, software-based techniques are typically more attractive.

Embodiments of the disclosed technology are not dependent on any particular diagnosis hardware or software. Indeed, embodiments of the compactor-independent chain diagnosis methodology described below can be applied to any hardware-based or software-based technique.

Chain diagnosis typically includes two method acts: identifying faulty scan chains and fault types using chain patterns, and locating the faulty scan cells. Locating the faulty scan cells can involve the use of special scan circuitry (in hardware-based chain diagnosis) or the simulation of scan patterns (in software-based chain diagnosis).

The act of identifying faulty scan chains is illustrated by the chain test example shown below in Table 3. Referring to Table 3, suppose a scan chain is loaded with an exemplary chain pattern "001100110011," where the leftmost bit is loaded into the scan cell connected to the scan chain input (cell 11) and the rightmost bit is loaded into the scan cell connected to scan chain output (cell 0). The second column of Table 3 shows examples of faulty values that might be unloaded from the scan chain for each type of permanent fault listed in the first column. The third column shows examples of faulty values that might be unloaded from the scan chain for each type of intermittent fault listed in the first column. (Note that the "X"s in Table 3 will depend on the previous or the next chain pattern.) Thus, by evaluating the values unloaded from a scan chain loaded with a chain pattern, the existence and type of fault can be determined. This evaluation can be performed, for example, by analyzing the behavior of the unloaded values relative to one or more fault models or by using a fault dictionary.

TABLE 3

Various scan chain fault types revealed by exemplary chain flush patterns

| Fault Types | Unloaded Values-<br>Permanent Faults | Unloaded Values-<br>Intermittent Faults |
|---|---|---|
| Slow-to-Rise | 00100010001X | 00110010001X |
| Slow-to-Fall | 01110111011X | 01110011011X |
| Slow | 01100110011X | 00100111011X |
| Fast-to-Rise | X01110111011 | X01110110011 |
| Fast-to-Fall | X00100010001 | X00100110001 |
| Fast | X00110011001 | X00100111001 |
| Stuck-at-0 | 000000000000 | 001000010000 |
| Stuck-at-1 | 111111111111 | 101111111011 |
| Stuck-at-X | — | 100100111110 |

As noted above, the act of locating suspect scan cells differs depending on whether hardware-based chain diagnosis is being performed or software-based chain diagnosis. In hardware-based chain diagnosis, for example, a plurality of known values can be loaded into the faulty scan chain by special chain circuitry (e.g., via specialized set/reset circuitry). The defect scan cells can then be located during the unloading procedure. For example, suppose that it is determined that scan chain 1 has a stuck-at-0 fault, the location of which is unknown. The circuit can then be set to chain diagnosis mode, and all the scan cells on scan chain 1 set to "1" by using specialized scan chain circuitry. During the unloading procedure, the first cell that unloads a "0" is indicative of where the defective scan cell is.

By contrast, in software-based chain diagnosis, the location of the faulty scan cell within a scan chain can usually be determined by performing simulations with scan patterns. For example, when a faulty scan cell exists, the test pattern values output from the faulty scan cell and loaded into downstream scan cells during scan mode will be modified due to the fault. For instance, suppose a scan pattern has a good machine loading value of "001110011010" on a given scan chain. If a stuck-at-0 fault is assumed to exist at scan cell 3, the loading value will be modified to "001110010000." Similarly, after pulsing the capture clock, the captured values in the scan cells upstream of the faulty scan cell on this faulty scan chain will also be modified. For instance, if the simulated captured value is "101011101011," the unloading values will be modified to "000000000011" on account of the stuck-at-0 fault on scan cell 3. Simulation can proceed by simulating faults at different scan cells (e.g., each scan cell in the faulty scan chain) and generating different simulation results for each of the scan cells. The simulation results can be compared with the observed results from ATE and the best matching cell(s) reported as suspect(s).

Figure 23:
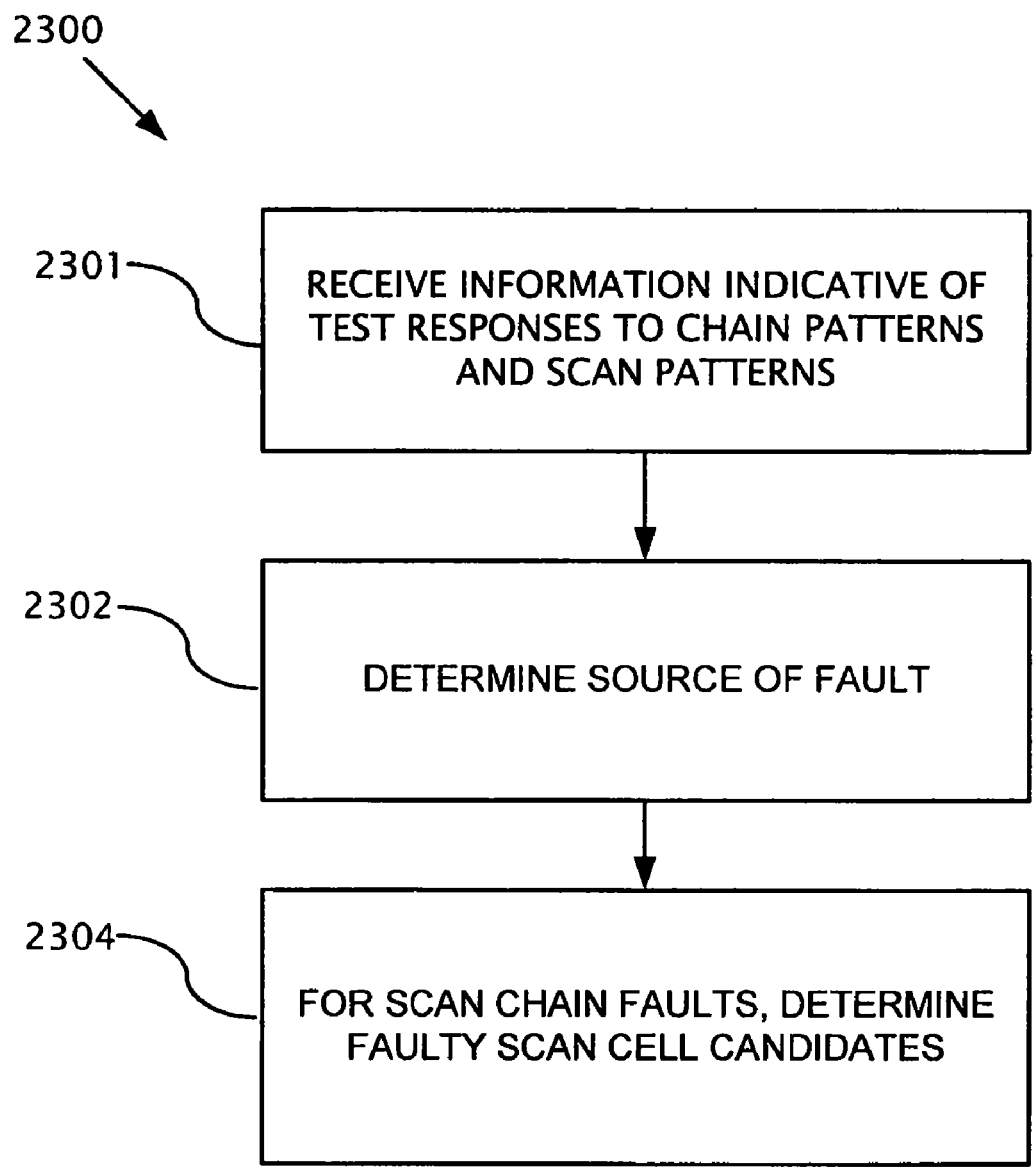
FIG. 23 is a flow chart illustrating an exemplary general procedure for diagnosing fault in testing hardware of a circuit-under-test.

Exemplary Embodiments of Performing Scan Chain Diagnosis in Compression Environments An exemplary method of diagnosing test hardware (such as scan chains, compressors, and decompressors) in a compression environment is illustrated in flowchart 2300 of FIG. 23. For example, in some embodiments, the information received can include information about passing test responses. The information can comprise, for instance, a complete record of a test session for one or more circuits-under-test (e.g., a record of all responses to the applied chain pattern and scan patterns).

In integrated circuits that do not use compression hardware, if a chain pattern fails, it is known that the defect must be on the scan chains. In the presence of embedded compression hardware, however, diagnosis becomes more complicated. For example, a failed chain pattern could be caused by defects in the decompressor, the scan chains, the compactor, or any combination thereof.

Accordingly, in one exemplary embodiment of the disclosed methodology and as illustrated in FIG. 23, the source of a fault is determined at process block 2302. In other embodiments, however, this procedure is skipped. In one exemplary embodiment, test responses to chain patterns are used to determine the source of a fault. In one particular implementation, the chain test set includes one or more bypass patterns. For purposes of this discussion, a bypass pattern is a test pattern that is applied and output from the CUT without going through the decompressor or compressor of the embedded compression hardware coupled to the CUT. If the one or more bypass patterns fail, then it is known that a defect exists in one or more of the scan chains. If the bypass patterns pass, but the non-bypass chain patterns fail, then it is known that the defect must be in the decompressor or compactor.

In another exemplary embodiment, and because the logic used for decompression and compaction is usually very small and because the number of chain patterns is typically not very large, a fault dictionary is used to determine whether a fault is in the decompressor or compactor. Fault dictionaries are not typically used to detect faults in scan chains because of the large number of scan cells that ordinarily exist in scan chains. An example of a fault dictionary for a decompressor and compactor is shown as in Table 4.

TABLE 4

An Example of a Fault Dictionary

| | Decompressor | | | Compactor | | |
|---|---|---|---|---|---|---|
| | $f_{d1}$ | $f_{d2}$ | ... | $f_{c1}$ | $f_{c2}$ | ... |
| Chain Pattern 1 | {1, {1, 2, 3}}, {2, {1}} | {2, {3, 4, 5, 6}} | ... | {1, {8, 9}} | {2, {8, 9}} | ... |
| Chain Pattern 2 | {1, {2, 3, 4, 5}}, {2, {2, 3, 4, 5}} | {2, {1, 2, 5, 6}} | ... | {1, {2, 3}}, | {2, {1}} | ... |
| ... | ... | ... | ... | ... | ... | ... |

At process block 2301, information indicative of test responses to chain test patterns and scan test patterns is received. For example, a failure log comprising entries indicative of failing test responses can be received. The failure log is typically created and initially stored on the tester, where it can then be transferred to another system for diagnosis or diagnosed directly by the tester. The information in the failure log can comprise, for example, a record of all the failing test responses or a portion of the failing test responses to at least some of the applied chain patterns and at least some of the applied scan patterns. When compression hardware is used, the failing test responses will ordinarily be compressed failing test responses. The information received at process block 2301 can take a variety of formats, however, and is not limited to failing test responses stored in a failure log. For Each column of Table 4 represents a fault (e.g., modeled as a stuck-at-1 or a stuck-at-0) in the decompressor ($f_{di}$) or in the compactor ($f_{ci}$). Each row represents a chain pattern. Each entry in the fault dictionary indicates which compactor channel output fails at which cycles for a specific chain pattern given a specific fault. In Table 4, for example, each entry uses the following format for identifying the failing compactor channel and output cycle: {Failure Channel, {Failure Cycle}}. Thus, the entry corresponding to $f_{d1}$ and chain pattern 1 (i.e., {1,{1,2,3}}, {2,{1}}) indicates that fault $f_{d1}$ causes faulty responses on compactor output channel 1 during output cycles 1, 2, and 3 and causes faulty responses on the compactor output channel 2 during output cycles 1 when chain pattern 1 is applied.

By using such a fault dictionary, one or more faults in the decompressor or compactor that explain a certain observed failure can be determined. In certain embodiments, if no entry in the fault dictionary matches the observed failures, it can be assumed that the one or more faults are in the scan chains. Because the decompressor and compactor usually connect to a large number of scan chains, a fault in the decompressor or compactor typically leads to a large number of observed failures distributed among many scan channels. By contrast, scan chain defects usually occur in only a small number of scan chains. Therefore, it is unlikely that a fault on the decompressor or compactor will be indistinguishable from one or more faults on the scan chains.

Returning to FIG. 23, if the source of the fault is determined to be in the scan chains, the one or more faulty scan cell candidates are determined at process block 2304. One exemplary method for performing scan chain diagnosis at process block 2304 of FIG. 23 is illustrated in flowchart 2400 of FIG. 24. The scan chain diagnosis procedure 2400 illustrated in FIG. 24 does not need to be performed in connection with the procedure of FIG. 23, however, and can instead performed independently.

Figure 24:
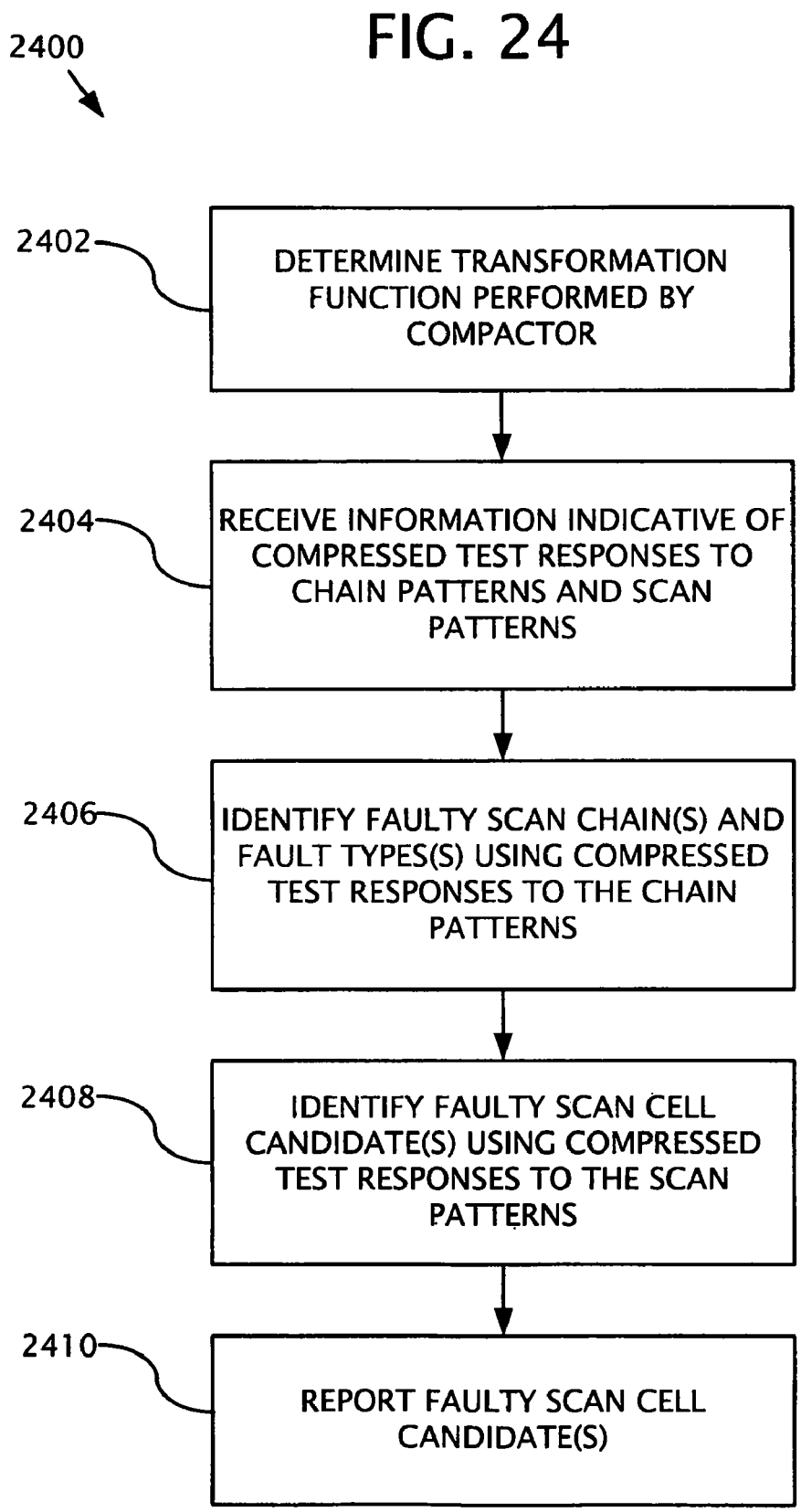
FIG. 24 is a flow chart of an exemplary embodiment of a general scan chain diagnostic procedure for diagnosing faulty scan chains from compacted test responses.

At process block 2402 of FIG. 24, at least a portion of the transformation function $\Phi$ performed by the compactor is determined. For example, the compactor can be modeled as the transformation operator $\Phi$ such that $\Phi(R)=r$, where R is a test response before compaction and r is the test response after compaction.

At process block 2404, information indicative of compressed test responses to chain test patterns and scan test patterns is received. For example, a failure log comprising entries indicative of compressed failing test responses can be received. The passing test responses can normally be deduced from the failing test responses. When compression hardware is used, the failing test responses will ordinarily be compressed failing test responses. Note that this procedure need not be performed if this information has already been received (e.g., at process block 2301 of FIG. 23).

At process block 2406, faulty scan chains and fault types are identified. For example, the faulty scan chains and fault types can be identified at least in part from one or more entries of the failure log corresponding to failing test responses to one or more of the chain test patterns applied. In some embodiments, the identification procedure uses passing test responses to help identify or confirm the fault type.

In certain embodiments, masking patterns are applied as part of the testing procedure. Examples of masking patterns are discussed in Rajski J., et al., "Embedded Deterministic Test for Low Cost Manufacturing Test," *Proc. ITC* 2002, pp. 301-310 (2002). In general, the application of a masking pattern involves masking scan chains connected to the compactor (e.g., using logic components configured to selectively mask the scan chains in response to one or more control signals) so that a single respective scan chain can be observed at a corresponding compactor channel output. In other words, a masking pattern is a pattern such that only one scan chain is observed from a corresponding compactor channel output while the other scan chains connected to the same channel output are masked. Because masking patterns effectively eliminate the contribution of scan chains other than the individual scan chains selected, the identification of faulty scan chains from the compressed test responses is straightforward.

Furthermore, when masking patterns are used, the identification of the fault type can be performed by evaluating the test response values in the one or more faulty chain pattern responses (as described above with respect to Table 3, for example). For instance, the values observed in a failing test response to a chain pattern can be compared to test values or test behaviors expected to be produced when a particular fault is present. In certain embodiments, a fault dictionary can be used to determine the fault type. One or more passing test responses can also be evaluated to confirm or help identify a possible fault type observed (e.g., the values observed in a passing test response may rule out a possible fault type identified by evaluating just faulty test responses).

If no masking patterns are used, one or more faulty scan chain candidates can be identified from the failures using the transformation operator $\Phi$ (conceptually, this procedure can be viewed as mapping failures from the pseudo-scan chains of the transformed circuit back to the internal scan chains). Similar to the exemplary procedures explained above with respect to FIGS. 5 and 8, the transformation operator can be incorporated into this process in a variety of ways. For example, a mathematical representation of the transformation function $\Phi$ can be applied to the compressed, failing test responses in order to identify the faulty scan chain candidates. Alternatively, a circuit description of the CUT can be modified to embed the compaction function in the circuit, thereby creating a modified circuit description with pseudo-scan cells. For instance, a tracing procedure using the modified circuit representation can then be applied to the failing, compressed test responses in order to identify the faulty scan chain candidates. Regardless of the particular procedure used, the single faulty scan chain can usually be identified.

If no masking patterns are used, the identification of the fault type can still be performed by evaluating the particular test response values in the failing test responses to the chain patterns (as described above with respect to Table 3, for example). For instance, the values observed in a failing test response can be compared to test values or test value behaviors expected to be produced when a particular fault is present. For non-masking patterns, the test values or test value behaviors expected when a fault is present will typically be more complex than those exemplified in Table 3. In certain embodiments, a fault dictionary can be used to determine the fault type. Further, one or more passing test responses can also be evaluated to confirm or help identify a possible fault type observed (e.g., the values observed in a passing test response may rule out a possible fault type identified by evaluating just faulty test responses).

At process block 2408 of FIG. 24, one or more suspect scan cells (or faulty scan cell candidates) in the one or more faulty scan chains are identified. For example, the faulty scan cell candidates can be identified at least in part from one or more entries of the failure log corresponding to failing responses to one or more of the scan test patterns applied. In some embodiments, the faulty scan cell candidates can be identified from a diagnostic procedure that uses one or more of the failing responses and, in some embodiments, one or more of the successful test responses.

In certain embodiments, a diagnosis algorithm (e.g., any conventional chain diagnosis algorithm) incorporating the transformed circuit can be used. In one exemplary embodiment, fault simulation adapted to incorporate the transformation function is used. For example, the transformation function performed by the compactor can be accounted for by applying a mathematical function representative of the compactor during the simulation (e.g., by applying the function $\Phi_i$ to captured scan cell values output from the circuit-under-test during a particular clock cycle i in order to compute the corresponding compacted test response values), but may alternatively be performed by simulating the logic components of the compactor (e.g., using a modified circuit description during simulation that embeds the compaction function).

During simulation, possible faulty scan cell candidates are simulated during application of one or more test patterns (e.g., failing test patterns or a combination of failing and passing test patterns).

By comparing the simulation results with the compressed failure data collected from the tester, the best matching scan cell(s) can be identified as the suspect scan cells. In some implementations, a weighted criteria is used to evaluate how well a scan cell candidate explains a corresponding failing pattern.

At process block 2410, the faulty scan cell candidates (sometimes referred to as the "suspect scan cells") are reported. For example, a list of the most likely faulty scan cell candidates can be produced and stored on one or more computer-readable media or displayed to a user. Additional diagnostics can then be performed using the suspect cells reported (e.g., physical inspection of the scan cell) or, in some cases, one or more manufacturing or design parameters can be adjusted. For instance, the circuit design might be modified in order to correct a recurring scan chain defect.

In general, the exemplary diagnostic technique illustrated in FIG. 24 is applicable to a variety of embedded compression techniques and can be incorporated into a variety of scan chain diagnostic procedures. Moreover, the disclosed diagnostic techniques can be used as part of an on-line diagnosis flow, which typically outperforms off-line diagnosis (e.g., diagnosis using a bypass mode) in terms of efficiency and cost. Moreover, exemplary embodiments of the disclosed chain diagnosis procedures can achieve better diagnostic resolution with fewer collected failure cycles than alternative procedures.

Exemplary Applications of the Chain Diagnosis Methodology

In order to illustrate various features and aspects of the disclosed technology, the application of an exemplary compactor-independent chain diagnostic procedure is described below as being applied to a variety of known compactors. Specifically, an exemplary embodiment of the disclosed procedure is described as it applies to: (1) an EDT compactor; and (2) an X-compactor.

EDT Compactor

The EDT Compactor is a linear space compactor. See Rajski, J., et al., "Embedded Deterministic Test for Low Cost Manufacturing Test," *Proc. ITC* 2002, pp. 301-310 (2002). Generally speaking, an EDT Compactor is an XOR tree (or XNOR tree) with scan chain masking circuitry capable of selecting one chain per channel to observe.

Figure 25:
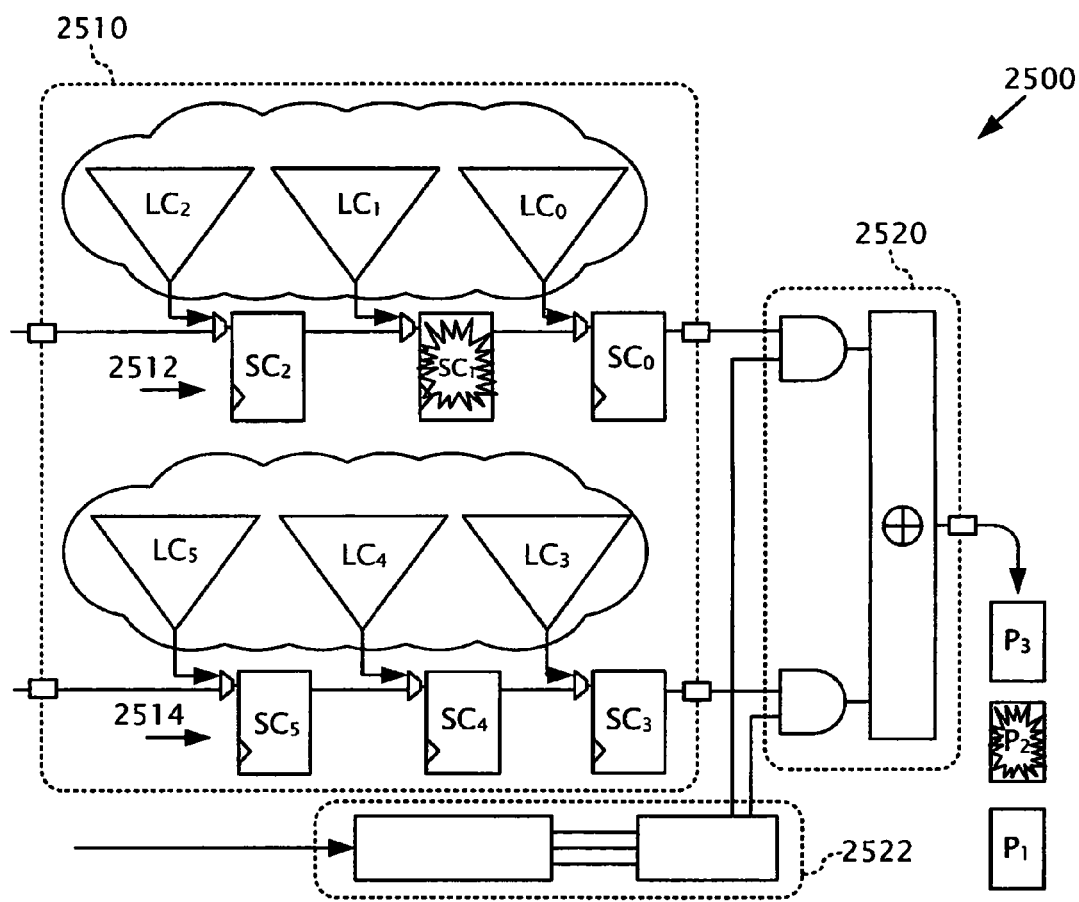
FIG. 25 is a schematic block diagram illustrating how an exemplary embodiment of the method shown in FIG. 24 can be applied to a circuit-under-test coupled to an exemplary EDT compactor.

FIG. 25 is a block diagram 2500 schematically showing an exemplary circuit-under-test 2510 having a first scan chain 2512 and a second scan chain 2514 coupled to an exemplary EDT compactor 2520, which comprises an XOR gate (bypass circuitry 2522 can be used to selectively mask one of the scan chains or all-but-one of the scan chains). For the circuit-under-test 2510, the EDT compactor 2520 produces three compacted test responses $P_1$ through $P_3$. For purposes of this example, assume that a stuck-at-0 fault exists at cell $SC_1$ of the first scan chain 2512 and causes a faulty test response $P_2$. Assume for purposes of this example that it has already been determined that the faulty test response behavior is caused by a scan chain defect rather than a defect in the decompressor of compactor (e.g., by using a fault dictionary, such as the one exemplified in Table 4).

Using the diagnostic procedure described above with respect to FIG. 24, a transformation function $\Phi$ can be determined that models the compactor 2520 (process block 2402). For example, the circuit can be represented as a transformed circuit with an embedded compactor function and a pseudo scan chain. Assuming that none of the scan chains are masked, the transformation function $\Phi$ of the compactor 2520 can be modeled as follows:

$$P_1 = (0 \oplus 3),$$

$$P_2 = (1 \oplus 4),$$

$$P_3 = (2 \oplus 5), \quad (13)$$

Because the compactor 2520 performs an XOR operation, the compactor 2520 can also be represented as a matrix $\Phi$ that is multiplied with a matrix R according to the general equation $\Phi(R) = r$ using modulo-2 arithmetic. For example, as can be verified from FIG. 25, the transformation function $\Phi$ can be modeled as $\Phi = [1\ 1]$ if no scan chain is masked, $\Phi = [0\ 1]$ if the first scan chain is masked, and $\Phi = [1\ 0]$ if the second scan chain is masked. Thus, for example, the general equation for a nonmasking pattern in the exemplary circuit of block diagram 2500 can be written as:

$$[1\ 1] \times \begin{bmatrix} SC_2 & SC_1 & SC_0 \\ SC_5 & SC_4 & SC_3 \end{bmatrix} = [P_3\ P_2\ P_1] \quad (14)$$

Note that in this example, the transformation function $\Phi$ is pattern dependent and will vary depending on whether the pattern is a masking chain test pattern (comprising control signals for masking one of the scan chains via bypass circuitry 2522) or a regular chain test pattern.

A failure log indicative of failing test responses is received (process block 2404) and the scan chains and fault types are identified from the failing chain patterns (process block 2406). For instance, in an EDT chain test set, each internal chain can be observed uniquely from one channel output upon application of a masking chain pattern. By using masking chain patterns, the faulty scan chain can be identified in a straightforward manner and the chain fault modeled. For example, assume that chain pattern 1 is a masking pattern to observe chain 1, chain pattern 2 is a masking pattern to observe chain 2, and chain pattern 3 is a non-masking pattern. Also suppose that the patterns have loading values and expected and observed values on the illustrated compactor channel output as shown in Table 5.

TABLE 5

An Example of EDT Chain Patterns

| | | | Compactor Output | |
|---|---|---|---|---|
| | Chain 1 Load | Chain 2 Load | Expected | Observed |
| Pattern 1 | 101 | 001 | 101 | 000 |
| Pattern 2 | 110 | 100 | 100 | 100 |
| Pattern 3 | 001 | 111 | 110 | 111 |

For this example, chain patterns 1 and 3 fail because their observed values do not match the expected value. Moreover, because chain pattern 1 is a masking pattern design to observe chain 1 and because chain pattern 1 failed, chain 1 can be identified as the faulty chain. Further, based on the observed behavior of the failing values, the fault can be identified as a stuck-at-0 fault on chain 1.

To narrow down the defect location on chain 1 and identify the failing scan cell (process block 2408), fault simulation can be performed using the transformed circuit. Fault simulation can incorporate the transformation function $\Phi$ in a variety of ways. For example, the transformation function $\Phi$ can be accounted for by either modifying the simulation to account for the function (e.g., by applying a mathematical representation of the compaction function to the simulated uncompacted test responses) or by modifying the circuit description of the CUT to embed the compaction function.

According to one exemplary embodiment, fault simulation is performed using one or more of the failing test responses and one or more of the passing test responses to the scan patterns. For example, according to one exemplary embodiment, one possible faulty scan cell candidate is injected at a time and simulation results for failing and passing test patterns are compared with the data observed from the tester. Based on this comparison, the one or more scan cell candidates that are most likely to be the failing scan cell(s) can be identified. For example, this identification can be based on the number of times the candidate matches the observed response during simulation. Other simulation techniques, including those described above using weighted values, can also be used. The results can then be reported (process block 2410) and chain diagnosis completed.

X-Compactor

Figure 26:
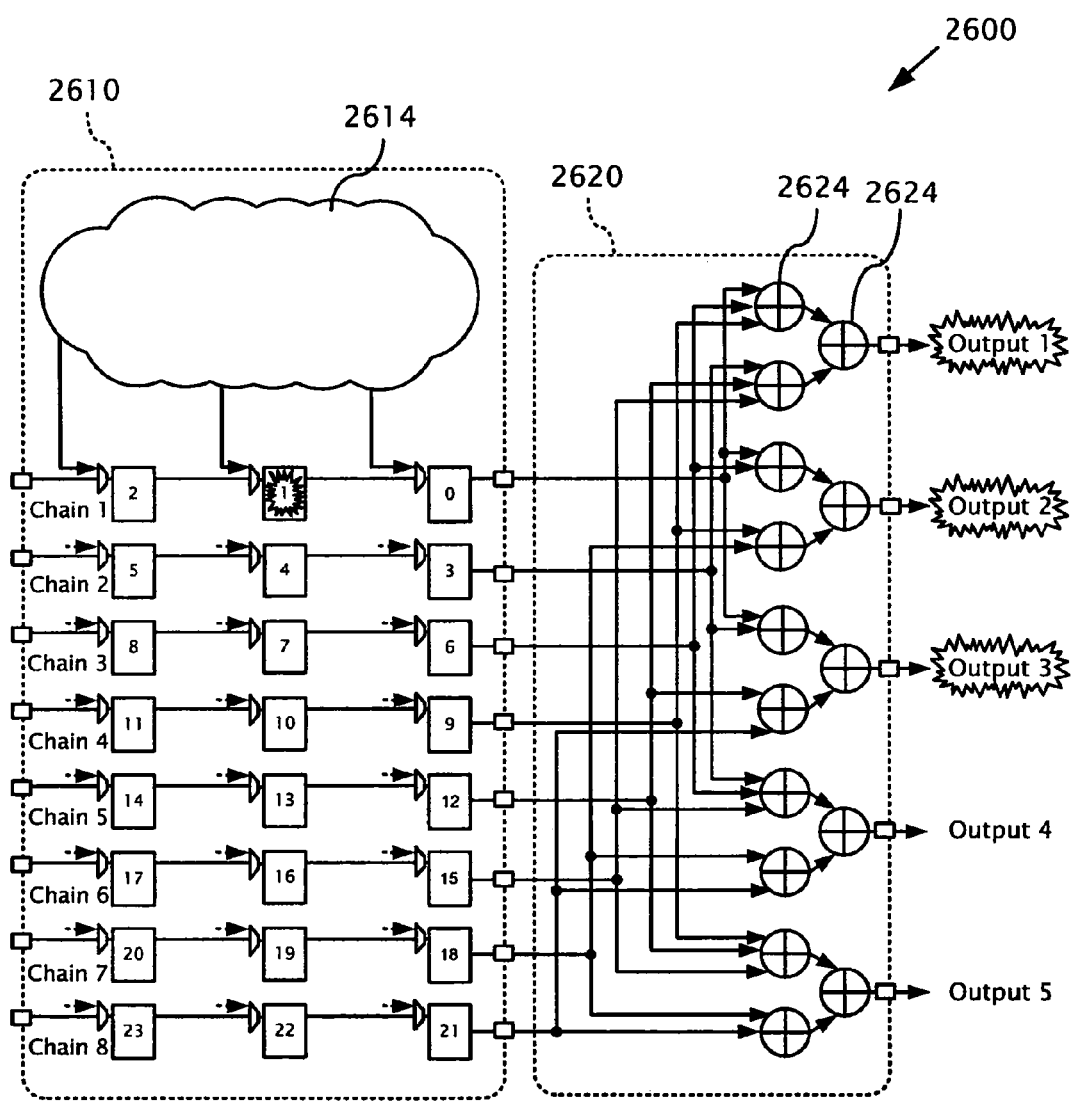
FIG. 26 is a schematic block diagram illustrating how an exemplary embodiment of the method shown in FIG. 24 can be applied to a circuit-under-test coupled to an exemplary X-compactor.

The X-compactor is also a linear space compactor. See Mitra, S., et al., "X-Compact An Efficient Response Compaction Technique for Test Cost Reduction," *Proc. ITC* 2002, pp. 311-320 (2002). FIG. 26 is a block diagram 2600 schematically showing an exemplary circuit-under-test 2610 having eight scan chains coupled to an exemplary X-compactor 2620. The circuit-under-test has eight scan chains 2612 (labeled "Chain 1" through "Chain 8") fed by logic 2616 that output into the X-compactor 2620, which compacts the data from the scan chains into five compactor outputs (labeled "Output 1" through "Output 5") through an XOR tree comprising XOR gates, such as the two indicated at 2624 in FIG. 26. As shown in FIG. 26, each scan-chain output branches into three XOR gates of the tree in the compactor 2620. For purposes of this example, and as shown in FIG. 26, assume that a stuck-at-0 fault is at cell 1 on chain 1. Also assume for purposes of this example that it has already been determined that the faulty test response behavior is caused by a scan chain defect rather than a defect in the decompressor of compactor (e.g., by using a fault dictionary, such as the one exemplified in Table 4).

Using the diagnostic procedure described above with respect to FIG. 24, a transformation function $\Phi$ can be determined that models the compactor 2620 (process block 2402). For example, the circuit can be represented as a transformed circuit with an embedded compactor function and five pseudo scan chains. The compactor 2620 can be represented, for instance, as a matrix $\Phi$ multiplied by a matrix R using bitwise modulo-2 arithmetic according to the general equation $\Phi(R)=r$. For example, as can be verified from FIG. 25, the transformation function $\Phi$ can be modeled as a matrix as follows:

$$\Phi = \begin{bmatrix} 1 & 1 & 1 & 1 & 1 & 1 & 0 & 0 \\ 1 & 0 & 1 & 1 & 0 & 0 & 1 & 0 \\ 1 & 1 & 0 & 0 & 1 & 0 & 0 & 1 \\ 0 & 1 & 1 & 0 & 0 & 1 & 1 & 1 \\ 0 & 0 & 0 & 1 & 1 & 1 & 1 & 1 \end{bmatrix}, \quad (15)$$

A failure log indicative of failing test responses is received (process block 2404) and the scan chains and fault types are identified from the failing chain patterns (process block 2406). The transformation function $\Phi$ can be incorporated into this procedure. For example, the transformation function $\Phi$ can be accounted for by either modifying the diagnostic procedure to account for the function or by modifying the circuit description of the CUT. Because there is no masking logic or masking chain test patterns for the X-compactor, the chain test results are mapped from the pseudo scan chains back to internal scan chains. The mapping can be easily performed for a single scan chain failure. For instance, as can be verified from the transformation function $\Phi$ and FIG. 26, if the failures are only observed on compactor outputs 1, 2, and 3 (corresponding to pseudo scan chains $PS_1$, $PS_2$, $PS_3$), then chain 1 must be the defective scan chain if a single failure is assumed. Accordingly, for a single faulty scan chain, the failing scan chain can be identified based on three failed pseudo scan chains.

To narrow down the defect location on chain 1 and identify the failing scan cell (process block 2408), fault simulation can be performed using the transformed circuit. Fault simulation can incorporate the transformation function $\Phi$ in a variety of ways. For example, the transformation function $\Phi$ can be accounted for by either modifying the simulation to account for the function (e.g., by applying a mathematical representation of the compaction function to the simulated uncompacted test responses) or by modifying the circuit description of the CUT to embed the compaction function. As above, and according to one exemplary embodiment, one possible faulty scan cell candidate is injected at a time and simulation results for one or more failing test patterns or for a combination of failing test patterns and passing test patterns are compared with the data observed from the tester. Based on this comparison, the one or more scan cell candidates that are most likely to be the failing scan cell(s) can be identified. For example, this identification can be based on the number of times the candidate matches the observed response during simulation. Other simulation techniques, including those described above using weighted values, can also be used. The results can then be reported (process block 2410) and chain diagnosis completed.

Diagnosability Prediction

In this section, exemplary methods for generating, modifying, or selecting test patterns to have desirable diagnostic characteristics are described. The disclosed methods can be used in connection with any of the above-described diagnostic procedures that account for the transformation function performed by the compactor during diagnostics. The technique described in the following paragraphs, for example, can be used during fault simulation at process block 2408 of FIG. 24 in order to narrow the list of possible faulty scan cell candidates.

Figure 27A:
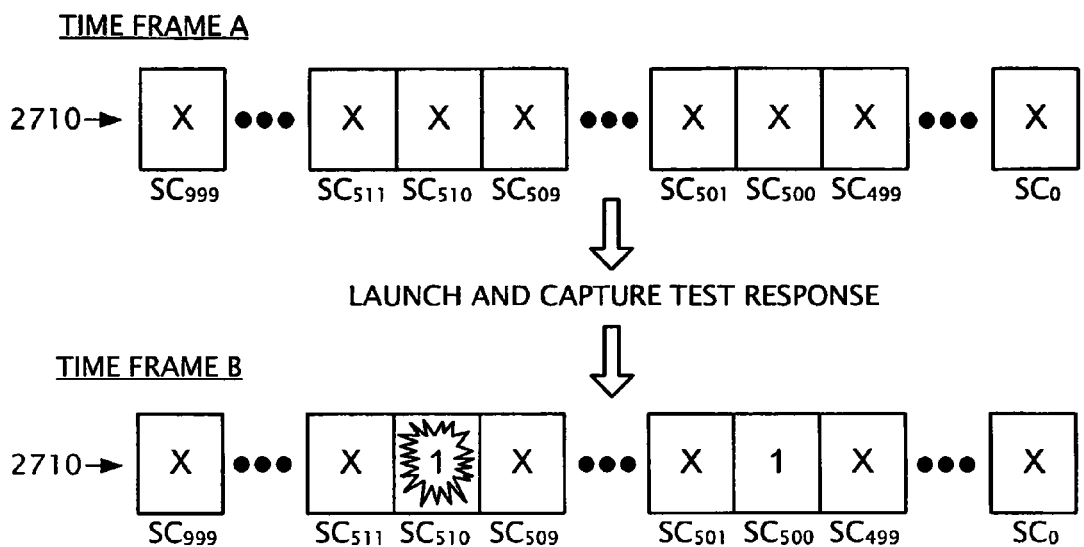
FIGS. 27A and B are schematic block diagrams showing one exemplary procedure for narrowing the list of faulty scan cell candidates during fault simulation at process block 2408 of FIG. 24.

Suppose that it is known that a fault exists on a given scan chain, but the exact location of the fault is unknown. FIG. 27A is a schematic block diagram 2700 illustrating such a scan chain. In particular, suppose that scan chain 2710 is known to be a faulty scan chain (e.g., after identifying the scan chain using test responses to chain patterns). During a first set of simulations, one or more scan patterns to be simulated in the fault simulator can be modified such that it its loading values into at least some of the scan cells in the failing scan chain are set to a particular state due to the lost controllability on the defective chain. For example, in one desirable embodiment, all of the scan cells in the failing scan chain are set to a particular state during the first set of simulations. Thus, in this embodiment, the first set of simulations assumes that the defect(s) could be anywhere along the faulty scan chain. The resulting pattern is referred to herein as a "full-masked pattern," and is illustrated at "time frame A" of FIG. 27A. See, e.g., Guo, R., et al., "A Technique for Fault Diagnosis of Defects in Scan Chain," *Proc. ITC* 2001, pp. 268-277 (2001).

The state to which the scan cells are set can be an unknown state (an "X" state) or, in some cases, a fixed state (either a "1" or "0") depending on the fault type identified for the faulty scan chain. If the fault type is a stuck-at-0, for instance, the value loaded can be an "X" state or a "0." For purposes of the examples shown in FIGS. 27A and 27B, the scan chain 2710 is loaded with unknown states ("X" states), which can be used for fault types that do not result in a permanent stuck-at state.

After simulating the launching of the one or more patterns into the circuit logic and the pulsing of the capture clock, the patterns will likely be found to capture some known values ("0" or "1") back to the faulty scan chain 2710 as exemplified at "time frame B" of FIG. 27A. The known values can be used to partition the faulty scan chain into segments. Specifically, by evaluating the observed values at the compactor outputs, it can be determined which segment of the faulty scan chain the fault falls in. For instance, assuming that the faulty scan chain 2710 comprises cells $SC_0$ to $SC_{999}$ and that the fault is a stuck-at-0 chain fault, if the full-masked pattern captures "1"s at cells $SC_{500}$ and $SC_{510}$ of the faulty scan chain 2710 after the capture cycle and if a comparison of the simulated compressed test response with the observed compressed test response indicates that a failure occurred at cell $SC_{510}$ but not at cell $SC_{500}$, then the fault can be deduced to be within the range of cells $SC_{510}$ to $SC_{501}$. In this way, the one or more modified test patterns in the first set of simulations can be used to determine a first range of scan cells within which the faulty scan cell exists. For instance, the narrowest range of scan cells determined from the simulations can be identified as the first range. In general, the more known values captured in the faulty scan chain upon application of a full- or partially-masked pattern, the more helpful information can be obtained for chain diagnosis. See, e.g., Huang, Y., et al., "Statistical Diagnosis for Intermittent Scan Chain Hold-Time Fault," Proc. ITC 2003, pp. 319-328 (2003).

Figure 27B:
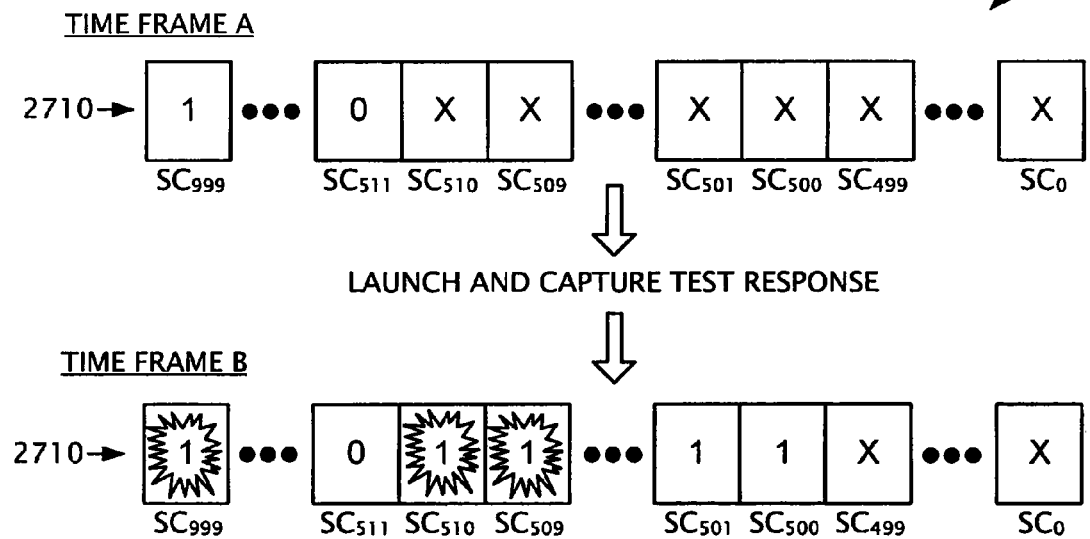

Using the previous example and referring now to schematic block diagram 2702 of FIG. 27B, a second set of simulations can be performed to further narrow the range of possible faulty scan cell candidates. FIG. 27B, for example, illustrates a second simulation performed after the simulation illustrated in FIG. 27A and after it is known that the fault is in a scan cell in front of or before cell $SC_{510}$ (that is, a scan cell that is loaded with a value that passes through $SC_{510}$ when the test pattern is shifted into the scan chain). The second set of simulations can use the same test patterns as the first set or can be performed using different test patterns. Moreover, the first and second sets of simulations can each comprise simulations of just one test pattern.

In FIG. 27B, for example, the same test pattern used in FIG. 27A is modified and applied during the second simulation. During the subsequent simulation, the pattern's loading values on the faulty scan chain 2710 can be set to "X" for some or all of cells $SC_{510}$ to $SC_0$ during fault simulation. In one desirable embodiment, for instance, all of the scan cells in front of the last scan cell in the range are loaded with unknown (or fixed) values. Scan cells of the faulty scan chain 2710 that are located in back of or after $SC_{510}$ (that is, scan cells that are not loaded with a value that passes through $SC_{510}$ when the test pattern is shifted into the scan chain) can be set to their regular test pattern values for some or all of cells $SC_{511}$ to $SC_{999}$. In one desirable embodiment, for instance, all of the scan cells behind the last scan cell in the range are loaded with their regular, unmodified values. An example of this procedure is illustrated in "time frame A" of FIG. 27B. In this way, the chances of additional known values being captured upon application of the modified test pattern are increased. Consequently, additional information indicative of the faulty cell's location can be obtained after the capture cycle. For example, as illustrated in "time frame B" of FIG. 27B, after the subsequent pattern is applied and the response captured, known values are captured at cells $SC_{501}$ and $SC_{509}$, but only the value at cell $SC_{501}$ matches the observed compressed test response. Thus, it can be deduced that the faulty scan cell must be within a second, narrower range of cells $SC_{509}$ to $SC_{502}$.

According to one embodiment, this procedure is iteratively performed for one or more test patterns until no more known values are captured or until a desired number of scan cell candidates are determined (e.g., one, two, or more). In embedded compression hardware environments, these techniques are still applicable as long as the cycle that captured a known value is not masked by an unknown ("X") value on another chain that connects to the same channel output and that outputs during the same test cycle.

The following terminology can be used to describe aspects of the exemplary techniques described above. A scan cell can be described as "full-0-covered" by a pattern set if there exists at least one pattern in a given pattern set such that its full-masked version captures a "0" at this cell and this cycle is not masked by an "X" during compaction. A scan cell can be described as "full-1-covered" by a pattern set, if there exists at least one pattern in the pattern set such that its full-masked version captures a "1" at this cell and this cycle is not masked by an "X" during compaction. A scan cell can be described as "full-covered" by a pattern set, if it is "full-0-covered" and "full-1-covered." Similarly, a scan cell can be described as "partial-0-covered" by a pattern set if there exists at least one pattern in this pattern set such that at least one of its partial-masked versions captures a "0" at this cell and this cycle is not masked by an "X" during compaction. A scan cell can be described as "partial-1-covered" by a pattern set if there exists at least one pattern in the pattern set such that at least one of its partial-masked versions captures a "1" at this cell and this cycle is not masked by an "X" during compaction. A scan cell can thus be described as "partial-covered" by a pattern set, if it is "partial-0-covered" and "partial-1-covered".

Given a pattern set, a score $S_i$ can be assigned to a scan cell i. For example, the score can be determined using the exemplary formula shown in Table 6 below:

TABLE 6

Exemplary Procedure for Assigning Scan Cell Score

If (scan cell i is full-covered) $S_i = 1.0$;
else if (scan cell i is full-0-covered or full-1-covered
or partial-covered) $S_i = 0.5$;
else if (scan cell i is partial-0-covered or partial-1-covered) $S_i = 0.25$;
else $S_i = 0$;

It should be understood that the particular values shown in Table 6 are for illustrative purposes only and can vary from implementation to implementation. For example, the scores assigned to the various coverages may have different weights and are not necessarily grouped together as shown in Table 6.

A term Diag_Coverage (or DC) can be defined using the scores ($S_i$) to measure the chain diagnosability for a given pattern set. For example, and unless otherwise stated, $DC = \Sigma_{(i \in all\ cells)}(S_i)/(\#\ total\ scan\ cells)$. The term DC thus indicates the average percentage of scan cells that still maintain observability without controllability for a given scan pattern set. In general, a higher DC value means that the chance of accurate chain diagnosis with good resolution is generally high for any chain fault. For example, an ideal case is when DC is equal to 1, which means that all scan cells can be observed by at least one pattern even though it cannot be controlled due to a chain defect. Using such a pattern set, one can pinpoint which scan cell has a defect regardless of the defect location and its fault model.

Experimental Results

Three sets of experiments were performed using implementations of the disclosed technology on EDT hardware designs. The purpose of the first set of experiments was to compare the general chain diagnosability with and without EDT. The purpose of the second set of experiments was to investigate the diagnostic accuracy, resolution, and performance of an exemplary on-line chain-diagnosis procedure. The purpose of the third set of experiments was to investigate how the diagnostic resolution varied with the number of collected failure patterns.

The experiments were performed using one small circuit ("Ckt1") and one large industrial circuit ("Ckt2"). Information about these two circuits is given in Table 7. Specifically, Table 7 indicates the number of gates, scan cells, and scan chains for the two experimental circuits. Using EDT compression hardware, the compaction ratios were set to 2X, 4X, 8X, 16X, 32X, and 64X. For a compaction ratio N, each original scan chain was broken into N scan chains in a balanced manner such that the length of each internal scan chain was close to 1/N of the original scan chain length. A connection was made every N scan chains to one scan channel output through the EDT compactor. Consequently, there were 2 scan channels for Ckt1 and 14 scan channels for Ckt2 no matter which N was selected. For chain testing, the number of failure cycles per pattern was typically proportional to the faulty scan chain length. To make a fair comparison of the diagnosis results, a similar number of failure cycles were collected regardless of which compaction ratio N was selected. Thus, for an NX compaction scheme, the number of failing patterns used for chain diagnosis was about N times the patterns for the situation without EDT. For example, suppose a stuck-at-1 fault was injected at one scan cell in Ckt1. Without EDT, 5 scan patterns were applied on Ckt1 with 2 scan chains and about 500 failure cycles were collected. If N was set to 16, Ckt1 had 32 internal scan chains with 2 EDT compactor channels, and 80 scan patterns were applied so that about 500 failure cycles could be collected.

TABLE 7

Circuit Information

|  | Circuit 1 | Circuit 2 |
| --- | --- | --- |
| # of Gates | 9.4K | 6.5 M |
| # of Scan Cells | 495 | 529826 |
| # of Scan Chains | 2 | 14 |

Diagnosibility Prediction

Figure 28:
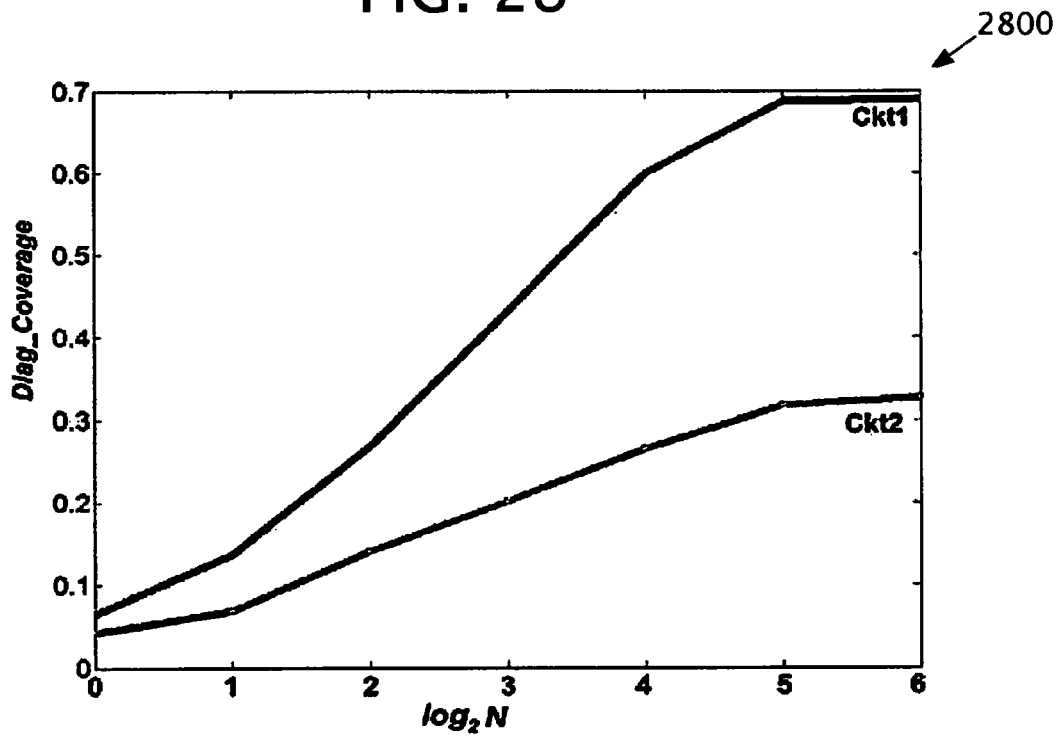
FIG. 28 is a graph comparing a measure of diagnostic coverage in two exemplary test circuits for various exemplary compaction ratios achieved by EDT hardware implemented on the exemplary test circuits.

In the first set of experiments, DC was calculated for a set of scan patterns obtained by regular ATPG. The experimental results for Ckt1 and Ckt2 are shown in Table 8 and plotted in FIG. 28. In particular, FIG. 28 comprises a graph 2800 on which $\log_2 N$, where N is the compaction ratio, is plotted on the X-axis and the value of DC, as determined by the formula above, is plotted on the Y-axis.

TABLE 8

Diagnosability Prediction

| Comp. Ratio | Ckt1 | | Ckt2 | |
| --- | --- | --- | --- | --- |
| | # Pattern | Diag_Cov | # Pattern | Diag_Cov |
| N = 1 | 5 | 0.0646 | 8 | 0.0421 |
| N = 2 | 10 | 0.1374 | 16 | 0.0687 |
| N = 4 | 20 | 0.2687 | 32 | 0.1416 |
| N = 8 | 40 | 0.4323 | 64 | 0.2014 |
| N = 16 | 80 | 0.60 | 128 | 0.2662 |
| N = 32 | 160 | 0.6869 | 256 | 0.3172 |
| N = 64 | 320 | 0.6889 | 512 | 0.3205 |

From Table 8, the following properties of chain diagnosability can be observed. First, the values of DC for circuits with EDT (N>1) are higher than the same design without EDT (N=1). This means that chain diagnosability is enhanced after incorporating EDT. Second, the values of DC increase with the increase of compaction ratio N. Third, the increase in the value of DC is almost saturated after 32X compaction. Finally, the values of DC with EDT compaction at 32X are increased about 11 times for Ckt1 and 8 times for Ckt2 compared to the values of DC without EDT compaction.

Diagnostic Accuracy, Resolution and Performance of an Exemplary On-Line Chain-Diagnosis Procedure To investigate the disclosed chain diagnosis methodology and to compare the chain diagnosis accuracy, resolution, and performance with and without EDT, chain failure test cases were created as follows. Because Ckt1 had only 495 scan cells, 495 test cases were made by injecting one permanent stuck-at-1 fault per test case. Each case had a fault at a different scan cell. With Ckt1, 495 test cases were made by injecting one intermittent stuck-at-1 fault per test case. For each injected intermittent fault, the fault triggering probability was set to 50%. 100% fault triggering probability corresponds to a permanent fault, which can be used to model defects such as short to power (permanent stuck-at-1), short to ground (permanent stuck-at-0), or some types of broken chains. A 50% fault triggering probability corresponds to an intermittent fault, which can be used to model bridging faults or other types of defects on scan chains.

Similarly, 100 scan cell locations were randomly selected in Ckt2 to inject one fault per case. 100 permanent stuck-at-1 failure cases were tested (Prob=100) and 100 intermittent stuck-at-1 (Prob=50) failure cases were tested using Ckt2, resulting in 200 test cases for Ckt2. For these 1190 (495*2+ 100*2) chain failure cases, a failure log file per case was obtained by simulating the patterns against the circuit with the injected fault (note that when EDT was used, the failure data was compacted data). Chain diagnosis was then performed on each failure log file using an embodiment of the chain diagnostic technique described above with respect to FIG. 24. In particular, the exemplary technique comprised: modeling a compactor as a function $\Phi$ such that $\Phi(R)=r$, where R is the test response before compaction and r is the test response after compaction; reading the failure log file for chain test and identifying faulty scan chains and fault types; performing fault simulation on a faulty scan chain against the transformed circuit; comparing the simulation results with the compacted failure data collected from the tester; and reporting the best matching scan cell(s) as suspect(s).

EDT was used with 64X compaction for Ckt1 and 32X compaction for Ckt2 in the experiments. All the diagnosis reports included the injected failure scan cell. Therefore, diagnosis accuracy was not a concern. The diagnostic resolution and performance for the experiments are shown in Tables 9A and 9B.

TABLE 9A

Ckt1 - Chain Diagnosis Results

|  |  | No EDT | | EDT 64X | |
|---|---|---|---|---|---|
| # of Patterns | | 5 | 320 | 5 | 320 |
| Avg. # of Failure Cycles | | 473 | 30126 | 6 | 397 |
| Avg. # of Suspects | Prob100 | 10.38 | 3.01 | 2.57 | 1.01 |
|  | Prob50 | 20.98 | 6.11 | 3.03 | 1.62 |
| % \|Susp\| ≦ 2 | Prob100 | 37.7% | 80.7% | 50.2% | 100% |
|  | Prob50 | 13.6% | 44.3% | 38.1% | 57% |
| Avg. Time(s) | Prob100 | 0.54 | 2.32 | 0.15 | 1.21 |
|  | Prob50 | 4.76 | 8.71 | 0.32 | 2.05 |

TABLE 9B

Ckt2 - Chain Diagnosis Results

|  |  | No EDT | | EDT 32X | |
|---|---|---|---|---|---|
| # of Patterns | | 8 | 256 | 8 | 256 |
| Avg. # of Failure Cycles | | 139K | 4535K | 5.5K | 126K |
| Avg. # of Suspects | Prob100 | 19.75 | 4.9 | 16.9 | 1.25 |
|  | Prob50 | 87.44 | 42.2 | 78.8 | 13.9 |
| % \|Susp\| ≦ 2 | Prob100 | 50% | 91% | 50% | 93% |
|  | Prob50 | 9% | 29% | 13% | 35% |
| Avg. Time(s) | Prob100 | 358 | 2468 | 296 | 1621 |
|  | Prob50 | 607 | 3577 | 592 | 2674 |

In Tables 9A and 9B, the second row shows the number of failure patterns used for diagnosis. The third row shows the average number of failure cycles over (495*2) test cases for Ckt1 in Table 9A and (100*2) test cases for Ckt2 in Table 9B. Note that for scan patterns, only failure cycles were counted. For a design with NX EDT compaction, N times the scan patterns applied to the same design without EDT were used and resulted in a similar number of failure cycles being collected from the ATE. For example, in Table 9A, applying 320 patterns to the Ckt1 design with 64X EDT only resulted in 397 failure cycles on average while applying 5 patterns to the Ckt1 design without EDT resulted in 473 failure cycles on average. In Table 9B, applying 256 patterns to the Ckt2 design with 32X EDT resulted in 126K failure cycles on average while applying 8 patterns to the Ckt2 design without EDT resulted in 139K failure cycles on average. This difference is a result of the EDT designs having much shorter faulty scan chains, which create fewer failure cycles, which are then compacted at the channel output. The third and fifth rows of Tables 9A and 9B show the average number of the reported suspects after diagnosis for permanent and intermittent faults. The diagnostic resolution is defined as 1/(# of Average Suspects). When applying the same number of scan patterns for Ckt1 (e.g., comparing the third column with the fifth column, and the fourth column with the sixth column), the diagnostic resolution is improved about 3 to 4 times for permanent faults and 4 to 6 times for intermittent faults by incorporating EDT. For Ckt2, the diagnostic resolution is improved about 1.2 to 4 times for permanent faults and 1.1 to 3 times for intermittent faults by incorporating EDT. Note that when applying the same number of patterns, the number of failure cycles becomes much less if EDT is incorporated. When applying a similar number of failure cycles for Ckt1 (e.g., comparing the third column with the sixth column), the diagnostic resolution is improved about 10 times for permanent faults and 13 times for intermittent faults by incorporating EDT. The diagnostic resolution for Ckt2 is improved about 15.8 times for permanent faults and about 6.3 times for intermittent faults by incorporating EDT. On average, the diagnostic resolution improvement is close to what was predicted using the DC values.

The seventh and eighth rows of Tables 9A and 9B show the percentage of the test cases having only one or two suspects after chain diagnosis. If the number of suspects can be reduced to one or two, failure analysis at the physical level can be performed much more easily. The experimental results indicate that for permanent stuck-at-1 chain faults, there is a 100% chance for Ckt1 and a 93% chances for Ckt2 to get diagnostic results that narrows the suspects to one or two scan cells if EDT is used with a reasonable number of failure cycles.

The last two rows of Tables 9A and 9B show the average diagnosis run time for each set of test cases. The run time of chain diagnosis is generally determined by two factors: (1) the number of simulated scan patterns; and (2) the number of candidates that need simulation. As mentioned earlier, for a similar number of failure cycles, the number of simulated patterns with NX EDT is typically N times the number of patterns used without EDT. Therefore, the diagnosis run time with EDT is usually longer. However, because the scan chains are shortened when EDT is used, the number of candidates to simulate is smaller than the number of candidates without EDT, which helps explain why the run time with EDT is shorter than without EDT for Ckt1 when the fault triggering probability is set to 50%.

Diagnostic Resolution Vs. Number of Simulated Patterns

One of the factors limiting the resolution of the chain diagnostics is the number of failing patterns or cycles that can be logged in a reasonable time. In the experiments described above, the failure log limit for Ckt2 was limited to 150K failure cycles. Without compression hardware, a failure log of such a size would result in only 8 failing patterns given that the average chain length is more than 37K. Collecting this magnitude of data could take hours.

Figure 29:
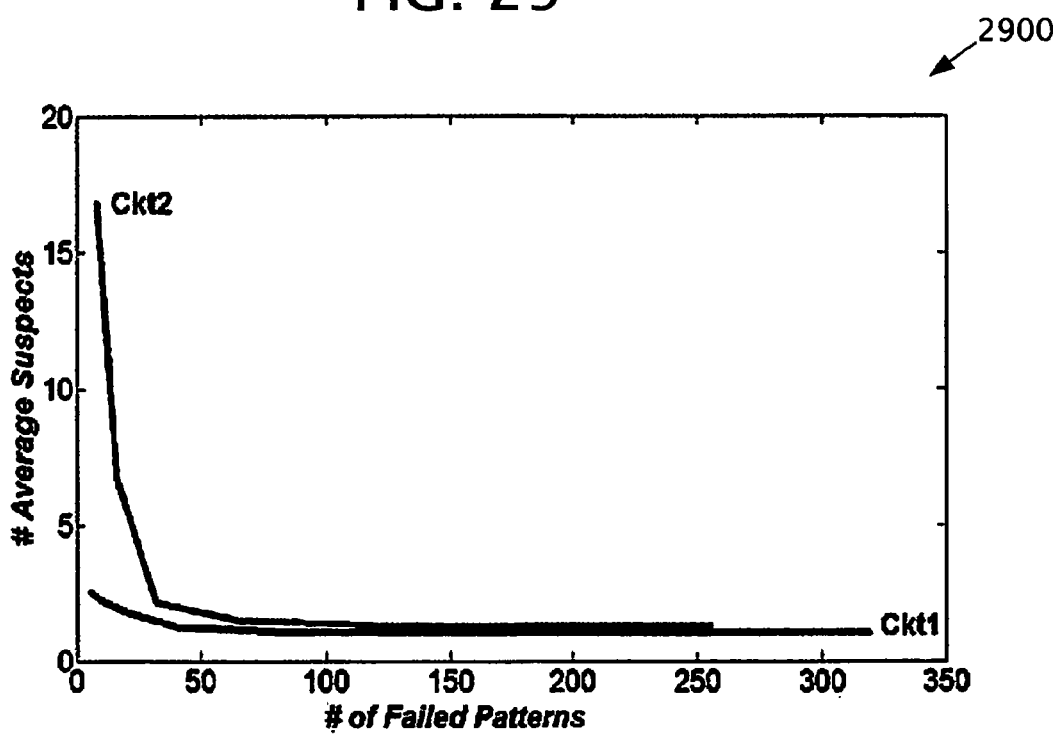
FIG. 29 is a graph comparing the average number of suspect scan cells to the number of failed patterns analyzed for two exemplary test circuits using an embodiment of the disclosed chain diagnosis procedure.

In this subsection, the manner in which the diagnostic resolution varies with the number of collected failure patterns in the context of EDT is examined. The average number of suspects compared to the number of failed patterns is shown in Table 10 and plotted in graph 2900 of FIG. 29 when using Ckt1 with 64X EDT and Ckt2 with 32X EDT. The average number of suspects was calculated using 495 permanent stuck-at-1 test cases for Ckt1 and 100 permanent stuck-at-1 test cases for Ckt2.

TABLE 10

Average # of Suspects vs. # of Patterns

| Ckt1 with 64X EDT | | Ckt2 with 32X EDT | |
|---|---|---|---|
| # Patterns | Avg. # of Suspects | # Patterns | Avg. # of Suspects |
| 5 | 2.57 | 8 | 16.9 |
| 10 | 2.22 | 16 | 6.78 |
| 20 | 1.79 | 32 | 2.16 |
| 40 | 1.25 | 64 | 1.53 |
| 80 | 1.08 | 128 | 1.25 |
| 160 | 1.03 | 256 | 1.25 |
| 320 | 1.01 | — | — |

Table 10 shows that for Ckt1, after applying 80 scan patterns, the diagnostic resolution is almost saturated. Applying 80 scan patterns with 64X EDT for Ckt1 can improve the chain diagnosis resolution about 10 times with only 25% of the number of collected failure cycles compared to applying 5 patterns on Ckt1 without EDT. For Ckt2, after applying 64 scan patterns, the diagnostic resolution is almost saturated. Applying 64 scan patterns with 32X EDT for Ckt2 can improve the chain diagnosis resolution about 13 times with only 25% of the number of collected failure cycles compared to applying 8 patterns on Ckt2 without EDT. The chain diagnosis run times for EDT designs are now close to the ones without EDT.

The experiments shown in Tables 9A, 9B, and 10 used stuck-at-1 fault models as examples. Similar results are expected for other types of faults, such as stuck-at-0 and timing-related scan chain faults. Further, although the experiments used EDT, the disclosed chain diagnosis methodologies can be used with other types of embedded compression techniques. Moreover, it can be seen from the above results that chain diagnosis with EDT can achieve better diagnostic resolution than testing without EDT. The improved diagnostic resolution is due to the fact that, with embedded compression hardware such as EDT, the internal scan chains become much shorter. A defect on a shorter chain will have a smaller impact on the patterns applied, making chain diagnosis easier. Further, the compacted test responses from compactor channel outputs contain information from more patterns without increasing the collected failure cycles.

Multiple Faulty Scan Chain Diagnosis

In the previous sections, it was assumed that there existed only a single faulty scan chain on the circuit-under-test having embedded compression hardware. In situations where multiple chains contain faults, two scenarios can be distinguished. The first scenario is that there is only one faulty scan chain per channel output. In this case, the faulty responses from multiple faulty scan chains are not compacted into one compactor channel. Thus, diagnosis can be performed one faulty scan chain at a time using the above-described techniques. For example, in certain embodiments, the direct diagnostic procedure described above can be applied to conventional multiple faulty scan chain diagnosis techniques, such as the techniques described in Guo R., et al., "A Technique for Fault Diagnosis of Defects in Scan Chains," *Proc. ITC* 2001, pp. 268-77 (2001), and Huang Y., et al., "Statistical Diagnosis for Intermittent Scan Chain Hold-Time Fault," *Proc. ITC* 2003, pp. 319-328 (2003). The second scenario is when there exist multiple faulty scan chains per channel output. In this case, the method acts of reading the failure log file for the chain test and identifying faulty scan chains and fault types in the disclosed methodology described above with respect to FIG. 24 can be modified. In particular, masking patterns can be used in the chain pattern set such that each internal chain is observed uniquely from one channel output with one masking chain test pattern. As illustrated with the EDT example described above, when masking chain patterns are used, faulty scan chains can be easily identified regardless of whether there exists a single faulty scan chain or multiple faulty scan chains. After the faulty scan chains and fault type for each faulty scan chain are identified, fault simulation can be performed in which multiple faulty scan chains are considered. The simulation and suspect searching procedure is generally the same as for diagnosing a single chain except that the search space is expanded from one dimension for a single chain to M dimensions, where M is the number of faulty scan chains per channel. In this case, masking scan patterns can be applied in order to reduce the diagnosis run time.

Exemplary Computer Networks

Figure 21:
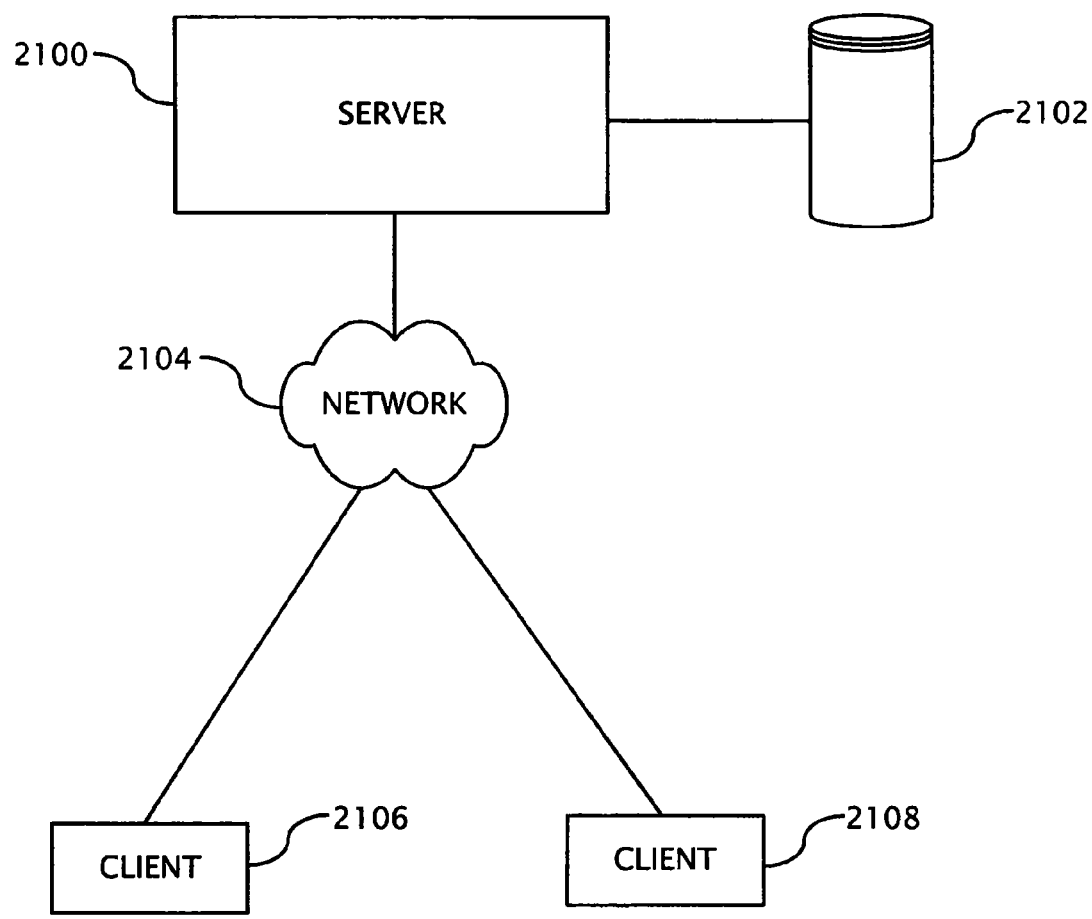
FIG. 21 is a schematic block diagram showing an exemplary distributed computing environment as might be used to implement the disclosed technology.

Any of the aspects of the technology described above can be performed using a distributed computer network. FIG. 21 shows one such exemplary network. A server computer 2100 can have an associated storage device 2102 (internal or external to the server computer). For example, the server computer 2100 can be configured to perform a chain diagnosis technique according to any of the disclosed embodiments (e.g., as part of an EDA software tool, such as an embedded deterministic testing ("EDT") or ATPG tool). The server computer 2100 may be coupled to a network, shown generally at 2104, which can comprise, for example, a wide-area network, a local-area network, a client-server network, the Internet, or other such network. One or more client computers, such as those shown at 2106, 2108, may be coupled to the network 2104 using a network protocol.

Figure 22:
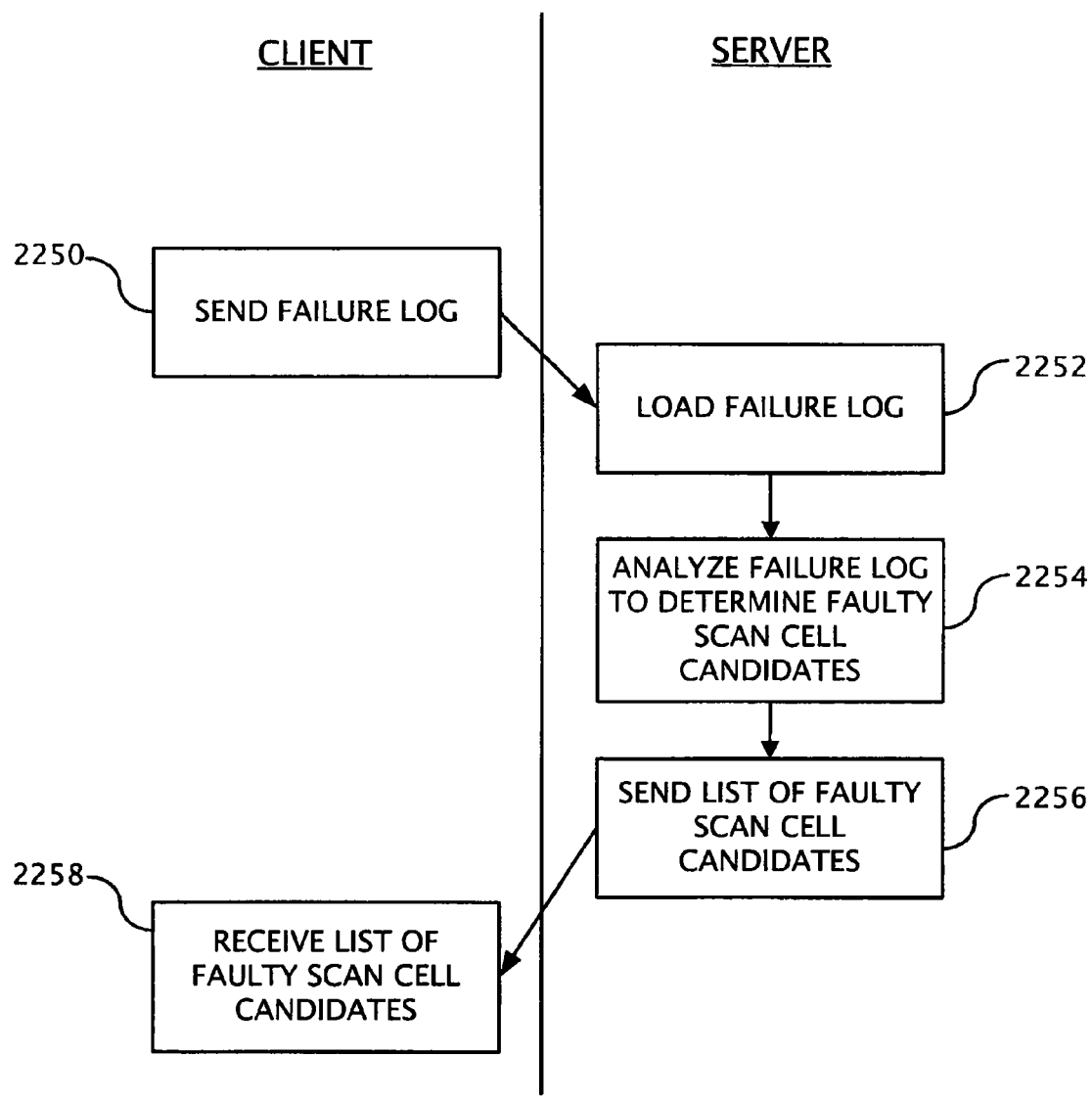
FIG. 22 is a block diagram showing an exemplary manner in which fault diagnosis can be performed in the distributed computing environment illustrated in FIG. 21.

FIG. 22 shows one exemplary manner in which the distributed network shown in FIG. 21 may operate to diagnose chain faults stored in a failure log. In particular, a failure log containing information concerning observed faults from a chain test and a scan test from a circuit-under-test may be analyzed according to any of the embodiments disclosed herein using a remote server computer, such as the server computer 2100 shown in FIG. 21. In process block 2250, for example, the client computer sends a failure log (from ATE on a production floor, for example) comprising a list of observed faults from a circuit test that included chain patterns and scan patterns. In process block 2252, the failure log is received and loaded by the server computer. In process block 2254, the failure log is analyzed using a diagnostic procedure according to any of the disclosed embodiments. A list of faulty scan cell suspects identified by the diagnostic procedure can be created. The list of faulty scan cell suspects can be stored as one or more separate files or data structures. In process block 2256, the server computer sends the list of faulty scan cell suspects to the client computer, which receives the diagnostic results in process block 2258. Note that this procedure can occur as the failure log is being created or very shortly after the failure log is created (while the circuit-under-test is still coupled to the tester, for example). Thus, the diagnostic procedure can be performed on-line.

It should be apparent to those skilled in the art that the example shown in FIG. 22 is not the only way to perform diagnostics according to the disclosed technology. For instance, the failure log to be analyzed may be stored on a computer-readable medium that is not on a network and that is sent separately to the server (e.g., on a CD-ROM or other computer-readable medium). Moreover, the server computer may perform only a portion of the diagnostic procedure.

Having illustrated and described the principles of the illustrated embodiments, it will be apparent to those skilled in the art that the embodiments can be modified in arrangement and detail without departing from such principles. For example, any of the embodiments described herein can be performed by the tester itself and need not be performed over a distributed computer network. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. One or more computer-readable memory or storage devices storing computer-executable instructions for causing a computer system to perform a method, the method comprising diagnosing one or more faulty scan cells in one or more scan chains of an at least partially scan-based circuit-under-test using compressed test responses to chain patterns and compressed responses to scan patterns.

2. The one or more computer-readable memory or storage devices of claim 1, the diagnosing the one or more faulty scan cells comprising:
receiving information indicative of at least the compressed test responses to the chain patterns and information indicative of the compressed test responses to the scan patterns, the compressed test responses to the chain patterns and the compressed test responses to the scan patterns having been output from a compactor coupled to the circuit-under-test;
identifying a faulty scan chain of the one or more scan chains in the circuit-under-test based at least in part on the information indicative of the compressed test responses to the chain patterns;
identifying one or more faulty scan cell candidates in the faulty scan chain based at least in part on the information indicative of the compressed test responses to the scan patterns; and
reporting the one or more faulty scan cell candidates identified.

3. The one or more computer-readable memory or storage devices of claim 2, wherein the act of identifying the one or more faulty scan cell candidates comprises:
simulating failures in possible faulty scan cell candidates using a simulation, the simulation incorporating a transformation function performed by the compactor; and
comparing simulation results to the compressed test responses to scan patterns.

4. The one or more computer-readable memory or storage devices of claim 3, wherein the simulation simulates failing scan patterns and passing scan patterns, and wherein the information received includes information indicative of corresponding failing compressed test responses and passing compressed test responses.

5. The one or more computer-readable memory or storage devices of claim 3, wherein the simulation incorporates the transformation function by representing the compactor as a mathematical function and applying the mathematical function to simulated uncompressed test responses.

6. The one or more computer-readable memory or storage devices of claim 3, wherein the simulation incorporates the transformation function by simulating the failures in a circuit representation of the circuit-under-test that has been modified to embed the transformation function.

7. The one or more computer-readable memory or storage devices of claim 2, wherein the act of identifying the faulty scan chain comprises applying a mathematical function representative of the compactor to one or more of the compressed test responses to chain patterns.

8. The one or more computer-readable memory or storage devices of claim 2, wherein the act of identifying the faulty scan chain comprises comparing one or more of the compressed test responses to chain patterns to entries in a fault dictionary.

9. The one or more computer-readable memory or storage devices of claim 2, the method further comprising:
receiving information indicative of test responses to masking chain patterns; and
determining whether the source of a fault is a scan chain defect or a compression hardware defect based at least in part on the information indicative of the test responses to the masking chain patterns.

10. One or more computer-readable memory or storage devices storing computer-executable instructions for causing a computer system to perform a method of testing an integrated circuit, the method comprising:
receiving test responses from testing scan chains of a circuit-under-test using multiple chain patterns, wherein the testing comprises,
applying at least one of the chain patterns to the scan chains through a decompressor and a compactor coupled to the scan chains, and
applying at least one of the chain patterns to the scan chains while bypassing the decompressor and the compactor; and
determining whether a fault exists in the scan chains of the circuit-under-test or in the decompressor or the compactor based at least in part on test responses to the chain patterns applied during the testing.

11. The one or more computer-readable memory or storage devices of claim 10, wherein a fault is determined to exist in the scan chains of the circuit-under-test if a respective chain pattern applied through the decompressor and the compactor and a respective chain pattern bypassing the decompressor and the compactor both produce faulty test responses.

12. The one or more computer-readable memory or storage devices of claim 10, wherein a fault is determined to exist in the decompressor or the compactor if a respective chain pattern applied through the decompressor and the compactor produces a faulty test response but a respective chain pattern bypassing the decompressor and the compactor does not produce a faulty test response.

13. The one or more computer-readable memory or storage devices of claim 10, the method further comprising, if the fault is determined to exist in the scan chains of the circuit-under-test, identifying a faulty scan chain in the circuit-under-test and a fault type based at least in part on the test responses to the chain patterns.

14. One or more computer-readable memory or storage devices comprising computer-executable instructions for causing a computer system to perform a method of testing an integrated circuit, the method comprising:
simulating one or more test patterns being applied to an integrated circuit design having scan chains and a compactor and thereby generating one or more expected compressed test responses, the act of simulating comprising modifying test values of the test patterns so that scan cells of a selected scan chain are loaded with either unknown values or a fixed value, the act of simulating further comprising using a transformation function representative of the compactor to generate the expected compressed test responses;
comparing the expected compressed test responses to observed compressed test responses obtained from testing a physical embodiment of the integrated circuit design with the one or more test patterns; and
determining a range of suspect scan cells in the selected scan chain based at least in part on the comparison.

15. The one or more computer-readable memory or storage devices of claim 14, wherein the test values are modified so that all scan cells of the selected scan chain are loaded with either the unknown values or the fixed value.

16. The one or more computer-readable memory or storage devices of claim 14, wherein the one or more test patterns comprise a first set of test patterns and wherein the one or more expected compressed test responses comprise a first set of expected compressed test responses, the method further comprising:
simulating a second set of one or more test patterns being applied to the integrated circuit design and thereby generating a second set of expected compressed test responses, the act of simulating the second set comprising,
modifying test values of the second set of test patterns so that at least some of the scan cells of the selected scan chain located before the last scan cell in the range are loaded with either unknown values or the fixed value, and so that at least some of the scan cells of the selected scan chain located after the last scan cell in the range are loaded with regular unmodified test values.

17. The one or more computer-readable memory or storage devices of claim 16, wherein the range of suspect scan cells is a first range of suspect scan cells, the method further comprising:
   comparing the second set of expected compressed test responses to the observed compressed test responses; and
   determining a second range of suspect scan cells in the selected scan chain based at least in part on the comparison, the second range having fewer suspect scan cells than the first range.

18. The one or more computer-readable memory or storage devices of claim 14, the method further comprising reporting the range of suspect scan cells if the number of scan cells in the range is less than a predetermined number.

19. One or more computer-readable memory or storage devices storing computer-executable instructions for causing a computer system to perform a method, the method comprising:
   receiving a circuit description of an at least partially scan-based circuit-under-test and a compactor for compacting test responses captured in the circuit-under-test;
   determining a transformation function performed by the compactor to the test responses captured in the circuit-under-test; and
   diagnosing scan chain faults in one or more scan chains of the circuit-under-test using a diagnostic procedure that incorporates the transformation function.

20. The one or more computer-readable memory or storage devices of claim 19, wherein the diagnostic procedure comprises:
   simulating one or more possible scan chain faults in the circuit-under-test to produce uncompressed faulty test responses; and
   applying the transformation function to the uncompressed faulty test responses to determine compressed faulty test responses.

* * * * *